(12) United States Patent
Laslandes et al.

(10) Patent No.: US 9,964,755 B2
(45) Date of Patent: May 8, 2018

(54) OPTIMIZED ACTUATORS FOR ULTRA-THIN MIRRORS

(71) Applicant: CALIFORNIA INSTITUTE OF TECHNOLOGY, Pasadena, CA (US)

(72) Inventors: Marie Laslandes, Pasadena, CA (US); Keith D. Patterson, Pasadena, CA (US); Sergio Pellegrino, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 142 days.

(21) Appl. No.: 14/702,567

(22) Filed: May 1, 2015

(65) Prior Publication Data

US 2015/0316763 A1    Nov. 5, 2015

Related U.S. Application Data

(60) Provisional application No. 61/990,267, filed on May 8, 2014, provisional application No. 61/987,307, filed on May 1, 2014.

(51) Int. Cl.
   *G02B 26/08* (2006.01)
   *H01L 41/047* (2006.01)
   *H01L 41/09* (2006.01)

(52) U.S. Cl.
   CPC ..... *G02B 26/0825* (2013.01); *G02B 26/0858* (2013.01); *H01L 41/047* (2013.01); *H01L 41/0926* (2013.01)

(58) Field of Classification Search
   None
   See application file for complete search history.

(56) References Cited

U.S. PATENT DOCUMENTS

| 3,904,274 A | * | 9/1975 | Feinleib | G02B 26/06 310/328 |
| 6,278,764 B1 | | 8/2001 | Barbee et al. | |
| 6,297,579 B1 | * | 10/2001 | Martin | H01L 41/0926 310/330 |

(Continued)

OTHER PUBLICATIONS

Hickey, G., et al., "Actuated hybrid mirrors for space telescopes," Proc. SPIE 7731, (2010).

(Continued)

*Primary Examiner* — Derek S Chapel
(74) *Attorney, Agent, or Firm* — Gates & Cooper LLP

(57) ABSTRACT

A method and apparatus for correcting error modes of a deformable mirror, including selecting or targeting one or more target error modes of a deformable mirror; and designing a pattern and/or shape of one or more electrodes, wherein the pattern and/or shape of the electrodes are designed to optimally correct the target error modes when the electrodes are disposed on the deformable mirror via an active material. Also disclosed is a deformable structure, including a composite shell including a plurality of plies each including carbon fibers embedded in a resin; a nanolaminate comprising individual nanolayers attached to a first side of the composite shell; an actuation structure attached to a second side of the composite shell; and a flexible electrode routing layer attached to the actuation structure.

14 Claims, 41 Drawing Sheets

(56) References Cited

U.S. PATENT DOCUMENTS 6,874,897 B2 * 4/2005 Graves ............... G02B 26/0825
359/295

OTHER PUBLICATIONS

Patterson, K., et al., "Ultralightweight deformable mirrors," Appl. Opt. 52, 5327, 883-5341 (2013).
http://www.thinplytechnology.com/spread.php.
Powerpoint slides by John Steeves, Marie Laslandes, Sergio Pellegrino, David Redding, S. Bradford, J. Wallace, and Troy Barbee, entitled "Design, Fabrication and Testing of Active Carbon Shell Mirrors (CSMs) for Space Telescope Applications," SPIE Astronomical Telescopes and Instrumentation Jun. 23, 2014.
Laslandes, M., et al., "Optimized actuators for ultrathin deformable primary mirrors", Applied Optics, vol. 54, No. 20 Applied Optics Research Article (2015).
Steeves, J., et al., "Design, fabrication and testing of active carbon shell mirrors for space telescope applications," Proc. SPIE 9151, 915105 (2014). 901, 2014.
Grosset-Grange, C., et al., "Design principle and first results obtained on the LMJ deformable mirror prototype", Proc. SPIE, 2007, pp. 658403-1-658403-14, vol. 6584.
Debarre, D., et al., "Image-based adaptive optics for two-photon microscopy", Optics Letters, Aug. 15, 2009, pp. 2495-2497, vol. 34, No. 16.
Zawadzki, R.J., et al., "Retinal Imaging with a Combined Adaptive Optics—Optical Coherence Tomography and Adaptive Optics—Scanning Laser Ophthalmoscopy System", Proc. of SPIE, 2010, pp. 7500Z-1-7500Z-6, vol. 7550.
Freeman, R.H., et al., "Deformable mirrors for all seasons and reasons", Applied Optics, Feb. 15, 1982, pp. 580-588, vol. 21, No. 4.
Madec, P-Y., "Overview of Deformable Mirror Technologies for Adaptive Optics and Astronomy", Proc. of SPIE, 2012, 8447.
Ealey, M.A., et al., "Continuous facesheet low voltage deformable mirrors", Optical Engineering, Oct. 1990, pp. 1191-1198, vol. 29, No. 10.
Rodrigues, G., et al., "Modular bimorph mirrors for adaptive optics", Optical Engineering, Mar. 2009, pp. 034001-1-034001-7, vol. 48, No. 3.
Patterson, K., et al., "Shape Correction of Thin Mirrors", American Institute of Aeronautics and Astronautics, Structures, Structural Dynamics and Materials Conference, 2011, pp. 1-16.
Patterson, K., et al., "Thin Deformable Mirrors for a Reconfigurable Space Aperture", American Institute of Aeronautics and Astronautics, Structures, Structural Dynamics and Materials Conference, 2012, pp. 1-12.
Laslandes, M., et al., "Mirror actively deformed and regulated for applications in space: design and performance", Optical Engineering, Sep. 2013, pp. 091803-1-091803-12, vol. 52, No. 9.
Wilson, R.N., et al., "Active optics. I. A system for optimizing the optical quality and reducing the costs of large telescopes", Journal of Modern Optics, 1987, pp. 485-509, vol. 34, No. 4.
Postman, M., et al., "Advanced Technology Large-Aperture Space Telescope: science drivers and technology developements", Optical Engineering, Jan. 2012, pp. 011007-1-011007-11, vol. 51, No. 1.
Sinquin, J-C., et al., "Deformable mirror technologies for astronomy at CILAS", Proc. of SPIE, 2008, pp. 70150O-1-70150O-12, 7015.
Cohan, L., et al., "Integrated modeling for design of lightweight, active mirrors", Optical Engineering, Jun. 2011, pp. 063003-1-063003-13, vol. 50, No. 6.
Feng, X., et al., "The Effect of Thin Film/Substrate Radii on the Stoney Formula for Thin Film/Substrate Subjected to Nonuniform Axisymmetric Misfit Strain and Temperature", Journal of Mechanics of Material and Structures, 2006, pp. 1041-1053, vol. 1, No. 6.
Hansen, N., "The CMA Evolution Strategy: A Comparing Review", in Towards a New Evolutionary Computation, Advances on Estimation of Distribution Algorithms, Springer 2006, pp. 75-102, vol. 192.
Noll, R.J., "Zernike polynomials and atmospheric turbulence", J. Opt. Soc. Am., Mar. 1976, pp. 207-211, vol. 66, No. 3.
Redding, D., et al., "Wavefront Sensing and Control for a Next Generation Space Telescope", Proc. SPIE, Mar. 1998, pp. 758-772, vol. 3356.
Coleman, T.F., et al., "A Reflective Newton Method for Minimizing a Quadratic Function Subject to Bounds on Some of the Variables", SIAM J. Optimization, Nov. 1996, pp. 1040-1058, vol. 6, No. 4.
Stahl, H.P., "Design study of 8 meter monolithic mirror UV/optical space telescope", Society of Photo-Optical Instrumentation Engineers (SPIE) Conference Series 7010 (2008).
Gardner, J.P., et al., "The James Webb Space Telescope", Space Science Reviews, 2006, pp. 485-606, vol. 123.
Chen, P.C., et al., "Advances in very lightweight composite mirror technology", Optical Engineering, Sep. 2000, pp. 2320-2329, vol. 39, No. 9.
Northrup Grumman, AOAXinetics.http://www.northropgrumman.com/BusinessVentures/AOAXinetics (2014), downloaded Oct. 1, 2015.
Patterson, K., et al., "Shape correction of thin mirrors in a reconfigurable modular space telescope", Proc. of SPIE, 2010, pp. 773121-1-773121-12, vol. 7731.
Underwood, C., et al., "Autonomous Assembly of a Reconfigurable Space Telescope (AAReST) for Astronomy and Earth Observation", 8th IAA Symposium on Small Satellites for Earth Observation, Apr. 4-8, 2011, pp. 1-7.
Keck Institute for Space Studies—Large Space Structures. http://kiss.caltech.edu/study/largestructure/technology.html (2011), downloaded Oct. 1, 2015.
Planet Labs Inc. http://www.planet.com/ (2014), downloaded Oct. 1, 2015.
Skybox Imaging Inc. http://www.skyboximaging.com/ (2014), downloaded Oct. 1, 2015.
Laslandes, M., et al., "Optimization of Electrode Configuration in Surface-Parallel Actuated Deformable Mirrors", Society of Photo-Optical Instrumentation Engineers (SPIE) Conference Series, 9148-151, 2014, pp. 1-17.
Piezo Systems Inc. http://piezo.com/ (2014), downloaded Oct. 1, 2015.
Steeves, J., et al., "Ultra-Thin Highly Deformable Composite Mirrors", Structures, Structural Dynamics, and Materials and Co-located Conferences, 54th AIAA/ASME/ASCE/AHS/ASC Structures, Structural Dynamics and Materials Conference 1523, Apr. 8-11, 2013, pp. 1-14.
Mendes Da Costa Rodrigues, G., "Adaptive optics with segmented deformable bimorph mirrors," Ph.D. thesis Universite Libre de Bruxelles, 2010.
Simulia. Abaqus Standard/CAE Version 6.12. 2012.
Hochhalter, J. D. "Replicated Mirrors Using Carbon Fiber Reinforced Polymers", Master's Thesis, Univ. of New Mexico (2005).
Barbee, T.W., et al., "Nano-structure Multilayer Technology Fabrication of High Energy Density Capacitors for the Power Electronic Building Block", UCRL-JC-128759, Oct. 1997.
http://www.fujifilmusa.com/products/industrial_inkjet_printheads/deposition-products/dmp-2800/, as downloaded on May 25, 2016.

* cited by examiner

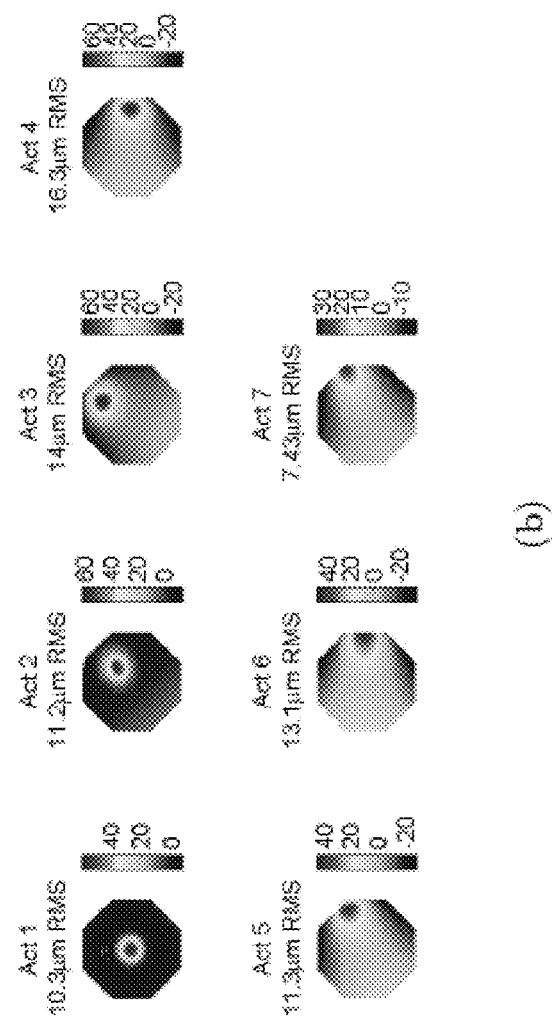
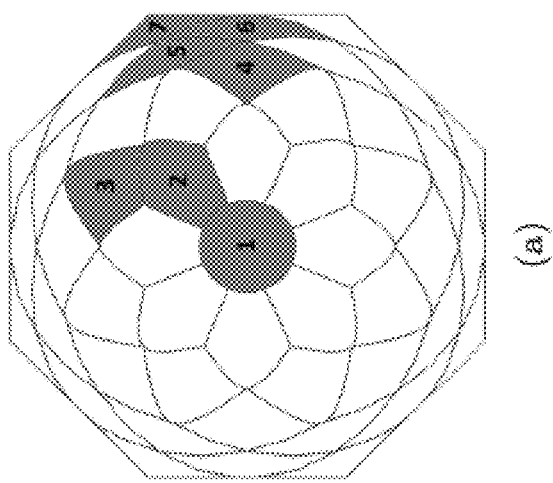
Fig. 26

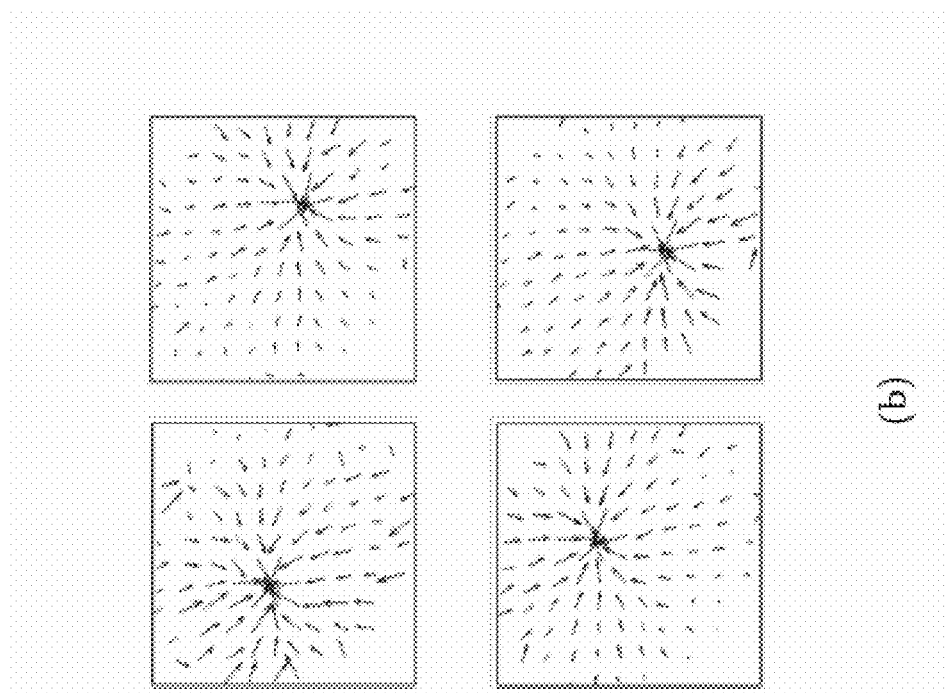
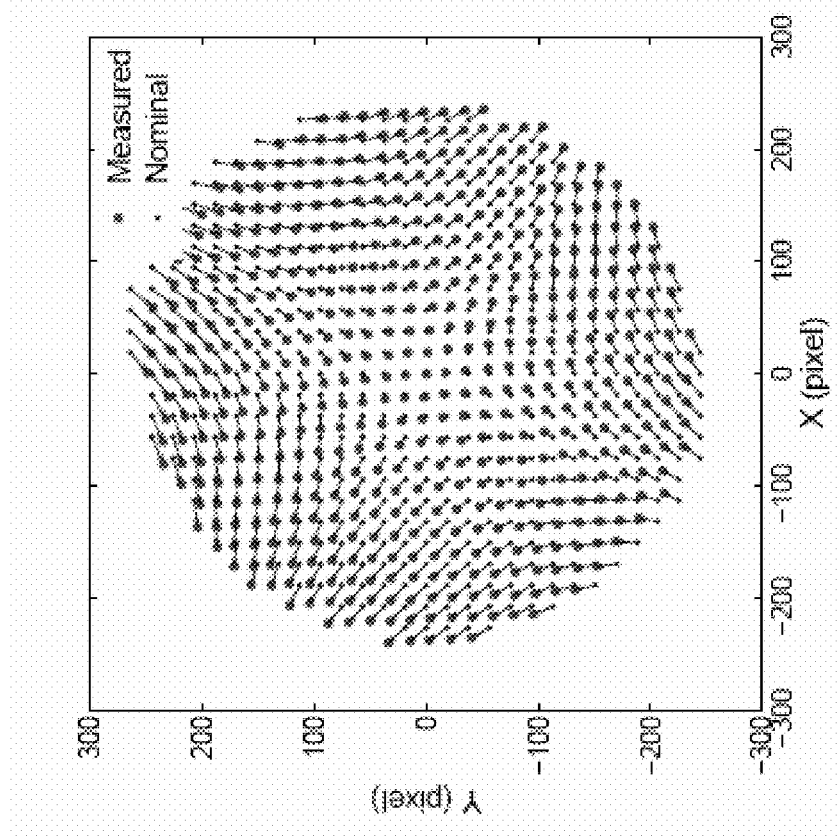
*Fig. 32*

OPTIMIZED ACTUATORS FOR ULTRA-THIN MIRRORS

CROSS REFERENCE TO RELATED APPLICATIONS

This application claims the benefit under 35 U.S.C. Section 119(e) of the following commonly-assigned U.S. Provisional Patent Applications:

U.S. Provisional Patent Application Ser. No. 61/990,267, filed on May 8, 2014, by David C. Redding, Mitchell Troy, Scott A. Basinger, and Sergio Pellegrino, entitled "CARBON SHELL MIRRORS FOR SPACE TELESCOPES"; and U.S. Provisional Patent Application Ser. No. 61/987,307, filed on May 1, 2014, by Marie Laslandes, Keith D. Patterson, and Sergio Pellegrino, entitled "OPTIMIZED ACTUATORS FOR ULTRA-THIN MIRRORS";

all of which applications are incorporated by reference herein.

This application is related to the following co-pending and commonly-assigned applications:

U.S. Utility patent application Ser. No. 13/865,179, filed Apr. 17, 2013, by Sergio Pellegrino, Keith D. Patterson, Chiara DARAIO, Eleftherios Gdoutos, Namiko Yamamoto, Risaku Toda, Victor E. White, Harish Manohara, John B. Steeves, entitled "DEFORMABLE MIRRORS AND METHODS OF MAKING THE SAME," which application claims the benefit under 35 U.S.C. section 119(e) of U.S. Provisional Patent Application Ser. No. 61/625,542, filed Apr. 17, 2012;

U.S. Utility patent application Ser. No. 13/865,170, filed Apr. 17, 2013, by Sergio Pellegrino, Keith D. Patterson, Chiara DARAIO, Eleftherios Gdoutos, Namiko Yamamoto, Risaku Toda, Victor E. White, Harish Manohara, John B. Steeves, entitled "THIN FILM BI-MATERIAL LATTICE STRUCTURES AND METHODS OF MAKING THE SAME," which application claims the benefit under 35 U.S.C. section 119(e) of U.S. Provisional Patent Application Ser. No. 61/625,542, filed Apr. 17, 2012;

all of which applications are incorporated by reference herein.

STATEMENT REGARDING FEDERALLY SPONSORED RESEARCH AND DEVELOPMENT

The invention described herein was made in the performance of work under a NASA contract, and is subject to the provisions of Public Law 96-517 (35 USC 202) in which the Contractor has elected to retain title."

BACKGROUND OF THE INVENTION

1. Field of the Invention

This invention relates to a deformable mirrors and a method for fabricating deformable mirrors.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Deformable mirrors are able to correct the wavefront shape in optical instruments for a variety of applications, including astronomy [1], high-energy lasers [2], microscopy [3], and ophthalmology [4]. Each application has different requirements, in terms of precision of correction and the amplitude, spatial frequency and temporal frequency of the wavefront error to be corrected [5]. There are three basic technologies for deformable mirrors [6]: surface-normal actuation, surface-parallel actuation, and boundary actuation. Surface-normal actuators apply forces perpendicular to the optical surface; an array of push/pull actuators produces local displacements and slopes [7] by reacting against a backing structure. It is an efficient solution to compensate for relatively high spatial frequencies and low amplitude errors. Surface-parallel actuated systems consist of an active material laminated to a mirror face-sheet; the in-plane stretching or contraction of the active material causes the mirror to bend [8-11]. This solution does not require any backing structure and hence is suited to lighter mirrors and to the correction of larger amplitude errors. Alternative implementations have adopted discrete actuators embedded in a lightweighted structure [12]. Systems with boundary actuators use forces and moments along the edge of the mirror to bend the optical surface [13]. This approach minimizes the actuator print-through and is ideal to compensate for low spatial frequency errors with a relatively small number of actuators.

Active primary mirrors in earth-based telescopes have already enabled the emergence of very large apertures [14] and the future development of larger space-based observatories will require novel active primary mirror technologies [15]. Earlier studies [9] have shown that 1 m diameter spherical segments forming a 10 m diameter segmented aperture with a focal length of 10 m would require a correction bandwidth of the order of 250 µm to achieve the required shape in all segments.

Moreover, optical-quality mirrors are heavy, expensive and difficult to manufacture. Traditional mirrors, such as that for the Hubble Space Telescope are made by grinding and polishing a thick slab of near-zero coefficient of thermal expansion (CTE) glass down to nanometer-level precision. Not only is this method difficult and expensive to implement but the areal density of such mirrors is extremely high [31]. Advancements in lightweight mirrors such as those for the James Webb Space Telescope (JWST) have reduced this number greatly [32]. However, as these mirrors must still be polished down to optical-quality tolerances, the associated cost and manufacturing complexity is still too great. Simpler shell-type mirrors constructed using replication techniques are also under development [33-34] however they often suffer from a lack of figure accuracy and surface quality.

Several efforts have also been made to incorporate some level of actuation into the mirror structure. This allows the mirror to 1) correct for any manufacturing figure errors, 2) correct for any errors introduced during operation (i.e. due to thermal variations) and 3) modify its figure in order to accommodate different optical prescriptions. Concepts incorporating a variety of materials and actuation schemes for both thick and shell-type mirrors have been proposed. The most advanced of these is the Actuated Hybrid Mirror (AHM) from AOA Xinetics [35-36]. These structures are made from light-weighted silicon carbide with embedded piezoelectric stack actuators. Mirrors of this design have been demonstrated on large scales (>1 m) and down to optical-quality tolerances (<10 nm RMS). However, they are expensive to produce and their full-scale actuation range is limited as they are still relatively stiff structures. Highly-deformable shell mirrors are also under development [37-38] however they are limited in aperture size and shape accuracy.

SUMMARY OF THE INVENTION

One or more embodiments of the invention disclose a method of correcting error modes of a deformable mirror, comprising selecting or targeting one or more target error modes of a deformable mirror; and designing a pattern and/or shape of one or more electrodes, wherein the pattern and/or shape of the electrodes are designed to optimally correct the target error modes when the electrodes are disposed on the deformable mirror via an active material, and the active material deforms the deformable mirror in response to one or more biases applied to the electrodes.

The target error modes can be expressed as a sum of Zernike modes each having an amplitude, and the target error modes can be selected based on the amplitude of the Zernike mode and/or by selecting the more dominant error modes.

The pattern and shape of the electrodes can be designed by simulating the effect of varying the shape and pattern on correcting the target error modes and selecting the best shape and best pattern to correct the one or more target error modes. The simulating can include parameterizing the shape of the electrodes.

The method can comprise selecting a desired correctability and/or desired stroke for the deformable mirror, and designing the pattern and shape and that achieves the desired correctability and/or desired stroke, wherein the correctability and/or stroke are calculated by expressing the target error modes with Zernike polynomials.

The pattern of electrodes can comprise one or more pairs of intersecting electrodes that can be nested across the surface of the deformable mirror.

One or more embodiments of the invention further disclose a deformable mirror, comprising one or more electrodes disposed on the deformable mirror via an active material, wherein a pattern and/or shape of the electrodes are designed to optimally correct target error modes when the active material deforms the deformable mirror in response to one or more biases applied to the electrodes.

One or more embodiments of the invention further disclose a deformable mirror structure, comprising an actuation structure attached to a reflective layer, the actuation structure including a common electrode; one or more electrodes arranged across a surface of the reflective layer to increase correctability and/or stroke of the reflective layer, for a chosen number of the patterned electrodes and for a specific wavefront error of the reflective layer; and the active material comprising one or more active layers between the common electrode and the patterned electrodes, the active layers changing shape in response to one or more electric fields applied between the patterned electrodes and the common electrode, thereby changing a shape of the reflective layer to increase the correctability and/or the stroke. The correctability can be defined as a ratio between a root mean square amplitude of the wavefront error before and after correction by the actuation structure, and the stroke can be defined as the maximum amplitude of the wavefront error that can be corrected without saturating the actuation structure.

The electrodes can comprise one or more pairs of intersecting electrodes rotated with respect to one another.

One or more embodiments of the invention further disclose a deformable structure, comprising a composite shell including a plurality of plies each including carbon fibers embedded in a resin; a nanolaminate comprising individual nanolayers attached to a first side of the composite shell, wherein the nanolaminate reduces print-through of the carbon fibers from the composite shell; an actuation structure attached to a second side of the composite shell, the actuation structure including a common electrode; patterned electrodes; a material between the common electrode and the patterned electrodes, the material changing shape in response to one or more electric fields applied between the patterned electrodes and the common electrode, thereby changing a shape of the composite shell and a shape of the nanolaminate; and a flexible electrode routing layer attached to the actuation structure and electrically connected to the patterned electrodes. The flexible electrode routing layer can include conductive electrode traces electrically connected to the patterned electrodes through vias in the electrode routing layer, the conductive electrode traces extending away from an active surface area of the structure for connection to a source of electrical biasing, and the conductive electrode layer can deform with the composite shell when the electric fields, generated by the source, are applied.

The structure can be a mirror structure or an antenna. The active surface area can be a surface of the nanolaminate and a mirror.

The surface of the nanolaminate can have a surface microroughness of 10 nanometers or less.

A number and thicknesses of the nanolayers can be such that the nanolaminate has 20 MegaPascals or less of internal stress.

The structure can further comprise an adhesive layer attaching a surface of composite shell to the nanolaminate, the adhesive having a thickness that fills irregularities in the surface of the composite shell, wherein the thickness and an internal stress of the nanolaminate are such that the nanolaminate reflecting optical surface has a surface microroughness of 3 nm or less.

The actuation structure and the electrode routing layer can comprise one or more materials and a distribution of electrodes such that the actuation structure can correct shape errors of the deformable structure.

After the structure is bent for packing in a smaller volume, for example, the structure can spring back into shape for deployment, using the actuation structure to correct for errors in the shape caused by the bending.

One or more embodiments further disclose a method for fabricating a deformable structure, comprising obtaining a first mandrel, wherein the first mandrel has a first surface that is designed to shape the deformable structure according to a design; placing a composite shell on the first surface of a first mandrel, the composite shell including a plurality of plies each including carbon fibers embedded in a resin, and conforming to the first surface of the first mandrel; curing the resin; bonding an actuator structure to a first surface of the composite shell with a resin to form an assembly; curing the resin bonding the actuator structure to the composite shell; removing the assembly from the first mandrel; bonding a second surface of the composite shell, with a resin, to a nanolaminate, wherein the nanolaminate is formed on second surface of a second mandrel such that a surface of the nanolaminate bonded to the second surface of the composite shell matches the second surface of the composite shell; curing the resin bonding the composite shell to the nanolaminate; depositing an electrode routing layer to the actuator structure with a resin; curing the resin bonding the electrode routing layer to the actuator structure; and removing the second mandrel. The actuator structure can correct deformities in the nanolaminate and the composite shell caused by the removing of the composite shell and the nanolaminate from their respective mandrels. The deformable structure so fabricated can comprise the composite shell, the nanolaminate, the actuator structure, and the electrode routing layer shaped according to the design.

The design can include a deposition surface of the nanolaminate having a surface microroughness of 15 nanometers or less.

A deformity in the composite shell caused by curing and removing of the composite shell from the first mandrel can be corrected using an actuator structure attached to the composite shell.

One or more embodiments of the invention further disclose a composite shell forming mandrel for shaping a deformable structure, the mandrel comprising a surface, wherein a composite shell placed and cured on the surface of the mandrel conforms to a shape of the surface, the composite shell includes a plurality of plies each including carbon fibers embedded in a resin, and a deformity in the composite shell caused by curing and removing of the composite shell from the mandrel can be corrected using an actuator structure attached to the composite shell. The mandrel can be a deformable mandrel and the surface of the mandrel can be deformed to refine a shape of the surface prior to placing the composite shell on the surface correcting for effects of curing processes in the composite shell. The deformation of the surface of the mandrel can correct the deformity in the composite shell caused by the curing and removing of the composite shell from the mandrel, such that the final composite shell upon removal from its mandrel is within tolerances required for actuation correctability.

One or more embodiments of the invention promises to drastically reduce the mass, density, and cost of future telescopes. Mirrors based on one or more embodiments are lightweight, relatively in-expensive, and provide a sufficiently large shape correction capability to allow the use of nominally identical, spherical mirror segments in large segmented primary apertures. Accurate shape control in one or more embodiments would also allow active compensation for thermal effects and long-term effects such as creep and aging of the mirror materials.

BRIEF DESCRIPTION OF THE DRAWINGS

Referring now to the drawings in which like reference numbers represent corresponding parts throughout:

FIG. 26. (a) Actuation pattern used for the CSM model showing the unique actuator locations. (b) Shape and magnitude of the corresponding influence functions for a 16-ply design.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

TECHNICAL DESCRIPTION

I. Optimized Actuators

1. Introduction

Figure 1:
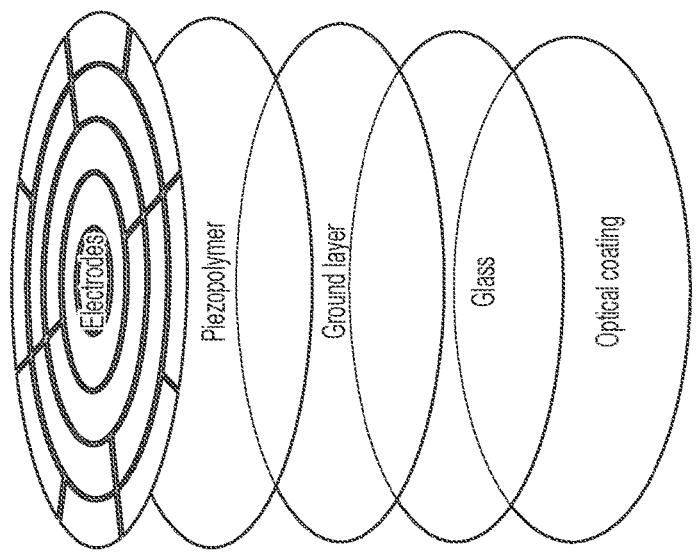
FIG. 1. Exploded view of the deformable mirror concept, showing separate layers (from [11]).

FIG. 1 illustrates a laminated mirror based on surface-parallel actuation. The mirror is composed of a thin and stiff optical-quality substrate with a continuous layer of piezoelectric material bonded to the back. This piezoelectric layer is covered by patterned electrodes on one face and by a continuous ground layer on the other face. As an alternative, several piezoelectric layers could be used, instead of a single one. Recent studies have addressed the manufacturing process and have explored and optimized different material choices, leading to two different solutions. The first solution [11] uses microfabrication techniques: the substrate is a wafer of single crystal silicon or glass and the active layer is formed from a piezopolymer, P(VDF-TrFE). A reflective metallic layer with thickness chosen such as to achieve thermal balancing of the laminate (i.e., to minimize thermally induced bending) is deposited on the substrate. This approach has been demonstrated to provide high optical quality mirrors with a dynamic range of tens of micrometers. The optical diameter accessible with such a technology is limited by the manufacturing capabilities of microfabrication, typically 100-200 mm. The second solution [16] uses a simpler manufacturing process based on carbonfiber reinforced plastic composite technology. The substrate is an ultrathin composite shell and the active layer is made of a piezoceramic, PZT. It is suitable for larger mirrors and is able to correct wavefront errors of the order of millimeters.

Nevertheless, producing composite shells of optical quality is challenging due to fiber print-through and the residual stresses resulting from curing. The active layer designs used in previous studies were mostly based on geometric intuition, with three main electrode patterns, FIG. 2. Unimorph and bimorph mirrors are classically designed with a keystone layout in which the actuators are arranged in rings and divided into angular domains [17]. Such a pattern is well-suited for circular mirrors requiring symmetrical shape correction. A honeycomb layout has also been used, notably when decentralized control is required. In this case, the actuators are all identical and arranged in a hexagonal tessellation [18]. Finally, a lattice of unidirectional actuators [12,19] has been chosen for rib-stiffened deformable mirrors and ultrathin membrane mirrors.

In some applications the optical pupil diameter is not required to match the full diameter of the mirror, and hence the edge of the mirror can be excluded if the accuracy of the shape correction deteriorates near the edges. Hence, for such applications the figure of the mirror near the edges is not critical. However, in a segmented primary mirror, ideally the full surface of each segment needs to be available, and hence achieving an accurate shape near the edges of the mirror segments is important. This requirement, not adequately addressed by existing designs for deformable mirrors, and the need to minimize the number of actuators needed to correct a dominant aberration mode, are motivations for one or more of the solutions presented here.

2. Optimization of Actuators

Optical aberrations are described by Zernike polynomials [20], which are defined by the radial and azimuthal orders, n and m. Their shapes and the notation used throughout the present disclosure are presented in FIG. 3.

The deformable mirror concept shown in FIG. 1, in which the active layer covers the whole (back) surface of the mirror, can easily accommodate any given set of correction requirements as the shapes of the individual electrodes can be modified without any impact on the other layers of the mirror. Note that it is also possible to leave some areas passive, i.e., without electrodes.

The problem of designing electrode patterns that target the correction of some specific error modes can be approached in several different ways. For example, one could consider patterns of general topology and vary the shape of the electrodes with a numerical optimizer that finds the design that provides the best performance. Alternately, one could use existing knowledge about the dominant error modes that are associated with a particular mirror concept and construction technique to develop specific types of electrode patterns that are well-suited to the correction of the dominant aberration modes. The latter approach is adopted in one or more embodiments of the present invention.

A. Actuator Geometry

Figure 4:
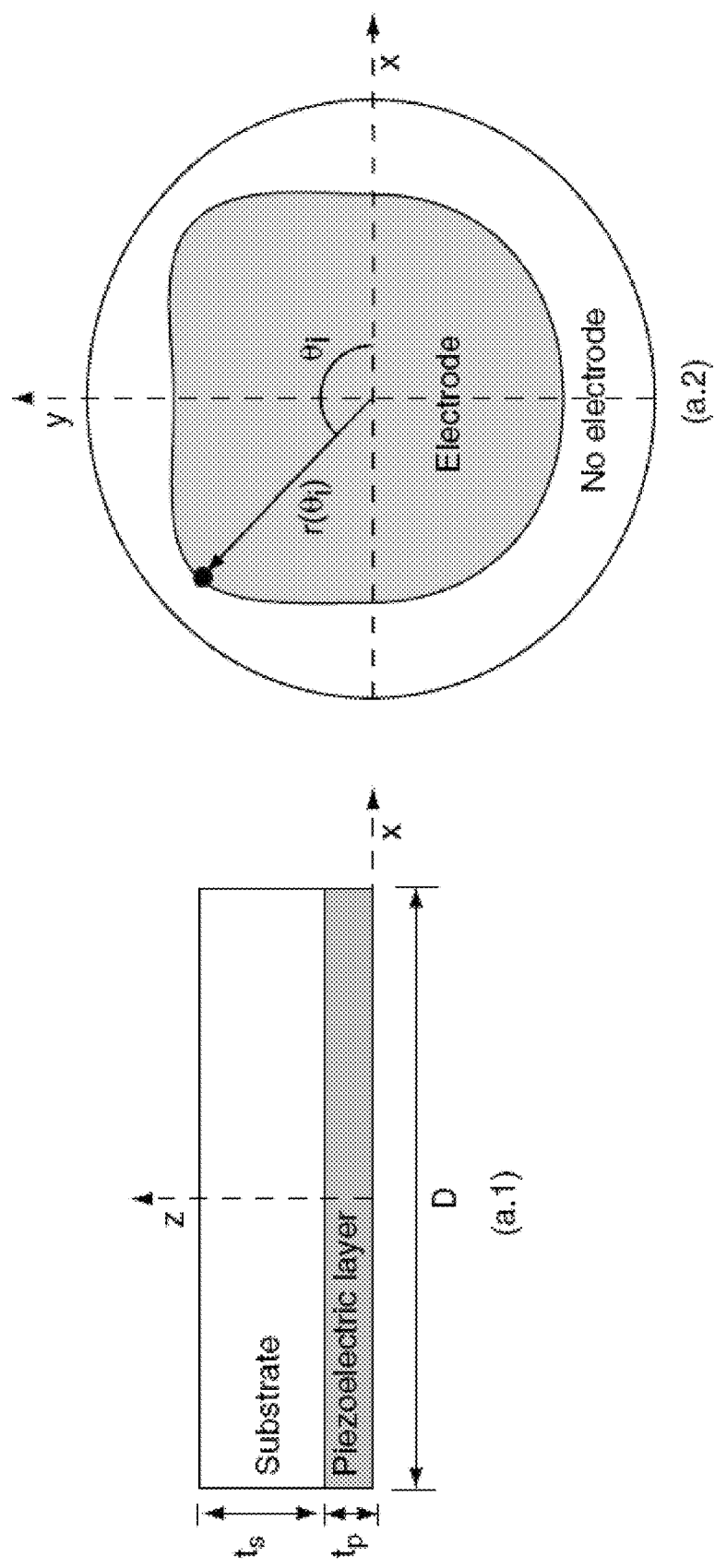
FIG. 4. Piezoelectric layer concepts. (a) Definition of electrode shape for single-actuator optimization. (b) Two actuators in separate layers, electrode 1 is shaped and electrode 2 covers the whole substrate. (c) Twin-actuator concept, the intersection of two basic electrodes defines 5 separate actuation zones.
Figure 4:
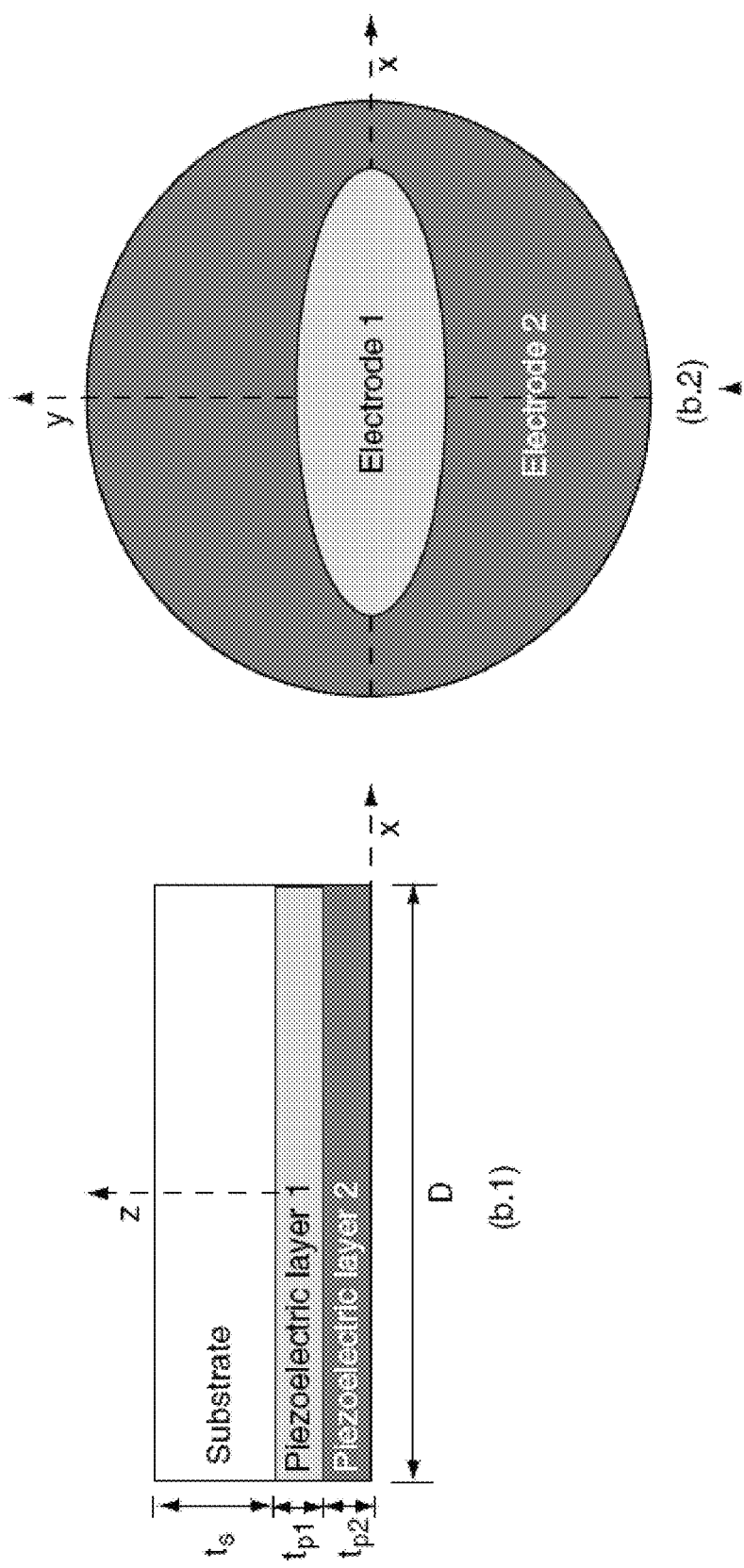
Figure 4:
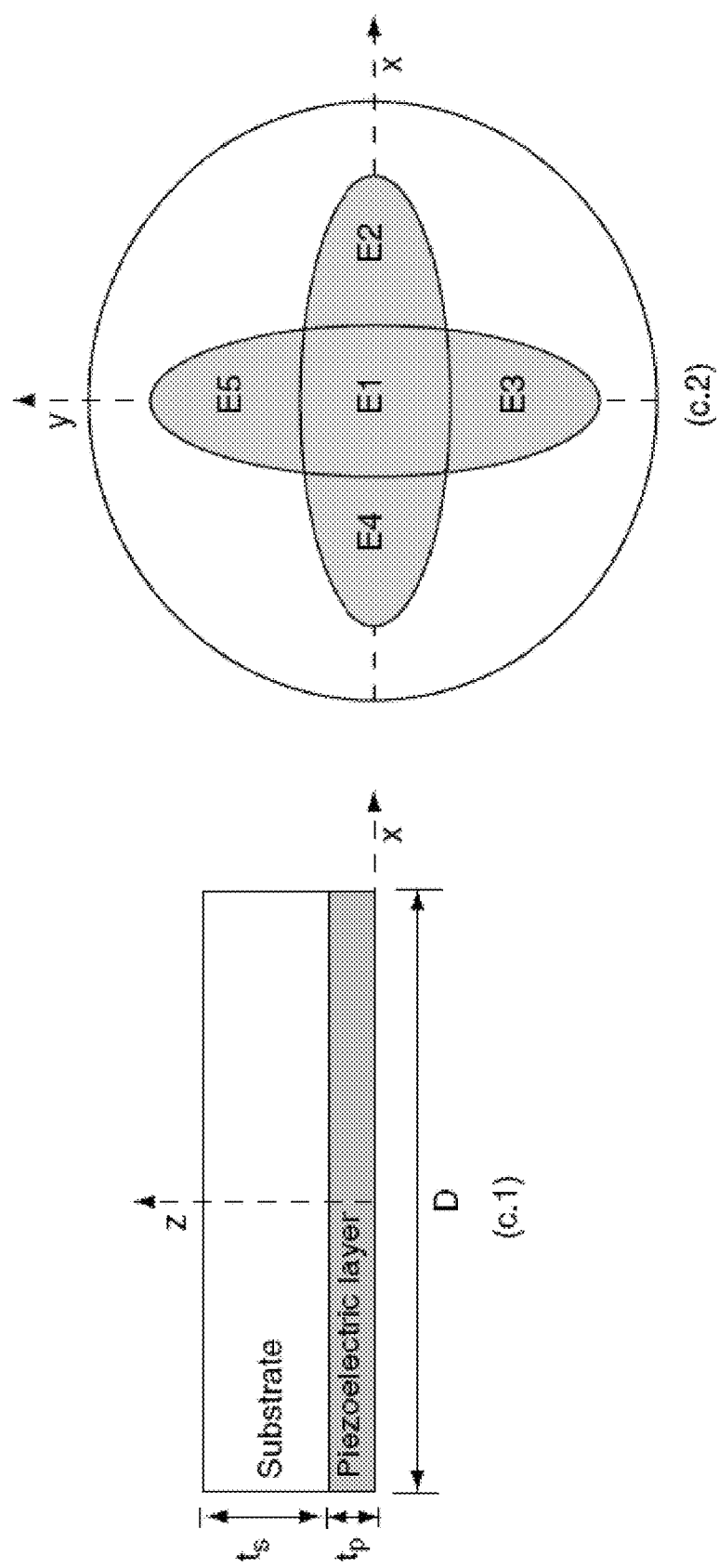

As an initial step, consider the problem of designing an actuator pattern to correct for a particular error mode in a circular mirror. The most direct approach is to use a single electrode, whose shape and position are optimized with the aid of a finite element model of the mirror and the actuator. The model is used by an optimization algorithm to predict the performance of a series of trial designs of the actuator until the pattern that produces the best possible correction is obtained. Assuming the actuator to have a singly connected shape, it can be defined in polar coordinates $r(\theta)$ by a set of control points equally spaced in the angular direction, see FIG. 4(a). The radial positions of these points are obtained from the optimization.

If the error mode is symmetric, then the shape of the electrode must also have the same type of symmetry. The error modes considered in the present study have azimuthal order $m \geq 2$ and radial order $n \geq 2$, see FIG. 3. Hence, the actuator is defined on a sector that subtends an angle $\pi/m$. The full geometry of the actuator is obtained by reflecting the shape in the initial sector across a radial line along the edge, and then repeating this pattern through $m-1$ rotations. Therefore, the complete pattern has m-fold symmetry. The case $m=1$, $n \geq 2$ can also be corrected, but the approach is somewhat different and will be discussed separately, at the end of this section.

A single electrode system tends to induce a curvature mode [21], hence generating a large amount of focus aberration, but this unwanted effect can be countered by the use of a second actuator. The simplest way of doing this is by introducing a second active layer stacked on the substrate. Since an axisymmetric actuator would be very effective in generating focus changes, the second actuator could have a circular shape covering the entire mirror, see FIG. 4(b). However, multi-layer actuators are technologically more complex than single-layer actuators and, furthermore, increasing the overall thickness of the mirror stack has the effect of decreasing the available dynamic correction range. Another approach uses a configuration that will be called a twin actuator, consisting of two electrodes with identical shape and within the same active layer, but rotated through $\pi/m$ and actuated by applying equal and opposite voltages. The focus change induced by the first actuator is then directly suppressed by the focus change introduced by the second actuator. The specific rotation angle of $\pi/m$ ensures that the correction mode generated by the second actuator has the same orientation as that generated by the first actuator. Note that this twin-actuator configuration provides double the correction amplitude of each single actuator when equal and opposite voltages are applied to the two electrodes. The twin actuator is built on the same piezoelectric layer, and the intersection between the two electrodes defines several separate actuation zones. The example in FIG. 4(c) has five actuation zones, labeled E1; . . . ; E5. Of course, in addition to applying only positive and negative voltages of the same amplitude to these electrodes, there is also the option of applying a different voltage to each electrode. Hence, it possible to correct for a range of shape errors, in addition to the basic error mode considered when originally designing the shape of the electrode.

The twin-actuator system consisting of several separate actuation zones, which was conceived as a solution to the problem of correcting a single, dominant error mode, is the basis of a more general actuator geometry that will be described next.

The general idea is to consider a set of nested twin actuators, each targeted to the correction of a specific error mode. The outermost twin actuator is defined by its contour $r_1(\theta)$, which is obtained from an optimization study based on a finite element analysis that evaluates the sensitivity of the shape correction to changes in $r_1(\theta)$. The second twin actuator lies inside the first and has the same orientation; it is defined by the contour $r_2(\theta)$ which is obtained from a further optimization study.

Smaller twin actuators can be nested inside the first two. Finally, the full set of twin actuators is rotated through $\psi/n$ to generate a second set that complements the first set. The purpose of the second set of actuators is to allow the correction of error modes with arbitrary orientation.

The twin-actuator geometry for the case $m=1$, $n \geq 2$ (coma) requires a twin actuator whose basic shape is defined over a sector that subtends an angle of $\pi$. Then, this shape is reflected across a mirror line to obtain the complete shape of the first actuator, and a rotation through $\pi$ generates the twin actuator which, as before, is actuated with a voltage opposite to the first actuator.

B. Mirror Shape Changes

Consider a mirror of diameter D, with substrate and piezoelectric layers, respectively, of uniform thickness $t_s$ and $t_p$. The piezoelectric layer covers the whole of the substrate, but is conceptually divided into two parts, an active part covered by the electrode and the remaining passive part. Applying an electric field to the active part induces a mismatch strain between the substrate and the piezoelectric layer, causing the mirror to bend. The deformation of the mirror is predicted by a finite element analysis in which the mirror is modeled as a thin shell with the finite element package Abaqus Standard [11,22].

The mirror model is constructed using thermoelastic thin shell elements, S4T, that are defined to have a composite stack lay-up: the substrate and active layers are modeled by defining two sections within the shell. Thermally induced strains are used to simulate the piezoelectric strains, hence a temperature field is applied as a substitute for the electric field and the thermal expansion coefficient substitutes for the d31 coefficient of the piezoelectric material. The thermal expansion coefficient is scaled so that a temperature variation of 1 K is equivalent to the application of 1 V across the faces of the piezoelectric layer.

Apart from out-of-plane effects, which are of no importance in the present case, this analysis is equivalent to modeling linearized piezoelectricity directly, but the present approach has the advantage of using standard finite elements.

A preliminary estimate of the correction curvature, $\kappa$, can be obtained by considering the deformation of a circular substrate due to stress applied by a piezoelectric layer covering the entire substrate. In this case, the curvature can be estimated from the biaxial moduli, M, of the substrate (denoted by the subscript s) and the piezoelectric layer (subscript p), defined as $M=E/(1-\nu)$ where E is the Young's modulus and $\nu$ is the Poisson's ratio [23]:

$$\kappa = 6 d_{31} \frac{V_l}{t_p} \frac{\frac{t_p}{t_s^2} \frac{M_p}{M_s}\left(1+\frac{t_p}{t_s}\right)}{1+\left(4\frac{t_p}{t_s}+6\frac{t_p^2}{t_s^2}+4\frac{t_p^3}{t_s^3}\right)\frac{M_p}{M_s}+\frac{t_p^4}{t_s^4}\frac{M_p^2}{M_s^2}}, \quad (1)$$

Where $V_l$ is the voltage limit and hence $V_l/t_p$ is the maximum electric field that can be applied to the piezoelectric layer without depoling. Given the required curvature correction, Eq. (1) can be used to estimate the thickness of the piezoelectric layer, if all other parameters are known.

Detailed estimates of the deformed shape of the mirror can be obtained from the finite element model, for any chosen shape of the active part of the piezoelectric layer and for the selected mechanical properties and thickness of both substrate and piezoelectric layers. The optimal shape of the electrode can be determined by defining a suitable objective function, f, and by optimizing its value through changes in the shape of the electrode. This optimization can be carried out by coupling the finite element analysis with a minimizer suitable for nonconvex problems. An algorithm that performs a global search of the design space is the covariance matrix adaptation evolution strategy algorithm (CMAES) [24].

C. Problem Formulation

The wavefront error is defined by the initial error, P. It should be noted that the wavefront error, which is equal to two times the surface error, is the only error measure quoted throughout the paper. As a first case, assume that P has a single Zernike component with radial order n≥2 (because piston, tip, and tilt errors can be corrected by means of rigid-body actuators):

$$P = a_i Z_i, \qquad (2)$$

where $Z_i$ is the Zernike mode of the error and $a_i$ its amplitude. Any trial design of the actuator pattern is characterized by its influence matrix, F, which contains the wavefront maps induced by a unit command on each actuator [25]. Projecting the initial error onto the column space of F gives the set of voltage commands $$V = F^+ P, \qquad (3)$$

where $F^+$ is the generalized inverse of F. Then, the actual wavefront correction is $$P_c = FV \qquad (4)$$

and the residual error is $$R = P - P_c. \qquad (5)$$

The performance of a trial actuator design is then characterized by two quantities:

its correctability, $c_i$, given by the ratio between the root-mean-square (RMS) amplitude of the wavefront error before and after correction:

$$c_i = \frac{\|P\|_{rms}}{\|R\|_{rms}}; \qquad (6)$$

its stroke, $s_i$, given by the maximum amplitude of the mode that can be corrected without saturating any actuators. $s_i$ depends on the voltage limit, $V_l$, and the largest voltage command obtained from Eq. (3), max (V):

$$\hat{s}_i = \frac{V_l}{\max(V)} a_i. \qquad (7)$$

It should be noted that the above definition of stroke uses an estimation of the actuator voltages that does not account for any voltage constraints. This approach leads to severe under-estimates of the capability of a deformable mirror because, although the saturation of a few actuators leads to reduced correctability, most mirror designs are still able to provide significant corrections beyond the point at which some actuators have saturated. A more detailed discussion of this issue is provided in Section 3.B.

In order to maximize both correctability and stroke for mode i, the following multi-objective function f is defined as $$f = \lambda_1 c_i + \lambda_2 s_i, \qquad (8)$$

where $\lambda_1$ and $\lambda_2$ are weights allocated to the two quantities, depending on specific correction requirements.

The above problem formulation can be readily generalized to wavefront errors including several Zernike modes, i.e., Eq. (2) is replaced by $$P = \sum_i (a_i Z_i). \qquad (9)$$

The overall correctability and overall stroke are then defined as $$\bar{c} = \sum_i \beta_i c_i, \quad \bar{s} = \sum_i \beta_i s_i, \qquad (10)$$

where $\beta_i$ is the weight allocated to Zernike mode i, depending on the correction requirements, and the summation is extended to the range of modes of interest.

Third-order aberrations (i.e., the five aberration modes in the row n=2 of FIG. 3) are generally the most important because they correspond to the first errors that appear in an optical system [26], hence a weight of 1 was allocated in the present study. Fifth-order aberrations (shown in the row n=3 of FIG. 3) had a weight of 0.1 and seventh-order aberrations (shown in the row n=4 of FIG. 3) had a weight of 0.01. These values were chosen on the basis of manufacturing, thermal deformation, and misalignment shape errors that are typically en-countered in active optics applications. Different values would be chosen for applications such as adaptive optics. Note that a weight of zero was allocated to piston, tip, tilt, and focus aberrations: these modes are generally corrected by means of a separate system [27].

3. Astigmatism-Based Actuator Patterns

Third-order astigmatism is one of the most important aberration modes in an optical system: it is a significant component of the initial shape distortion of mirrors and one of the first off-axis aberrations induced by misalignment [28]. Hence, deformable mirror designs need to be particularly efficient in the correction of this mode and, because the magnitude of third-order astigmatism aberrations is often large, a significant stroke (dynamic range) is also needed. This section presents several designs of actuator patterns optimized for astigmatism correction. While the correctability of a deformable mirror depends only on the geometry of the electrode pattern, its stroke depends also on the diameter of the mirror, as well as on the curvature that can be achieved by reaching the voltage limits of the actuators [which can be predicted with Eq. (1)].

Mirrors with a diameter of 100 mm and with the same thickness and material properties as the mirrors studied in Ref [11] were considered. These mirrors are flat and consist of a 200 µm layer of glass ($E_s$=65 GPa, $v_s$=0.2) and a 20 µm layer of P(VDF-TrFE) ($E_p$=1.45 GPa, $v_p$=0.34).

The limit voltage was set at 500 V. The main reason for studying flat mirrors is that they can be built more easily, making it cheaper to test prototypes of the proposed solutions. It should be noted that the results obtained in the present study are in fact applicable also to mirrors that are slightly curved. For example, for a radius of curvature of 2 m the RMS difference between the influence functions for a flat and a curved mirror with the same actuator design, is of the order of 0.7% the amplitude of the influence function for the flat mirror.

A. Basic Set of Actuators

Figure 3:
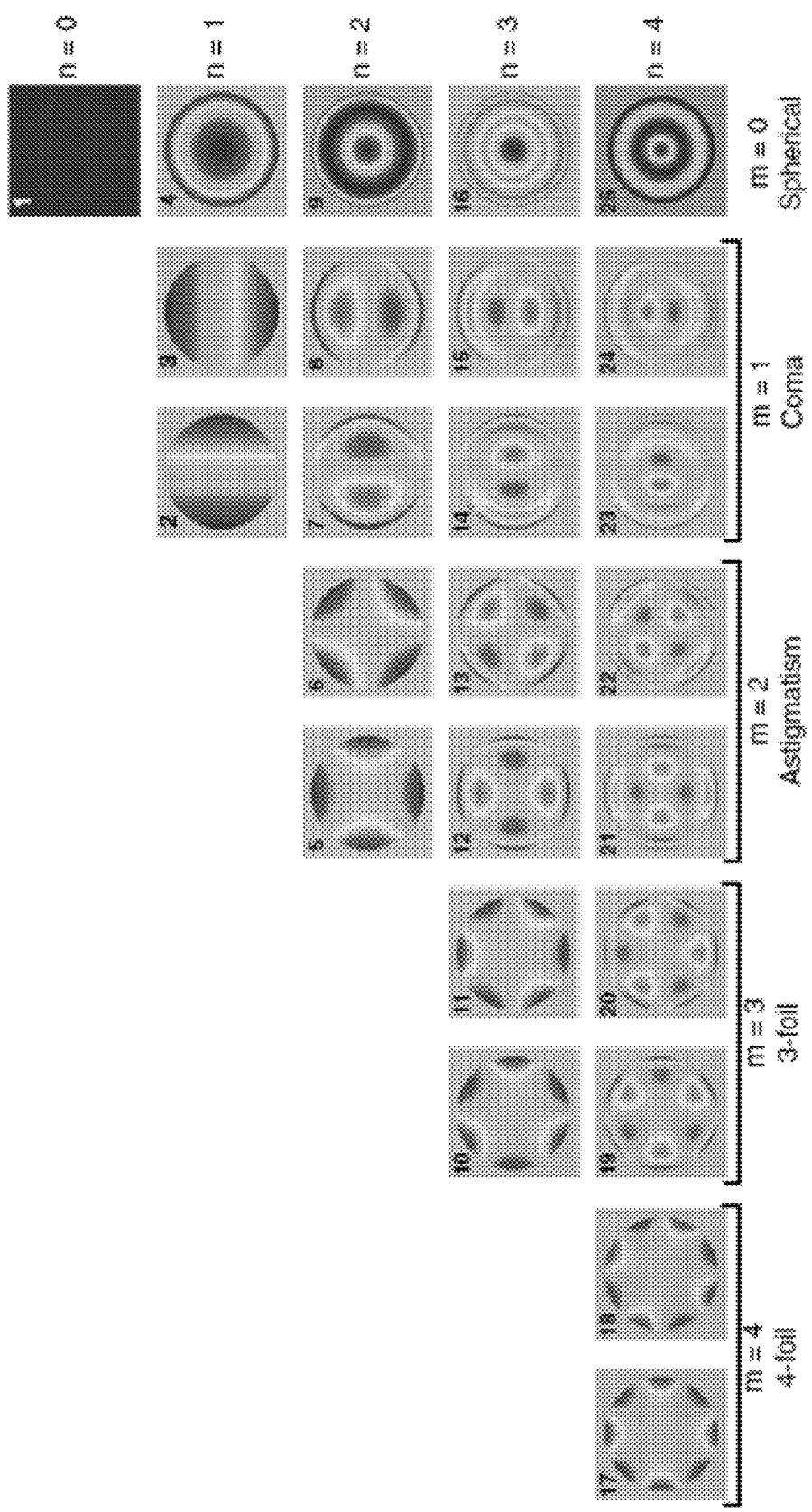
FIG. 3. First 25 Zernike polynomials.

Third-order astigmatism has two planes of mirror symmetry, see FIG. 3, and hence only a quarter of the basic electrode shape needs to be determined. The problem of finding the shape of one-quarter of the basic electrode was formulated as described in Section 2.C, biasing the solution toward higher correctability and lower stroke, by assigning $\lambda_1=10$ and $\lambda_2=1$ in the objective function of Eq. (8). The reason for assigning a lower weight to the stroke is that, as noted in Section 2.C, the stroke defined in Eq. (7) provides an underestimate of the true correction amplitude of which a mirror is capable. The results of the shape optimization for a single electrode, defined by the values of $r(\theta)$ at 6 points located in one quadrant, are presented in FIG. 5(a). The optimal shape for a single actuator is the bow-tie shape in FIG. 5(a1) and, for a third-order astigmatism aberration with RMS amplitude of 1 µm, the best possible correction is close to a cylindrical deformation, FIG. 5(a2). The residual total wavefront RMS error is 1.587 µm, FIG. 5(a3), which is reduced to 0.378 µm after removal of the focus aberration. The correctabilty and stroke [obtained from Eqs. (6) and (7)] of this system are $c_5=0.6$ and $s5=1.5$ µm.

A twin actuator was also designed, as explained in Section 2.A. The basic electrode shape was obtained, as before, by computing 6 points located in one quadrant. It resembles an ellipse and for simplicity it will be described by the lengths of the horizontal and vertical semiaxes. Overall, the twin-electrode pattern consists of a large central part defined by the intersection of two ellipses, labeled E1 in FIG. 4(c2), subjected to a voltage of zero, surrounded by four crescent-shaped regions labeled, E2 to E5, alternately subjected to positive and negative voltages of equal magnitude. The size of the zones E2 to E5 depends on the weights given to stroke and correctability when defining the optimization function, but the overall pattern is general.

The optimized configuration and performance of this twin-actuator system are presented in FIG. 5(b). Overall, this design is able to correct third-order astigmatism with a correctability of 10 and a stroke of 3 µm. Compared to the single actuator system performance, the correctability has increased by a factor of 17 and the stroke by a factor of 2.

Figure 6:
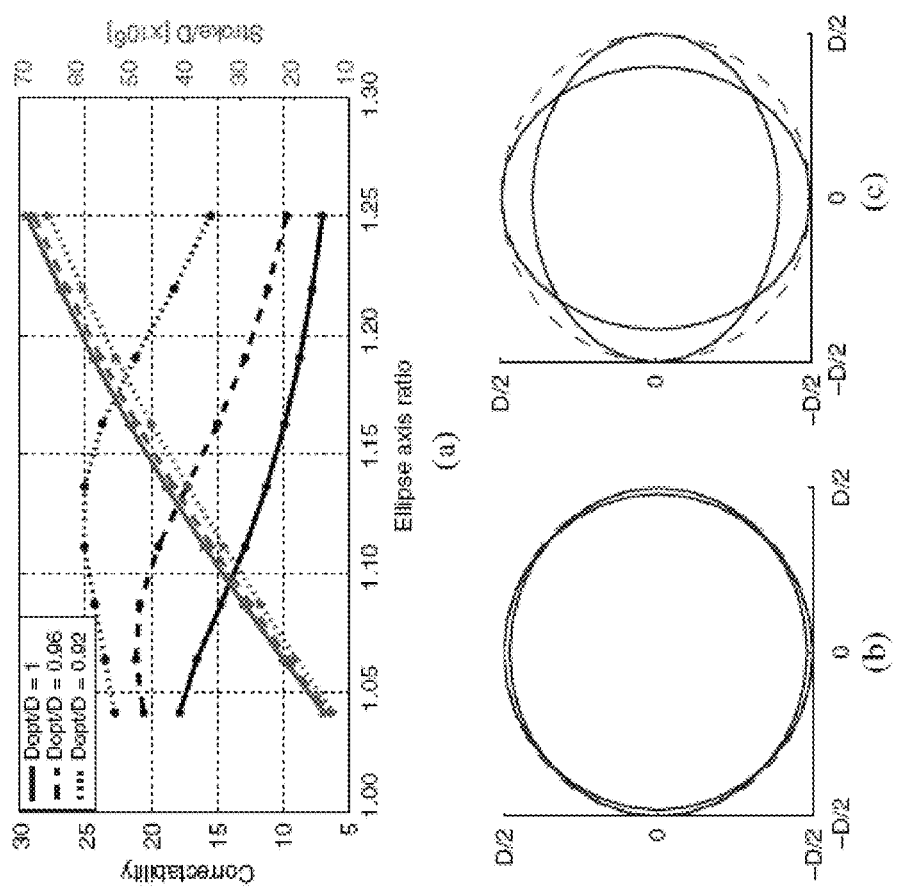
FIG. 6. (a) Evolution of correctability and stroke with ellipse and pupil dimensions, for third-order astigmatism correction provided by system in FIG. 5(b1). Actuator patterns for ellipse axis ratios of (b) 1.04 and (c) 1.25.

Varying the ratio between the length of the major axis (which is equal to the mirror diameter) and the length of the minor axis of the two ellipses controls the system performance. The performance trends have been studied numerically, assuming the actuators to be exactly of elliptical shape to simplify the parametrization of their geometry; the results are shown in FIG. 6. Note that a configuration with an axis length ratio close to 1, which has narrow actuation zones E2 to E5, is the most efficient in generating astigmatism correction but has limited stroke. On the other hand, a configuration with a smaller axis length ratio leads to larger edge actuators and significantly improves the stroke, but at the expense of a lower correctability.

FIG. 6 also shows that reducing the ratio between the optical pupil diameter and the mirror diameter has a significant impact. Because the residual error is largest near the edge of the mirror, choosing a smaller pupil leads to a better correctability.

B. Additional Actuators

Figure 5:
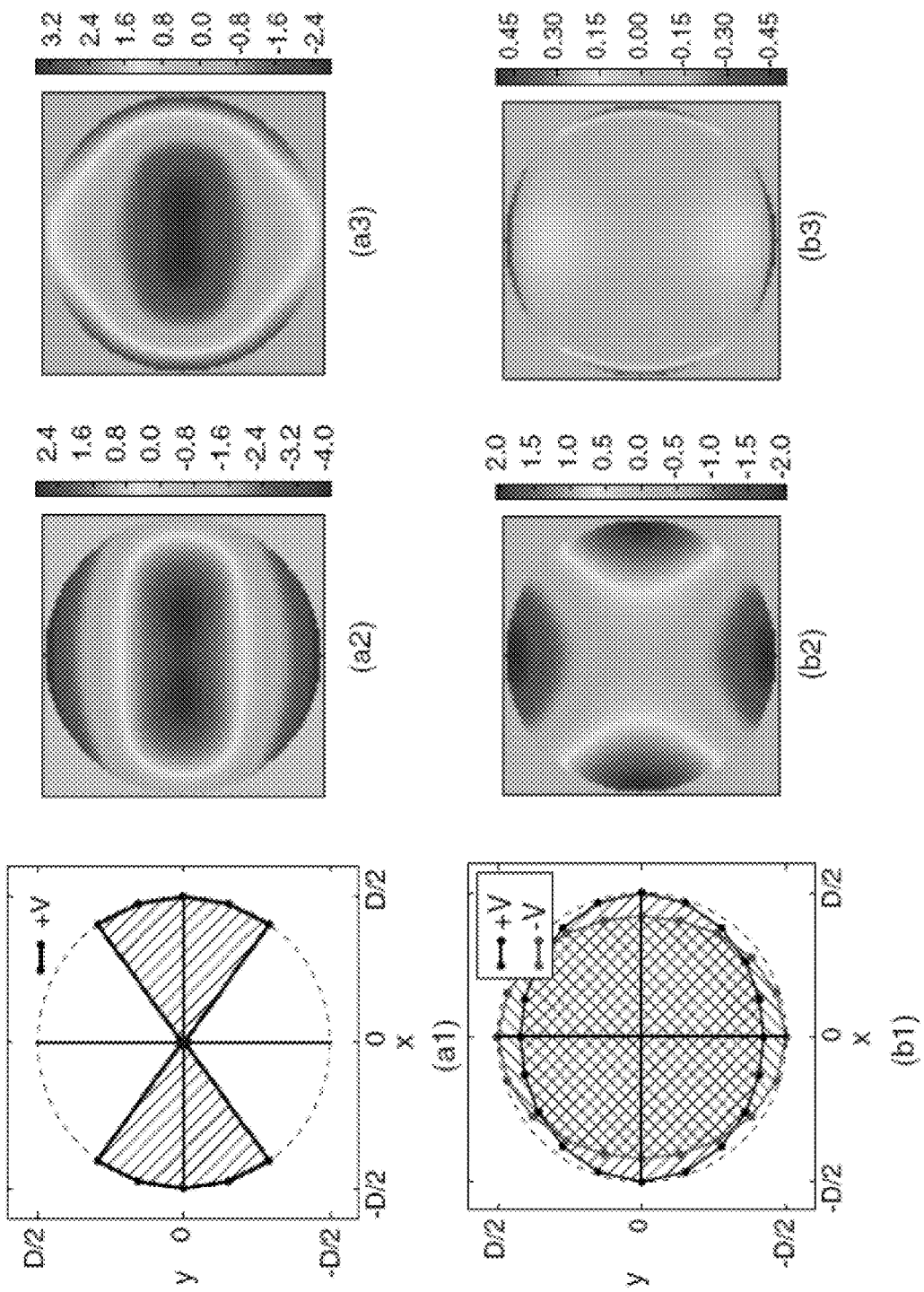
FIG. 5. Optimized electrode shapes and system performance for the correction of 1 μm RMS of astigmatism. (a1) Single-actuator configuration. (a2) Correction, including focus aberration (1.875 μm RMS). (a3) Residual wavefront error (1.587 μm RMS). (b1) Twin-actuator configuration. (b2) Correction (1.002 μm RMS). (b3) Residual wavefront error (0.104 μm RMS). (Units: μm.)

The twin-actuator system presented in the previous section provides an efficient solution for the correction of third-order astigmatism, leaving a residual wavefront error mainly composed of higher-order astigmatism, see FIG. 5(b3).

Additional, internal actuators are introduced to compensate for this residual error, as well as providing a capability to correct for other aberration types. This section deals with the design of the internal actuators to further improve the correction of third-order astigmatism, whereas the correction of other error modes is discussed in the following section.

Figure 7:
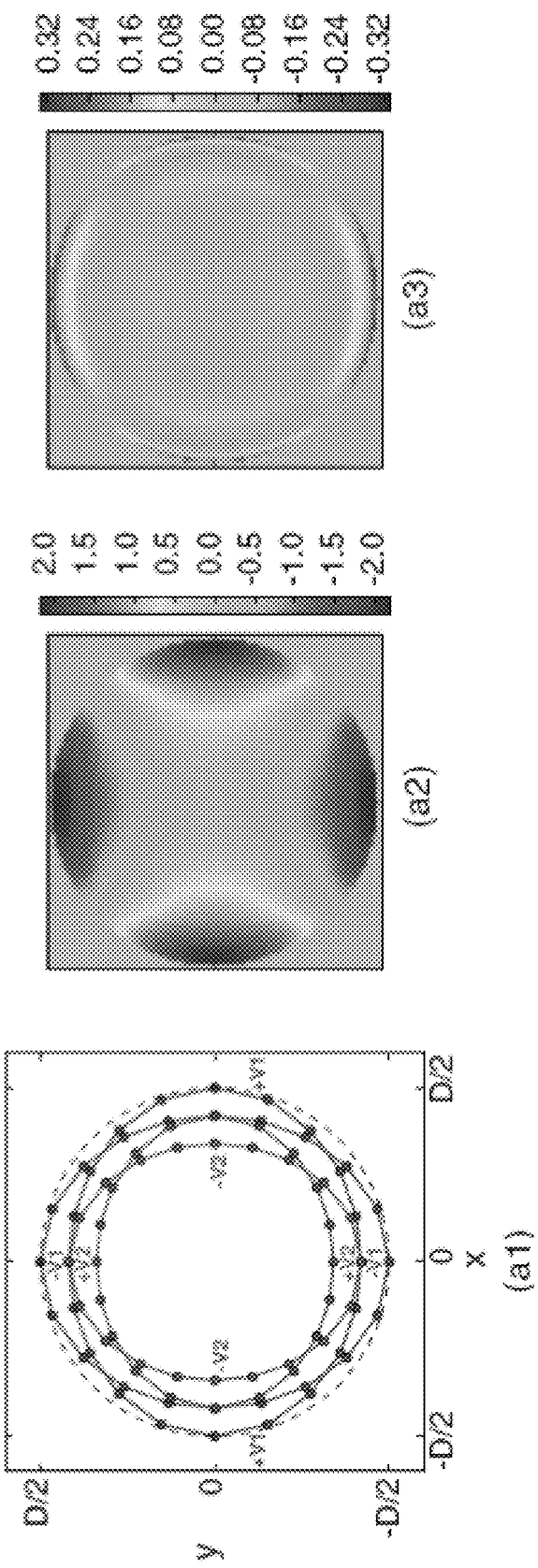
FIG. 7. Optimized electrode patterns and system performance for the correction of 1 μm RMS of astigmatism. (a1) Two sets of twin actuators resulting in 13 actuation zones. (a2) Correction (0.993 μm RMS). (a3) Residual wavefront error (0.053 μm RMS). (b1) Four sets of twin actuators resulting in 29 actuation zones. (b2) Corrected wavefront (0.993 μm RMS). (b3) Residual wavefront error (0.050 μm RMS). (c1) Four sets of twin actuators plus four additional sets at 45° resulting in 129 actuation zones. (c2) Correction (0.994 μm RMS). (c3) Residual wavefront error (0.014 μm RMS). (Units: μm.)
Figure 7:
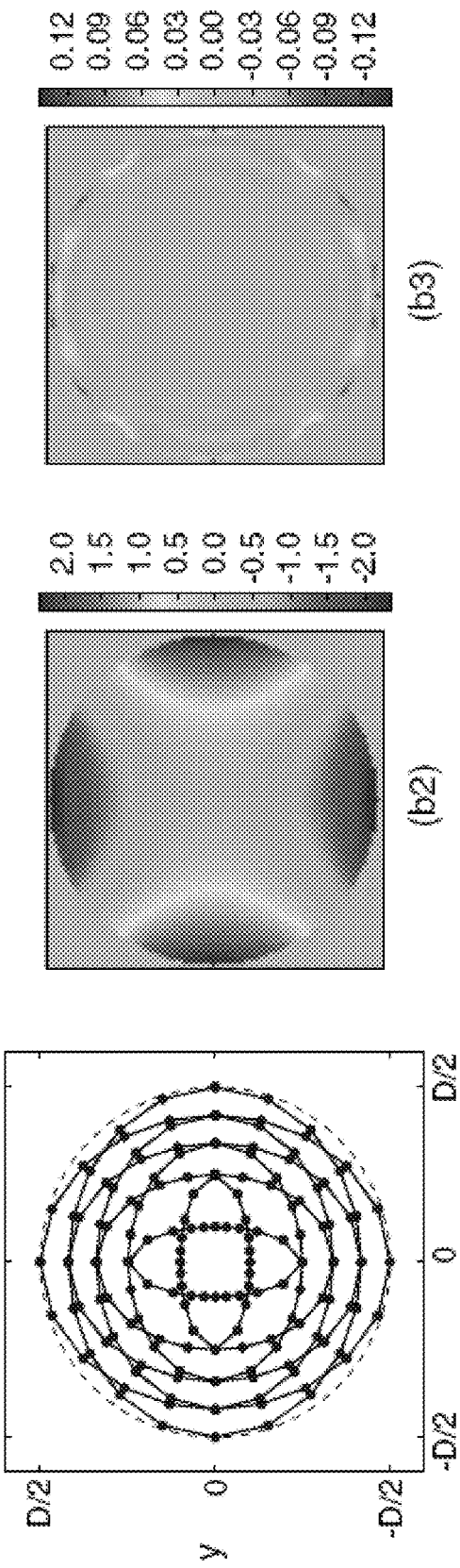
Figure 7:
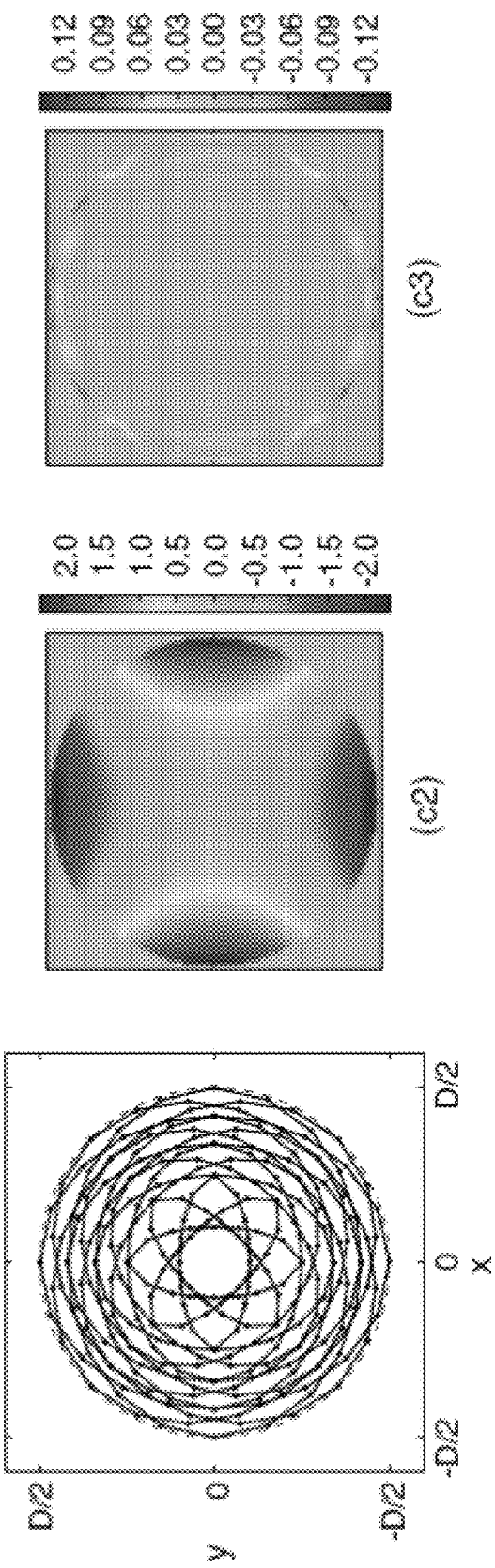

As a first modification to the basic twin-actuator system, a second set of twin actuators is nested inside the previously defined set, FIG. 7(a1). It consists of two orthogonal electrodes whose common shape is determined by solving an optimization problem in which both correctability and stroke for third-order astigmatism correction are considered. For each optimization trial, the different electrode commands are determined from Eq. (3) and the correctability and stroke are computed from Eqs. (6) and (7). The objective function, Eq. (8), is defined with the same weights as in Section 3.A, $\lambda_1=10$ and $\lambda_2=1$.

FIG. 7(a) presents the results for a system consisting of two sets of twin actuators. In the figure, note that the shape of the inner electrodes is also closely approximated by an ellipse; the major axis of the inner ellipse matches the minor axis of the outer ellipse, hence leading to a maximum area of active material. The minor axis drives the achievable stroke and correctability. The ratios between the major and minor axes for the outer and inner sets of ellipses are 1.19 and 1.23, respectively. The similarity between the internal and external electrode patterns can be explained by the fact that higher-order astigmatism aberration corresponds to third-order astigmatism on a smaller circle. Note that the addition of the inner twin actuator has increased the correctability by a factor of 2.

Additional sets of twin actuators can be added inside these two sets, to further improve the mirror performance. The outcome is an actuator system with several nested actuation zones.

For example, FIG. 7(b1) shows an actuation system consisting of four nested rings of orthogonal ellipses. The optimized ellipses axes ratios for the external, 2nd, 3rd, and 4th set are, respectively, 1.19, 1.23, 1.36, and 2.5.

A more general pattern that can correct for astigmatism in any direction can be obtained by rotating through 45° the above sets of actuators and then defining smaller actuators from the intersections between the original and rotated actuators.

The overall electrode pattern consists of 129 independent actuation zones, providing a highly efficient correction of astigmatism in both x and y directions. The correctability provided by this pattern is improved by a factor of almost 10 compared to the configuration in FIG. 7(a1).

An important issue that arises when considering actuator patterns with smaller and smaller features is that, due to the small volume of active material associated with tiny actuators, these actuators tend to saturate much earlier than larger ones.

Hence, the stroke $s_i$ defined in Eq. (7), which assumes a hard stop at first saturation, becomes a rather misleading performance criterion, as it neglects a large residual correction capability. For example, for third-order astigmatism correction of the actuator design shown in FIG. 7(c1) the voltage command for the outermost, tiny actuators is 100 times larger than for the innermost actuators.

Figure 8:
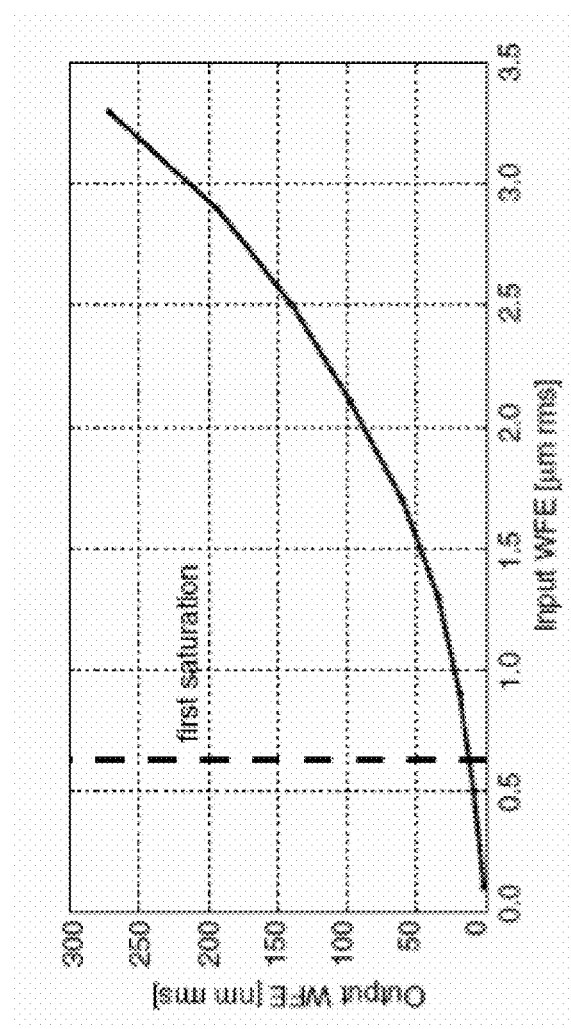
FIG. 8. Performance of the 129-actuator system: evolution of the residual wavefront error with the amplitude of third-order astigmatism (considering a pupil of 98% of the total mirror diameter).

Therefore, although the stroke continues to be a useful indicator of performance, a more effective representation of the true correction capability of a mirror design is the variation in correctability with error amplitude, which can be computed with a constrained least squares algorithm [29]. For the example design in FIG. 7(c1), a voltage limit of +/−500 V was imposed and the evolution of the amplitude of the residual error (output) with the initial error amplitude (input) was computed. The results are presented in FIG. 8. For small inputs there are no saturated actuators and hence the output varies linearly with the input; the slope of the output/input graph corresponds to the reciprocal of the system correctability, which has an initial value of 71. When some of the tiny edge actuators reach saturation, all further voltage increments are subject to the constraint that the voltage in the saturated actuators can only remain constant or be decreased. Hence, at this point the correction performance is slightly degraded as the slope of the output/input graph increases. However, the overall performance remains quite good, with a correctability of ~60, as long as the only saturated actuators are the small ones, which have no significant impact. For input amplitudes of around 1.3 μm RMS, the edge crescent actuators also begin to reach saturation and from this point there is a further decrease in correctability, to ~40.

It has been shown in this section that a basic set of four edge actuation zones allows a coarse correction capability that is gradually improved by adding internal actuators. The overall system can efficiently correct third-order astigmatism, even when some actuators become saturated, providing a good correctability and a significant dynamic range. Other types of aberrations are considered in the next section.

C. Correction of Other Zernike Modes

In addition to providing an efficient correction of third-order astigmatism, the 129-actuator layout shown in FIG. 7(c1) can be used to correct other types of aberrations. Its computed correctability and stroke for each of the first 25 Zernike modes are presented in FIG. 9(a). The overall correctability and stroke, computed from Eq. (10) with $\beta_i=0$ for i=1; . . . ; 4, $\beta_i=1$ for i=5; . . . ; 9, $\beta_i=0.1$ for i=10; . . . ; 16, and $\beta_i=0.01$ for i=17; . . . ; 25, are presented in FIG. 9(b). Two different ratios of optical pupil diameter to overall mirror diameter have been considered; note that the correctability increases significantly with even relatively small reductions in pupil size.

Figure 9:
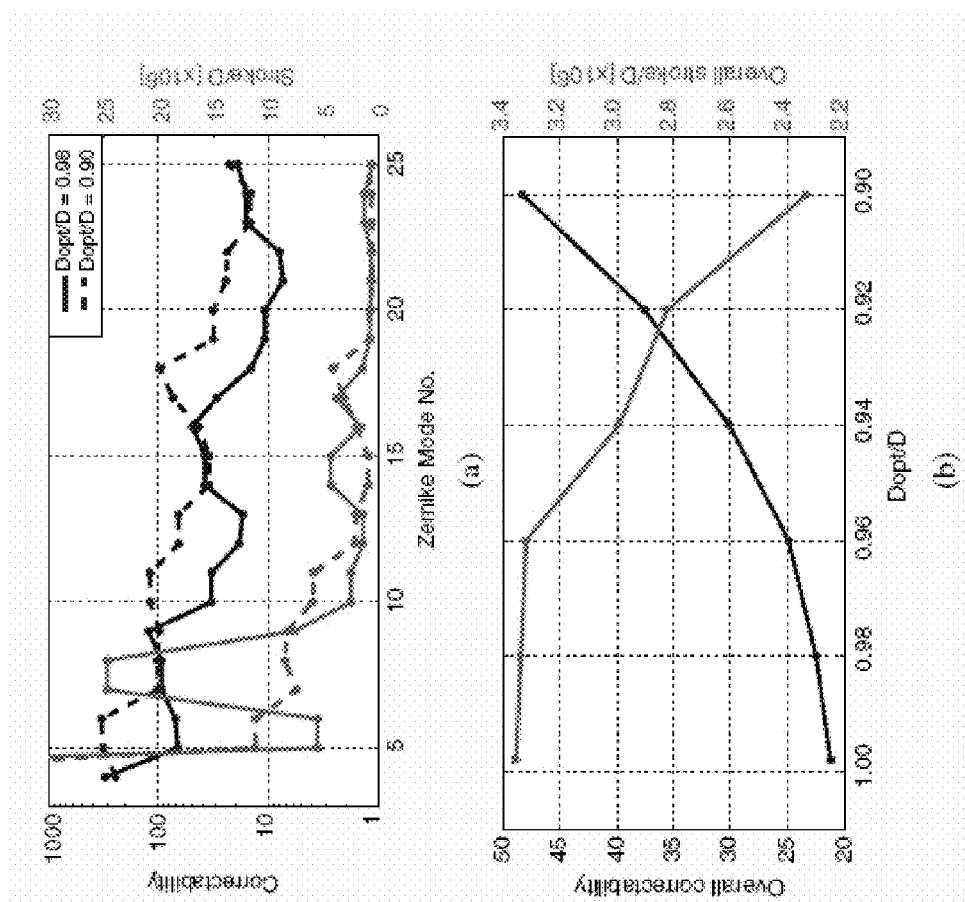
FIG. 9. Performance of the 129-actuator system. (a) Correctability and stroke of first 25 Zernike polynomials for two pupil sizes. (b) Evolution of the overall correctability and stroke [defined in Eq. (10)] with pupil size.

In FIG. 9(a) the evolution of the correctability with Zernike modes of increasing order is very satisfactory; for a pupil diameter of 98 mm the correctability is higher than 10 for all but two modes. For a pupil diameter of 90 mm the correctability is higher than 30 for the first 20 modes. The stroke values, also plotted in FIG. 9(a), are relatively low for the reasons already discussed in Section 3.B. However, a more detailed examination of the variation in correctability with error amplitude, accounting for actuator saturation by means of a constrained least squares algorithm, shows that beyond first saturation the reduction in correctability is gradual and follows the same trend as in FIG. 8 also for other types of aberrations.

Thus, the actuator configuration in FIG. 7(c1), although optimized for third-order astigmatism generation, is in fact able to efficiently correct the first 25 Zernike polynomials, making this design suitable for many potential applications.

4. Manufacturing Constraints

The 129-actuator mirror shown in FIG. 7(c1) is an ideal design that has been optimized for astigmatism correction and has been shown to correct efficiently also other Zernike modes. However, there are some practical limitations on the electrode pattern when one considers the physical implementation of this design. First, each electrode has to be large enough that a physical connection to the voltage controller can be built. The actual limit depends on the fabrication process; in the present study a minimum contact area of 1 mm×1 mm was assumed.

Second, the electrodes must be physically separated; the separation distance depends on the fabrication process as well as the presence (or not) of an insulating coating on the electrode. In the present study a minimum interelectrode distance of 0.5 mm was assumed. Finally, to avoid shorting across the edges of the mirror, the electrodes cannot extend to the edge of the mirror, hence a clear annulus with a radial width of 1.5 mm minimum was assumed. The reduction in performance of the mirror due to these constraints is discussed in the following subsections.

A. From Ideal to Feasible Patterns

Figure 10:
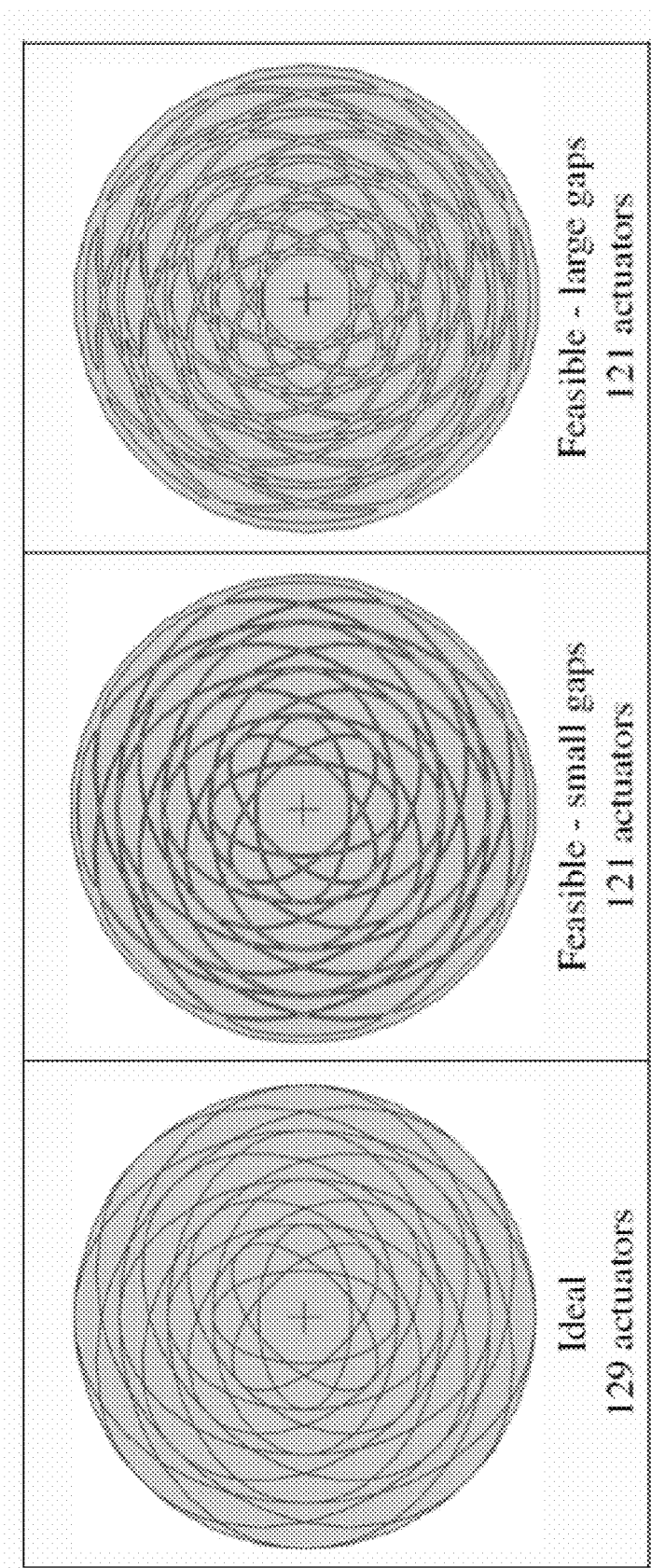
FIG. 10. Effects of manufacturing constraints; the clear edges induce the loss of 8 actuators and the interactuator distance induces a loss of active material.
Figure 11:
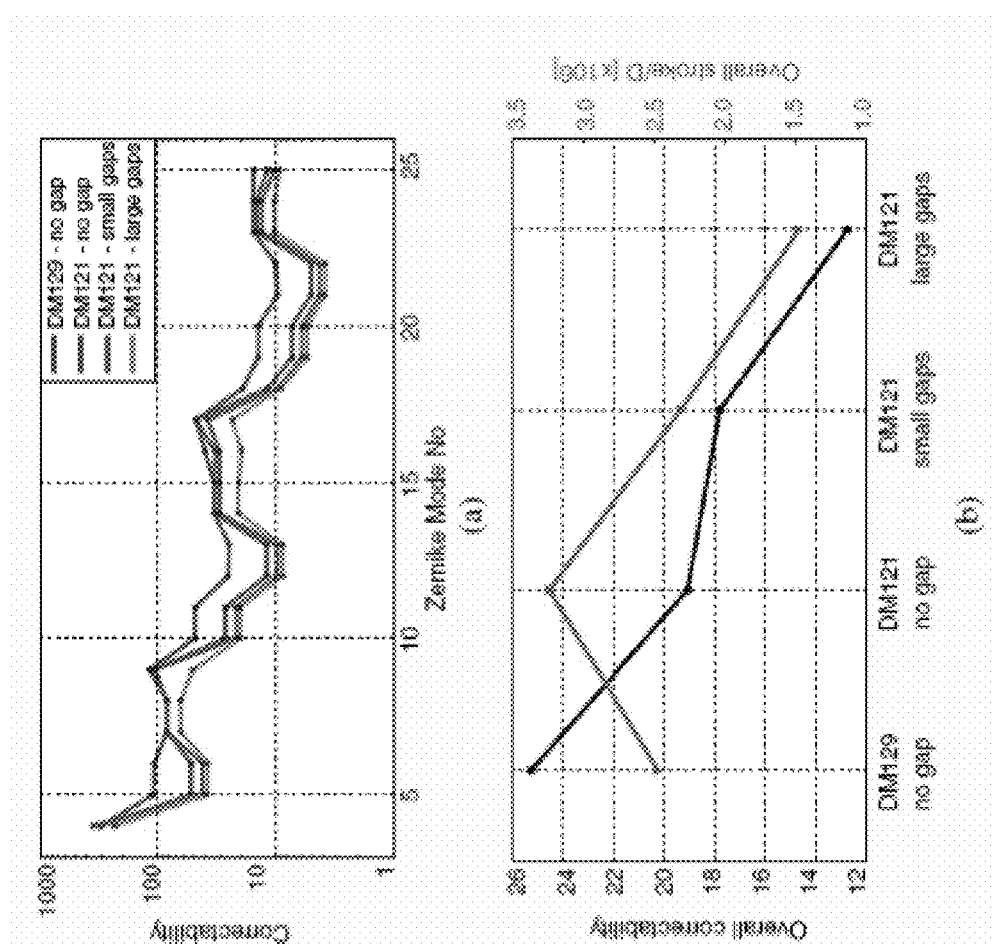
FIG. 11. Performance comparison between ideal and feasible patterns, considering a pupil of 97% of the total mirror diameter. (a) Correctability of the first 25 Zernike modes. (b) Overall correctability and stroke, as defined in Eq. (10), for different mirror designs.

The finite element model of the optimized mirror design was modified to analyze two configurations incorporating the manufacturing constraints described above. The first configuration had gaps of 0.5 mm between the actuators and a 1.5 mm wide clear annulus around the edge. The alternative configuration had 1 mm gaps between the actuators and a 2 mm clear annulus around the edge. It can be seen in FIG. 10 that even the introduction of the smaller clear annulus has the effect of removing the eight tiny electrodes near the edge, hence reducing the number of actuators to 121. The computed performance of each pattern is presented in FIG. 11(a), in terms of correctability for each of the first 25 Zernike modes. Note that astigmatism and trefoil correction are the most affected by the removal of the eight edge actuators. It is interesting to analyze the different contributions to the loss of performance of the ideal pattern. They are presented in FIG. 11(b) in terms of overall correctability and overall stroke for the ideal configuration with 129 actuators, for the configuration with only 121 actuators with no gaps, and for the 121-actuator configurations with small and large gaps. The figure shows that the removal of the eight tiny edge actuators leads to a 22% reduction in correctability together with a gain in stroke of 25% (because the edge actuators were the first to saturate). The small gaps between the electrodes lead to a further 10% reduction in overall correctability, and the larger gaps to a 30% reduction. The stroke is, respectively, decreased by 30% and 50%, compared to the 121 electrodes pattern without gaps. Thus, one or more embodiments of the invention show that the introduction of interactuator gaps affects all modes roughly in the same way, whereas introducing a clear edge affects mostly the modes involving edge actuation. The latter effect can be mitigated by a reduction in the pupil diameter, as outlined in FIG. 9(b).

B. Simplified Actuator Patterns

It is also interesting to explore the trade-off between performance and total number of independent actuation channels. Hence, starting from the 121-actuator optimized pattern with no gaps, the number of actuators was reduced by grouping together neighboring actuators and the performance of the simplified mirror designs obtained in this way was computed with the finite element model. Alternative groupings of the actuators were also considered and the configurations with the best mean performance were selected and used to develop further simplified configurations. The four axes of symmetry of the initial pattern were maintained throughout this process and the edge actuators were maintained as they are essential for third-order astigmatism correction. This evolution of the actuator pattern from 121 to 41 actuators is presented in FIG. 12 and the mean correctability and stroke of the simplified designs are presented in FIG. 13, for a pupil diameter of 97% of the total diameter. As already seen in FIG. 9(b), an improved performance is obtained for a smaller pupil size. The performance of the mirror decreases by a relatively small amount when the 121 actuators are reduced to 57, but the decrease is comparatively much larger when going from 57 to 41 actuators. For example, the overall correctability is initially decreased by only 20% when the number of actuators is more than halved, but it is then decreased by 20% when a further 25% of the actuators are removed.

C. Comparison to Classical Patterns

Figure 2:
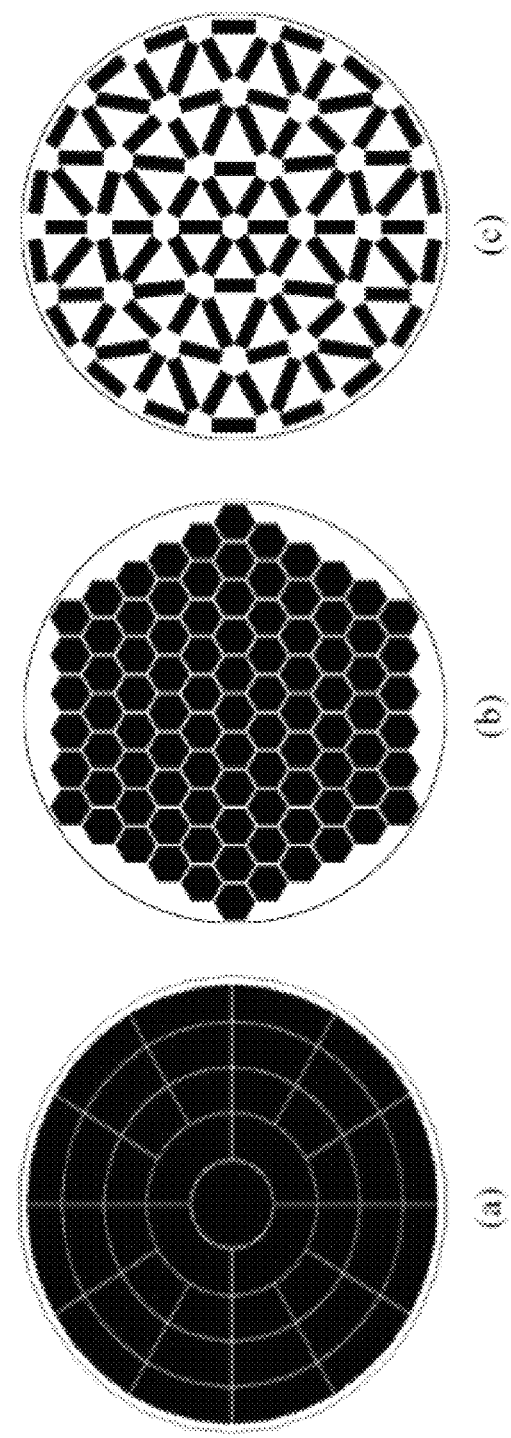
FIG. 2. Classical layouts of electrodes in surface-parallel actuated mirrors: (a) keystone, (b) honeycomb, and (c) lattice.
Figure 12:
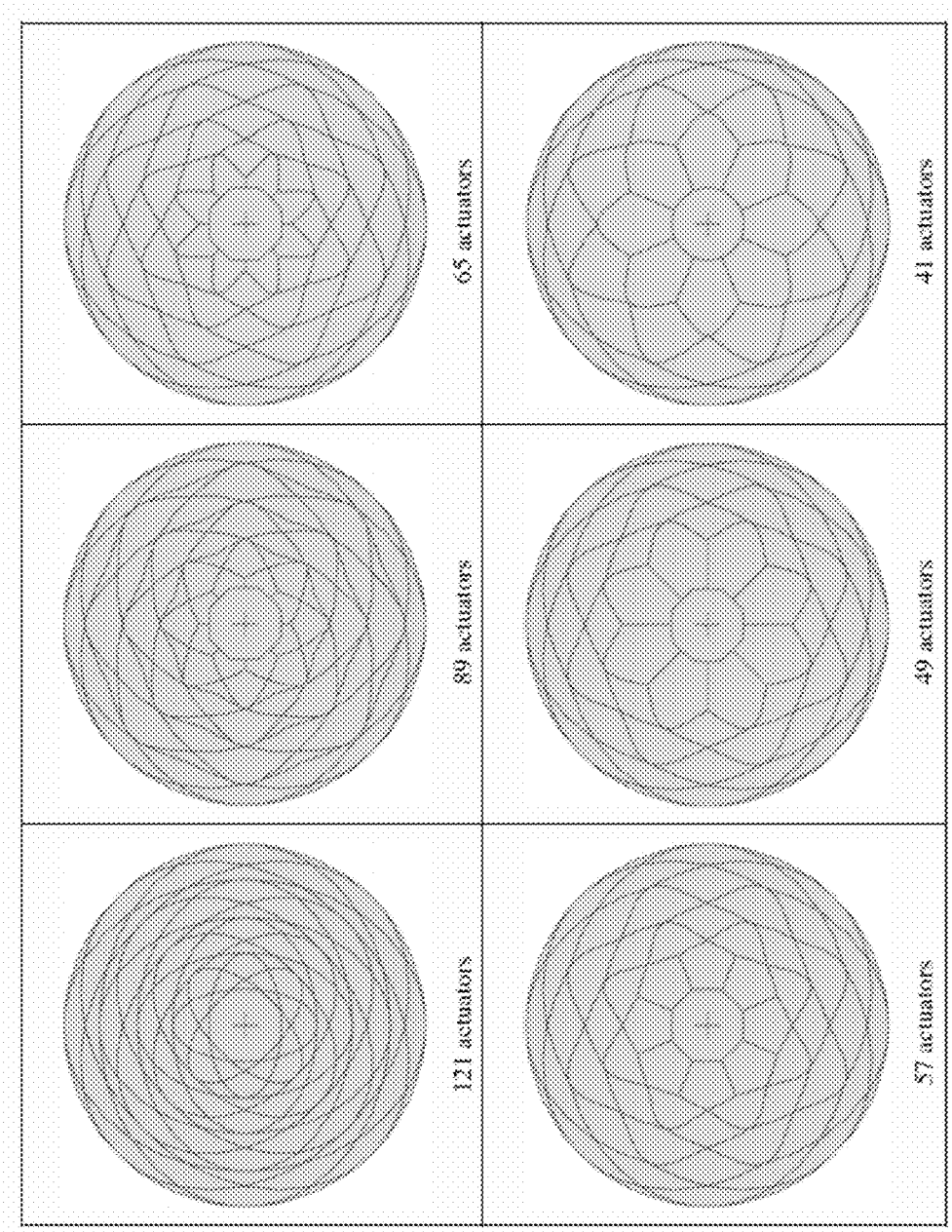
FIG. 12. Designs with decreasing numbers of actuators.
Figure 13:
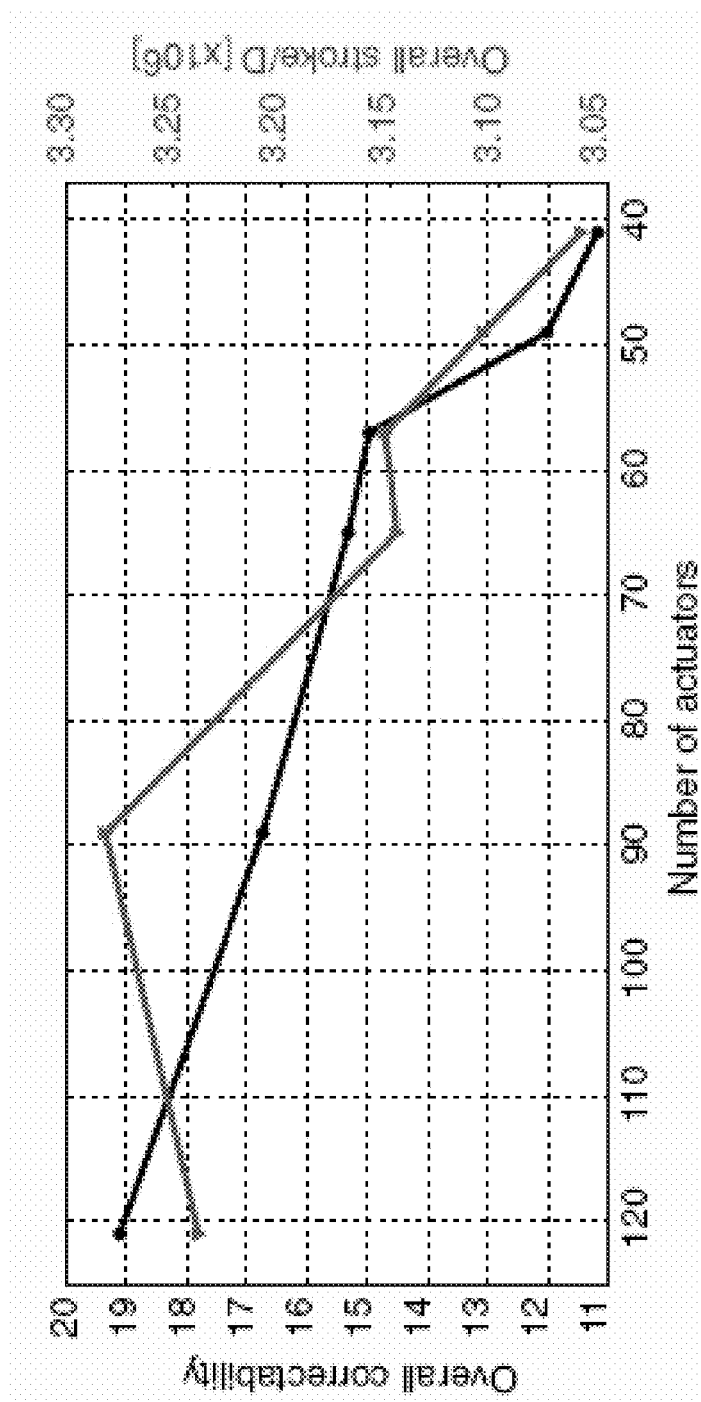
FIG. 13. Overall performance of actuator designs presented in FIG. 12, considering a pupil of 97% of the total mirror diameter.
Figure 14:
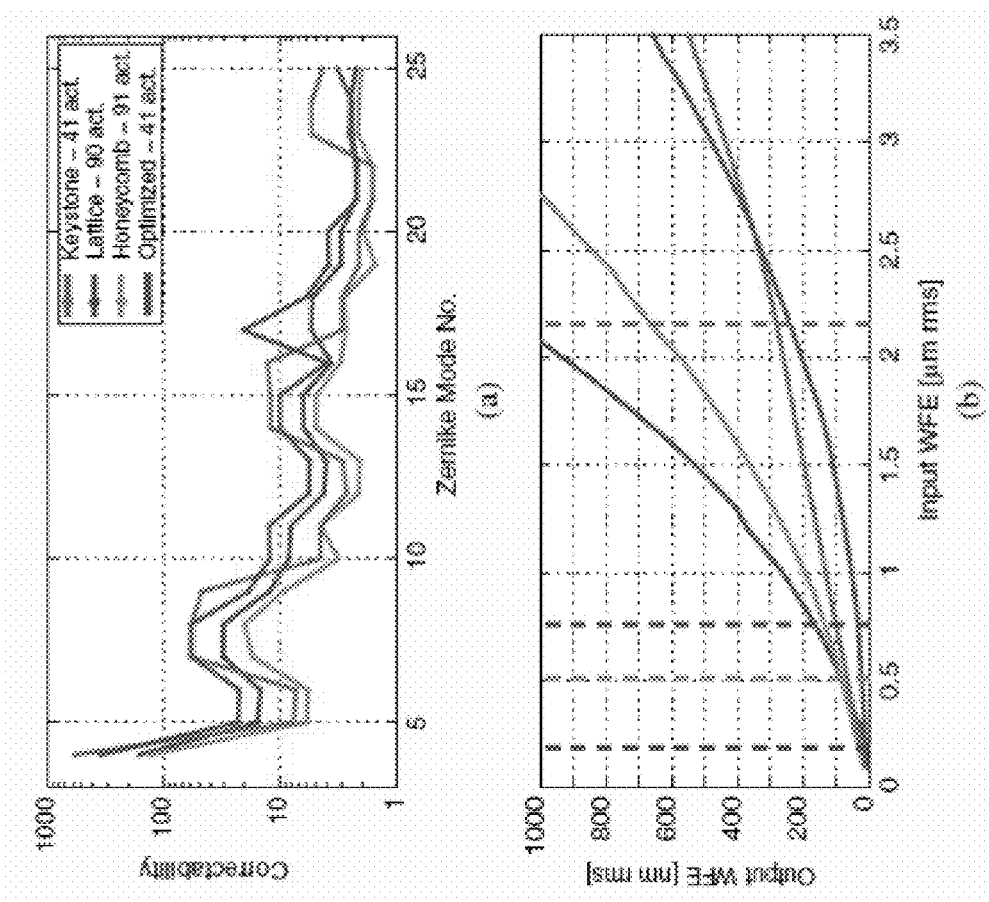
FIG. 14. Performance comparisons between the optimized 41-actuators pattern obtained according one or more embodiments of the invention with three classical patterns shown in FIG. 2. A pupil of 97% of the total mirror diameter has been assumed. (a) Correctability of the first 25 Zernike modes and (b) variation of the residual error for third-order astigmatism aberration of increasing amplitude.

A comparison between the performance of the optimized actuator pattern with 41 actuators, shown in FIG. 12, and the three classical patterns shown in FIG. 2 was carried out. For this study, the detailed geometry of each pattern was modified as explained in Section 4.A, by incorporating 0.5 mm interactuator gaps and a 1.5 mm wide clear annulus around the edge. The performance of each design was computed with a finite element model analogous to that described in Section 2.C. The results are presented in FIG. 14.

FIG. 14(a) shows plots of correctability for the first 25 Zernike modes. It can be seen that the optimized design provides by far the best correctability for third- and fourth-order astigmatism (modes 5, 6 and 12, 13). It has the best or equal best correctability for 14 modes and is within 50% of the best correctability for three more modes. The keystone design with 41 actuators shown in FIG. 2(a) is significantly better for modes 9, 17, 23, and 24. Note that the honeycomb design with 91 actuators shown in FIG. 2(b) and the lattice design with 90 actuators shown in FIG. 2(c) have worse performance than the optimized design for all modes.

FIG. 14(b) shows plots of the residual wavefront error (output) for increasing amplitudes of a third-order astigmatism aberration. The initial slopes of the four input-output curves correspond to the correctability values for mode 5. Hence, as already seen in FIG. 14(a), the optimized actuator pattern has the lowest residual outputs and the lattice design is the second best. The keystone design produces a nearly linear response, as it is the least affected by actuator saturation, and for input errors with amplitude greater than 2.5 μm provides the lowest residual errors.

5. Experiments

A. Mirror Design and Manufacturing

The 41-actuator mirror shown in FIG. 12 was manufactured with the techniques described in Patterson and Pellegrino [11]. The main steps of the manufacturing process were as follows:

Coating of the front face of the polished glass substrate with reflective material and thermal balancing layer;
Deposition of the ground layer;
Deposition of the piezopolymer layer on the back face of the glass substrate via spin coating, and curing of the piezo-polymer;
Coating of the piezopolymer layer with a conductive film using vacuum sputtering; the electrode pattern is obtained by covering the piezopolymer layer with a shadow mask during this process;
Poling of the piezopolymer layer by applying a high voltage;
Annealing of the piezopolymer layer;
Kinematic mounting of the mirror onto a printed circuit board by means of three assemblies of magnetic spheres around the edge;
Wire bonding of the individual electrodes to the circuit board;
Attachment of the mirror assembly to an optical bench through a gimbal that provides piston, tip and tilt adjustment.

Figure 15:
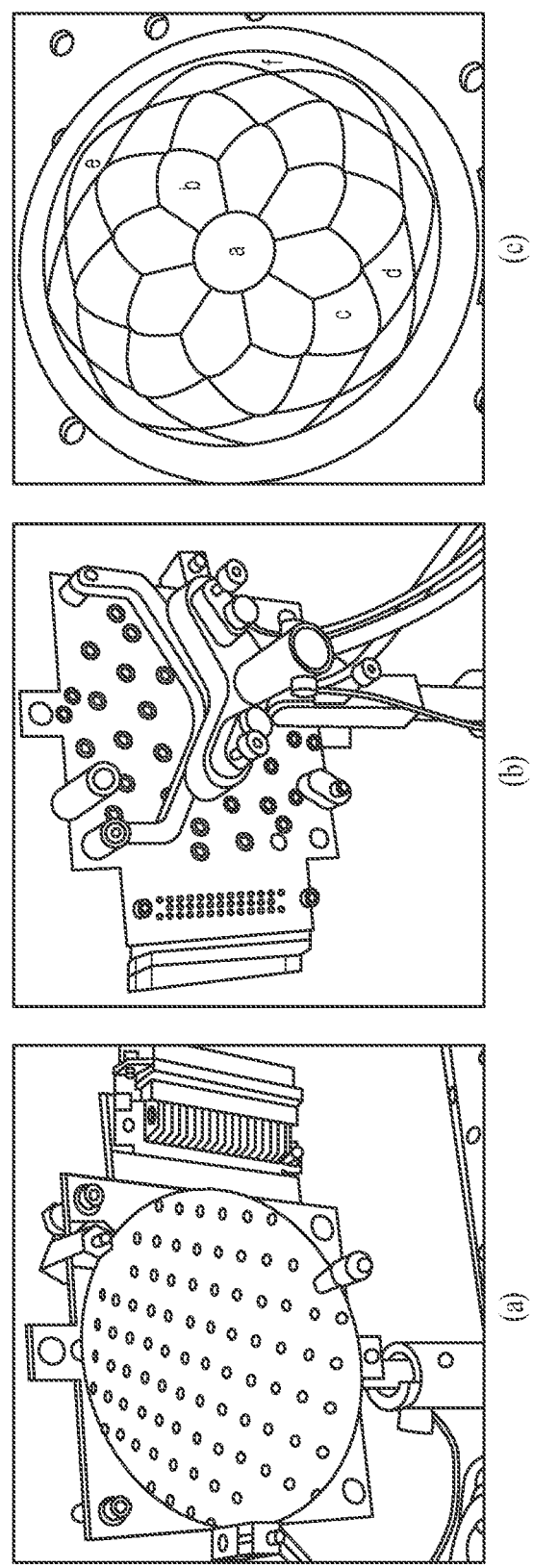
FIG. 15. (a) Front view of the mounted mirror showing the reflective surface and three mounting points. (b) Rear view of the mounted mirror showing electronic board and gimbal. (c) Electrode pattern with labeling of 6 unique influence functions.

In addition to the interactuator gaps and clear edge region discussed in Section 4, three additional clear areas at 120° spacing were created to allow for kinematic mounting of the mirror at locations near the edge. Finally, a straight edge was introduced in the electrode pattern to facilitate the alignment of the different layers. A nominally flat mirror obtained from this process is shown in FIG. 15. This mirror has a 100 mm diameter, optical quality surface, 235 μm thick borosilicate glass substrate, and 10 μm thick P(VDF-TrFE) coating. These thicknesses are slightly different from those considered in Section 3, but its behavior is qualitatively unchanged.

B. Testing

Figure 16:
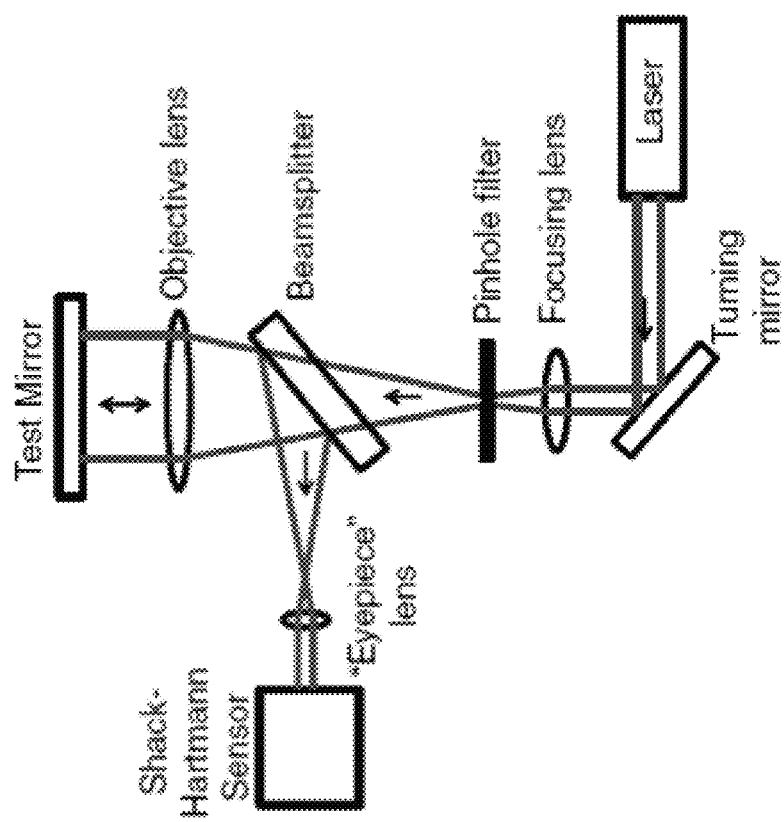
FIG. 16. Layout of test setup [11].

The influence functions of 41-actuator mirrors made with the process described in the previous section were measured on an optical testbed based around a ThorLabs WFS150-7AR Shack-Hartmann wavefront sensor conjugated with the deformable mirror. The sensor provides 39×31 lenslets. FIG. 16 shows a diagram of the experimental setup. It consists of a 633 nm laser beam filtered with a pinhole, collimated, reflected off the deformable mirror under test, and then passed to the wavefront sensor by means of a beam splitter and lens. This arrangement was chosen so as to reimage the mirror pupil to a smaller size that fits inside the sensor aperture. The wavefront was sampled through the sensor lenslet array.

Figure 17:
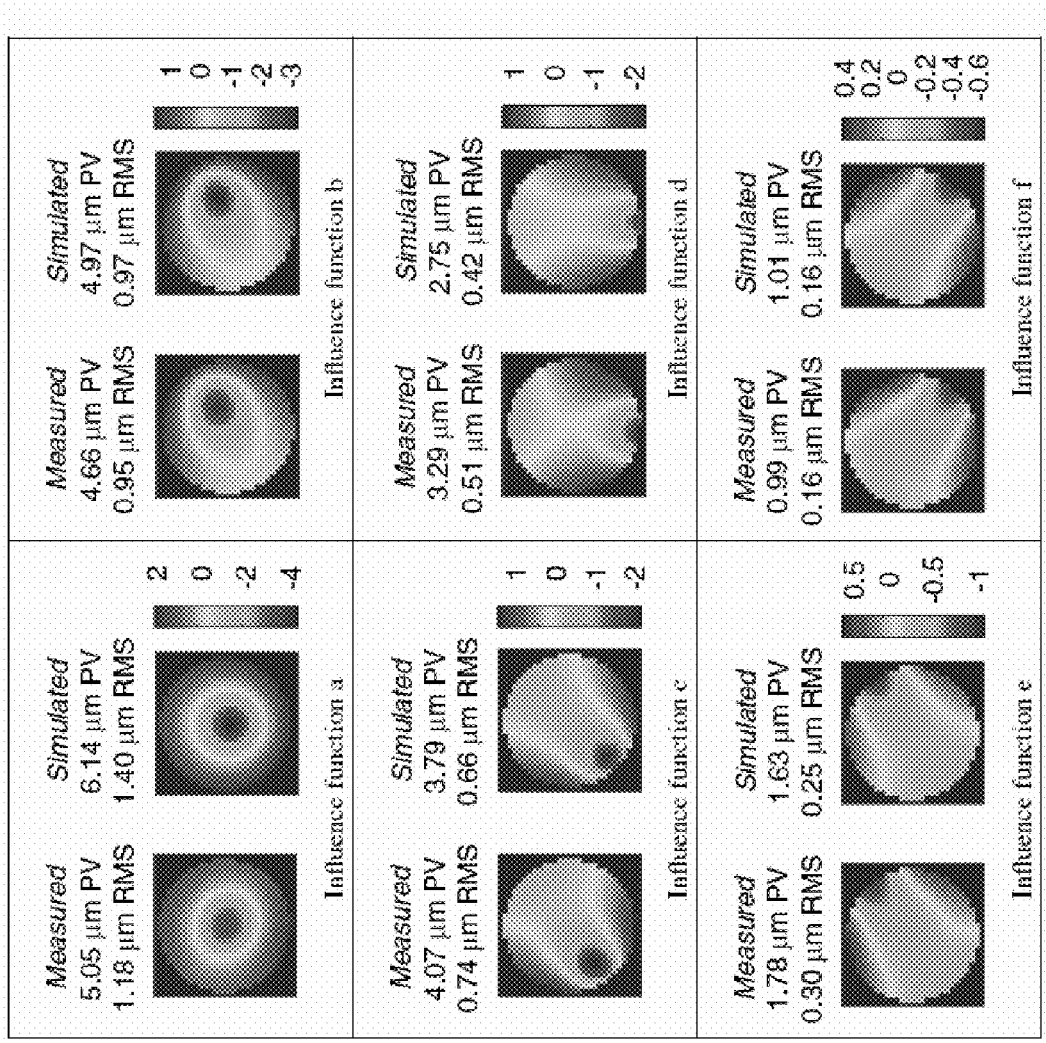
FIG. 17. Side-by-side comparisons of measured and simulated unique influence functions for the manufactured mirror. The 6 unique influence functions are defined in FIG. 15(c). (Units: μm.)
Figure 18:
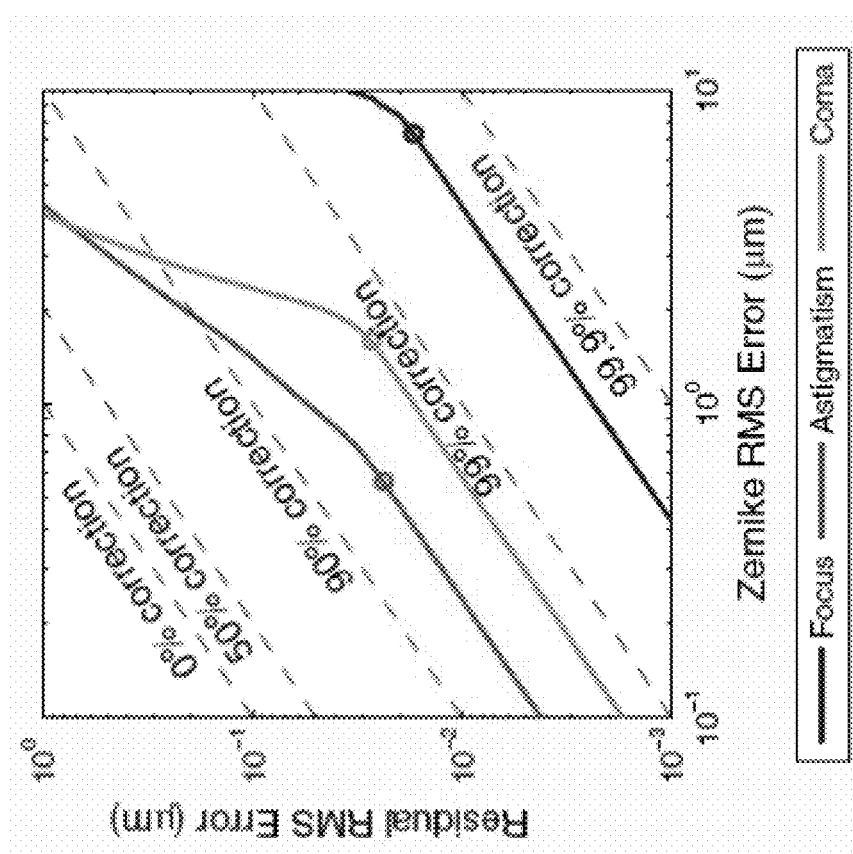
FIG. 18. Expected performance of the manufactured mirror for focus, astigmatism, and coma correction, considering a pupil of 97% of the total mirror diameter.

The Shack-Hartmann sensor had been calibrated by the manufacturer. A thick, flat mirror was first used to align the setup; then, the flat mirror was replaced with the deformable mirror and the Shack-Hartmann sensor was moved in the piston direction in order to zero the bulk mirror defocus and capture the image of the pupil (mirror). With this procedure, the shape measurement was relative to the closest sphere. Due to the relay lens magnification, the measurements were limited to a 100 mm by 80 mm (39 by 28 spot array) image area, and trimmed down to an 80 mm pupil diameter. The mirror behavior was characterized through its influence functions. The influence function for each uniquely shaped electrode, see the labeling in FIG. 15(c), was measured by taking the difference between a reference measurement with all channels off, and a new measurement with a single channel turned on and set to 500 V. The local slopes of the wavefront were measured by the Shack-Hartmann sensor and from the slopes the wavefront error map was reconstructed with a zonal reconstructor, which integrates the measured slopes on the optical aperture [30]. The measurements and the predictions, obtained from a finite element model that matches the measured substrate and coating thicknesses, are shown in FIG. 17. Visually, there is a very good match between measurements and predictions for both shapes and amplitudes. This gives confidence in the modeling process and validates the design optimization work. Based on these results, the expected performance in terms of correction of focus, astigmatism, and coma for this mirror were obtained; these performances are shown in FIG. 18. Correction is defined as $1-1/c_i$, with $c_i$ defined according to Eq. (6). The figure shows plots of the RMS residual error for each of the three aberrations. The linear part of each plot corresponds to the unsaturated response of the mirror, with correctability correction in excess of 99.7% for focus, 98% for coma, and 96% for astigmatism. The nonlinear part of each plot indicates the performance achievable for error amplitudes beyond the saturation limit. One or more embodiments of the present invention are targeted toward primary segmented mirrors. In this case, the mirror segments would all be made initially spherical and the actuators would be used to deform the initially spherical mirrors into an off-axis parabola. For this application, the correction of focus, astigmatism, and coma is the key to achieving an accurate off-axis shape, and hence the shape correction considered above is particularly relevant.

In connection with this type of application, it should also be noted that the 41-actuator pattern has already been adapted to hexagonal mirrors [16].

6. Advantages and Improvements of the Novel Actuator Design According to One or More Embodiments of the Invention One or more embodiments of the invention disclose a novel actuator design and selection scheme for surface-parallel actuators for ultrathin mirrors, further developing the concept first proposed in Ref. [11]. In one or more embodiments, the actuation scheme consists of a pattern of electrodes printed on a continuous layer of piezoelectric material, with small separation gaps to avoid electrical shorts. Instead of arranging the electrodes according to a simple geometric pattern, as in previous mirror designs, a set of novel shape-optimized patterns has been proposed. Each pattern fully covers, apart from the small separation gaps, the piezoelectric layer, and thus maximizes the amount of active material that is available for actuation. The proposed patterns maximize a weighted average of correctability and stroke of the mirror for a chosen number of independent actuators and for a dominant imperfection mode. The basis for the proposed approach was the observation that the correction of a figure error that has at least two planes of mirror symmetry, and hence has azimuthal order $m \geq 2$, is optimally done with twin actuators that have the same optimized (near-elliptical, for the correction of astigmatism errors) shape but are rotated through $\pi/m$. Applying a positive voltage to the first actuator and a negative voltage to the second one has the effect of removing the axisymmetric component of the correction while also doubling the magnitude of the nonaxisymmetric component.

The basic shape of this set of twin actuators was obtained from the numerical optimization of an objective function that includes a weighted average of the correctability of the mirror, defined as the ratio between the RMS wavefront error before and after correction, and the stroke, defined as the maximum error amplitude that can be corrected without saturating any actuators. For any design of the actuators, a finite element analysis was carried out to evaluate the objective function. The basic actuator system defined in this way was made more versatile, i.e., able to correct wavefront error modes that are different from the modes for which the basic shape had been obtained, by independently controlling the voltage in each actuation zone, defined by the intersection of the basic actuator shapes. Further improvements, particularly in the correctability of higher-order Zernike components of the error, were achieved by subdividing the central actuation zone into further sets of similarly defined twin-actuator systems.

It has also been shown that reducing the pupil diameter, which can be achieved with a mask or by not coating the edge of the mirror, would improve the correctability, although the scope for doing this in a segmented primary mirror is limited by the appearance of a diffraction pattern and the loss of mirror surface area. With the proposed approach, several theoretical actuator patterns that can efficiently correct for third-order astigmatism have been designed. Practically feasible modifications of these patterns have then been obtained by imposing a 1 mm constraint on the edge-to-edge distance of neighboring electrodes and a 2 mm wide, clear annulus around the edge. Six actuator patterns with 121, 89, 65, 57, 49, and 41 independent actuators have been obtained. The 41-actuator pattern was built and tested, successfully demonstrating the whole process for mirrors with glass substrate and piezopolymer actuators. Of course, the approach presented is applicable to any type of surface-parallel actuated mirrors and to any combination of active and passive materials, as already demonstrated in a carbon-fiber substrate mirror with piezoceramic actuation layer [16]. The excellent performance of the proposed actuator design method for figure errors dominated by astigmatism makes it well-suited for ultra-thin mirrors. A comparison of the correctability of the 41-actuator based on the present approach, against classically designed actuator patterns including 90-actuator lattice and honeycomb designs, as well as a 41-actuator keystone design, has shown that, in addition to providing superior performance for astigmatism correction, the present approach provides higher or equally higher correctability for 14 out of 25 Zernike modes.

II. Design, Fabrication, and Testing of Active Carbon Shell Mirrors

1. Introduction

One or more embodiments of the invention disclose a novel method of constructing lightweight, highly active mirrors using simple, low-cost and scalable manufacturing processes. Mirrors of this design integrate passive and active materials in order to create an active laminate structure. Replication techniques along with subsequent bonding processes are implemented, eliminating the need for any grinding/polishing steps. These mirrors have the potential to be used as segments of a primary aperture for the next-generation large-aperture space telescopes such as the Advanced Technology Large-Aperture Space Telescope or the concept envisioned by the Large Space Aperture study sponsored by the Keck Institute for Space Studies. Lightweight mirrors have been identified as a necessity for the realization of both of these concepts. Alternatively, this technology could also be used as a cost-effective solution for the emerging class of Earth-observing imagers based on small-scale platforms.

2. Carbon Shell Mirror (CSM)

Figure 19:
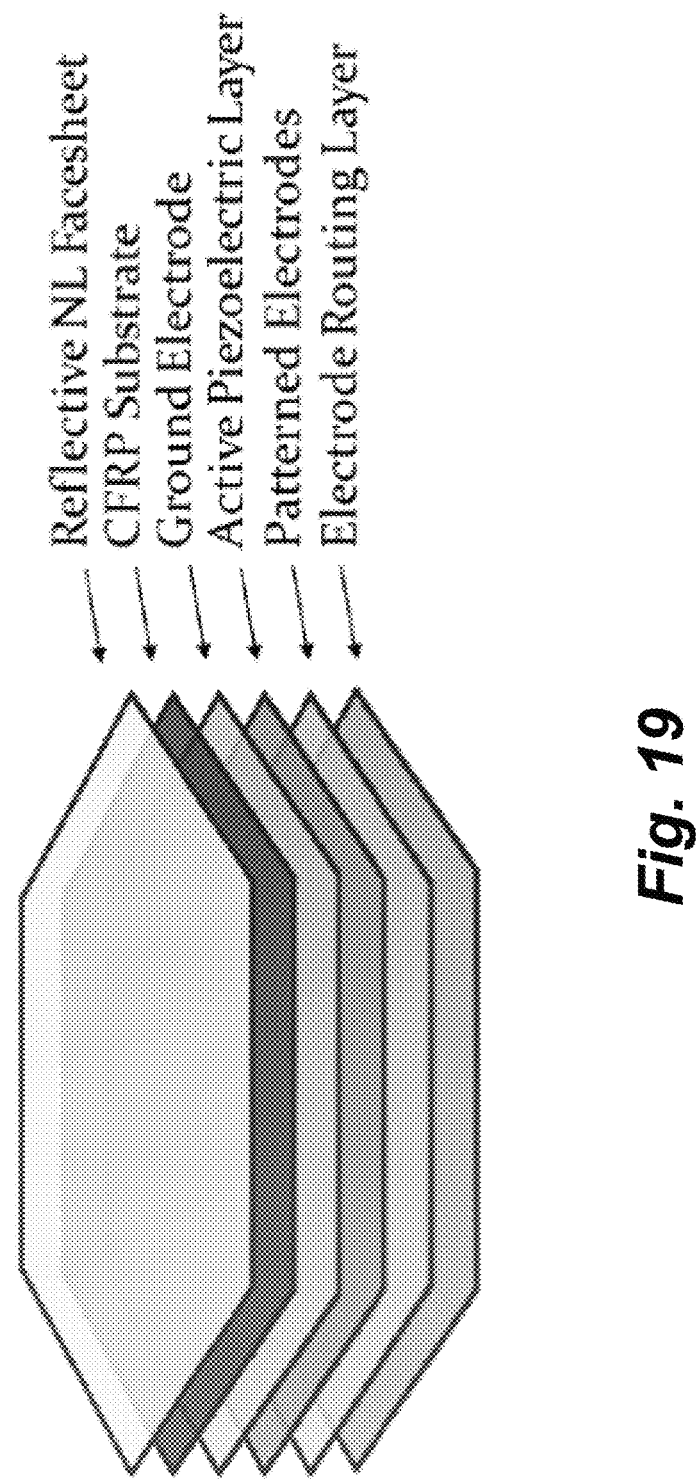
FIG. 19. Exploded diagram of the CSM displaying the various layers.

FIG. 19 is an exploded view of the various layers within the CSM according to one or more embodiments. The overall structure of the mirror is provided by a thin carbon fiber reinforced polymer (CFRP) substrate. A high-quality nanolaminate (NL) face-sheet is then bonded to the front of the substrate in order to provide the reflective mirror surface. On the backside, a layer of active material is bonded providing a surface-parallel actuation scheme. A common ground, as well as custom patterned electrodes are incorporated on either side of the active material providing spatial control over the imposed actuation. Finally, a thin printed electrode routing layer is bonded to the back of the active material in order to access each actuator. Such a scheme allows the CSM to be constructed extremely thin and thus, highly flexible.

2.1 CFRP Substrate

The mirror substrate is a composite shell made from ultra-thin plies of pre-impregnated carbon fibers and epoxy resin. Each ply of the laminate is only 30 μm thick allowing quasi-isotropic laminates to be constructed while keeping the overall thickness to a minimum. For the current effort, two laminates have been considered consisting of either 8 or 16 plies. The laminate orientation is defined as $[0°/45°/-45°/90°]_{ns}$ where n=1 for 8 plies and n=2 for 16 plies ([ ]s denotes a symmetric laminate). These CFRP shells have a total thickness of 240 µm and 480 µm with an areal density of 0.45 kg/m² and 0.90 kg/m² for the 8- and 16-ply designs respectively.

Figure 20:
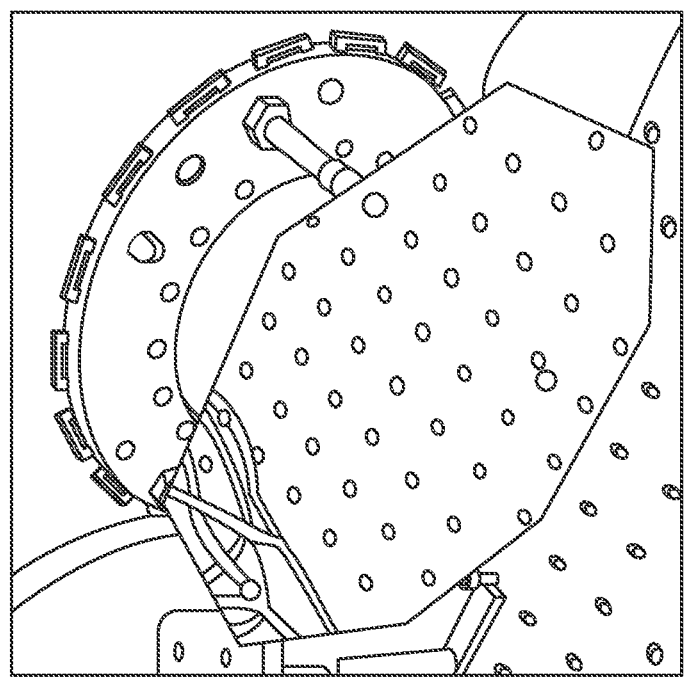
FIG. 20. A cured CFRP substrate mounted for testing displaying smooth front surface and desired mirror figure.
Figure 21:
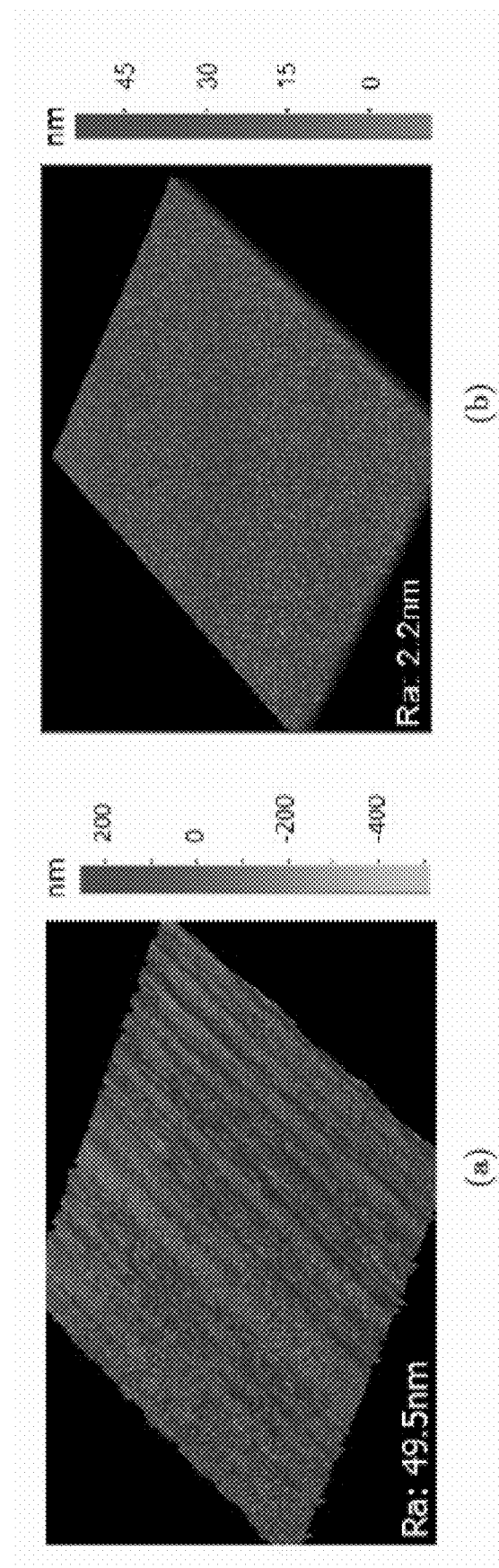
FIG. 21. White light scanning interferometer (Veeco Wyko) measurements of (a) a bare CFRP substrate showing evidence of fiber print through (Ra: 49.5 nm) and (b) a CSM with integrated nanolaminate facesheet showing complete elimination of fiber print-through (Ra: 2.2 nm).

FIG. 20 is an example of a bare CFRP substrate. It can be seen that the as-manufactured front surface of the shell appears to be relatively smooth. However, due to thermal contraction of the epoxy during curing, the underlying unidirectional fibers essentially protrude through the top-surface of the laminate. This effect is known as fiber print-through and is common with replicated composite optics. FIG. 21(a) is a White Light Scanning Interferometer measurement displaying this effect. It can be seen that there is significant roughness oriented perpendicular to the fiber direction.

2.2 Reflective Layer

In order to obtain an optical-quality front surface, a reflective nanolaminate facesheet is bonded to the carbon substrate. Nanolaminates are multilayer metal foils formed by sputter deposition on a precision glass mandrel. The overall thickness of the nanolaminate can be tuned by varying the number of layers within the structure. Process alterations have been made in order to ensure that the nanolaminates contain an extremely low amount of internal stress. The incorporation of the nanolaminate completely eliminates the presence of fiber print-through as shown in FIG. 21(b).

2.3 Active Layer

In order to provide the surface-parallel actuation scheme, a layer of piezoelectric material is incorporated onto the backside of the CFRP substrate. The "d31" piezoelectric coupling coefficient is utilized by applying an electric field through the thickness of the material resulting in a proportional in-plane strain. As the material is bonded to the CFRP substrate, this in turn produces an out-of-plane curvature change of the mirror.

TABLE 1

Material Properties for PZT-5A.[17]

| Property | Value |
|---|---|
| Modulus, E (GPa) | 66.0 |
| Poisson's Ratio, ν | 0.35 |
| Piezoelectric Constant*, d31 (pC/N) | −250 |
| Maximum Electric Field*, $E_{max}$ (MV/m) | 0.8 |
| Minimum Available Thickness (µm) | 125 |

*Measured value

Several candidate materials have been explored as options for the active layer. However, due to its high actuation capabilities thin plates of Navy Type II Lead Zirconate Titanate (PZT-5A) have been implemented for the current efforts. Table 1 is a summary of the properties for the current material.

Figure 22:
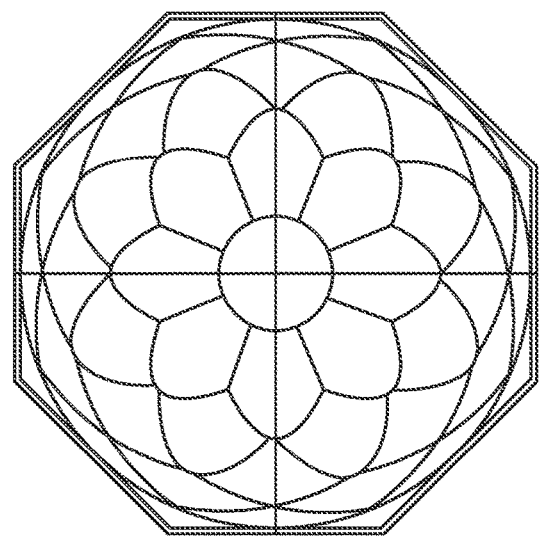
FIG. 22. Backside of 150 mm dia. CSM prototype containing four PZT-5A plates with a custom electrode pattern designed to correct for astigmatism-based errors.

A continuous ground plane and patterned electrodes are printed on the top and bottom surfaces of the piezoelectric layer using silver nano-particle ink and a Dimatix 2800 Materials Printer [48]. This high voltages to be applied to the various in-plane locations on the mirror. The pattern, shown in FIG. 22, is a custom design optimized to correct for specific modes of figure error associated with the CSM. A description of this process can be found in previous section (Optimized actuators).

2.4 Electrode Routing Layer

Figure 23:
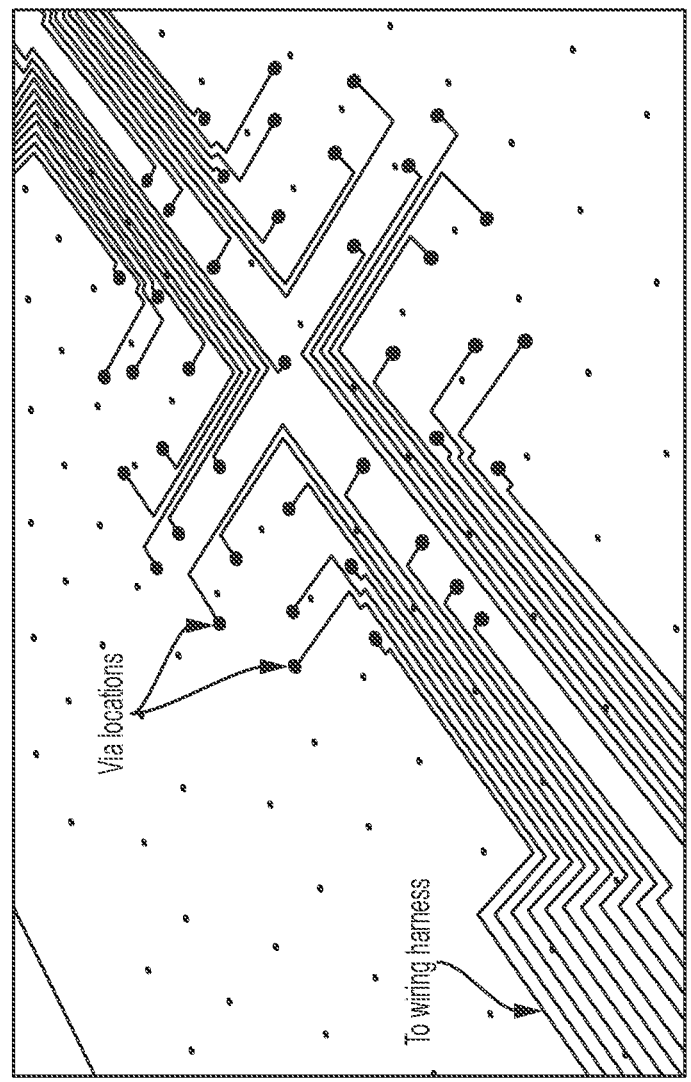
FIG. 23. 25 μm thick Kapton routing layer with printed electrode traces.

Due to the relatively large number of actuation channels, active mirrors often contain cluttered, bulky connecting wires that can impart shape errors onto the mirror surface. In order to alleviate this problem for the CSMs, conductive electrode traces are printed on a thin Kapton routing layer as shown in FIG. 23.

Connections to the underlying electrode pads are then made using through-thickness vias and conductive epoxy. The pattern is designed to route the traces away from the active surface of the mirror to a ex-cable connector where connections to the control electronics can be made using more standard wiring techniques.

The low modulus and thickness of the Kapton layer allows the CSM to remain highly flexible during actuation.

3. Active Layer Design

Since, in one or more embodiments, the CSMs are extremely thin structures, the relative thickness of each layer has a significant section the overall mechanical behavior. The thickness of the active layer is of particular importance as small changes in this value can have a large impact on the mirror's actuation capabilities. If the active layer is too thick it will dominate the flexural stiffness of the mirror, while if it is too thin there will not be enough actuation authority in order to correct for the expected deformations. In order to determine the optimal thickness of the active layer a linear analysis based on Classical Lamination Theory (CLT) was performed.

The procedure is as follows.

Figure 24:
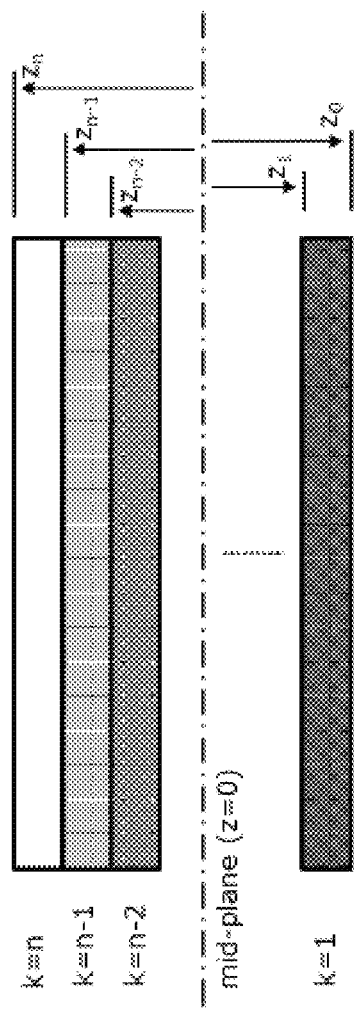
FIG. 24. Through-thickness coordinate definition for the Classical Lamination Theory analysis.

Given a laminate constructed from n separate layers, the overall stiffness matrix can be determined relating mid-plane strains and out-of-plane curvatures, $\epsilon$ and $\kappa$, to resultant forces and moments, N and M, respectively, as follows:

$$\begin{bmatrix} N \\ M \end{bmatrix} = \begin{bmatrix} A & B \\ B & D \end{bmatrix} \begin{bmatrix} \epsilon \\ \kappa \end{bmatrix}$$

$$A = \sum_{k=1}^{n} (Q_{ij})_k (z_k - z_{k-1}),$$

$$B = \frac{1}{2} \sum_{k=1}^{n} (Q_{ij})_k (z_k^2 - z_{k-1}^2),$$

$$D = \frac{1}{3} \sum_{k=1}^{n} (Q_{ij})_k (z_k^3 - z_{k-1}^3)$$

where where $z_k$ is the through-thickness coordinate of the $k^{th}$ interface and $(Q_{ij})_k$ is the orthotropic stiffness matrix of the $k^{th}$ material as shown in FIG. 24. However, for this study the inverse problem is of interest: given a set of resultant forces and moments produced by the active nature of the piezoelectric material, what are the resulting mid-plane strains, and more importantly out-of-plane curvatures of the structure? This is given as:

$$\begin{bmatrix} \epsilon \\ \kappa \end{bmatrix} = \begin{bmatrix} A & B \\ B & D \end{bmatrix}^{+} \begin{bmatrix} N_{piezo} \\ M_{piezo} \end{bmatrix}$$

where:

$$N_{piezo} = \int_{z_{act,bot}}^{z_{act,top}} Q_{act} d_{act} E z \, dz$$

$$M_{piezo} = \int_{z_{act,bot}}^{z_{act,top}} Q_{act} d_{act} E z \, dz$$

where + denotes the pseudo matrix inverse, $d_{act}$ is an array of the piezoelectric constants for the active material, $z_{act,top}$ and $z_{act,bot}$ are the top and bottom coordinates of the active material and E is the applied through-thickness electric field.

TABLE 2

CSM Laminate Design

| Layer | Material | Thickness (μm) |
|---|---|---|
| 1 | Nanolaminate | 50.0 |
| 2 | CFRP | 240.0 (8-ply) |
|   |      | 480.0 (16-ply) |
| 3 | PZT-5A | Variable |
| 4 | Kapton | 25.0 |

Figure 25:
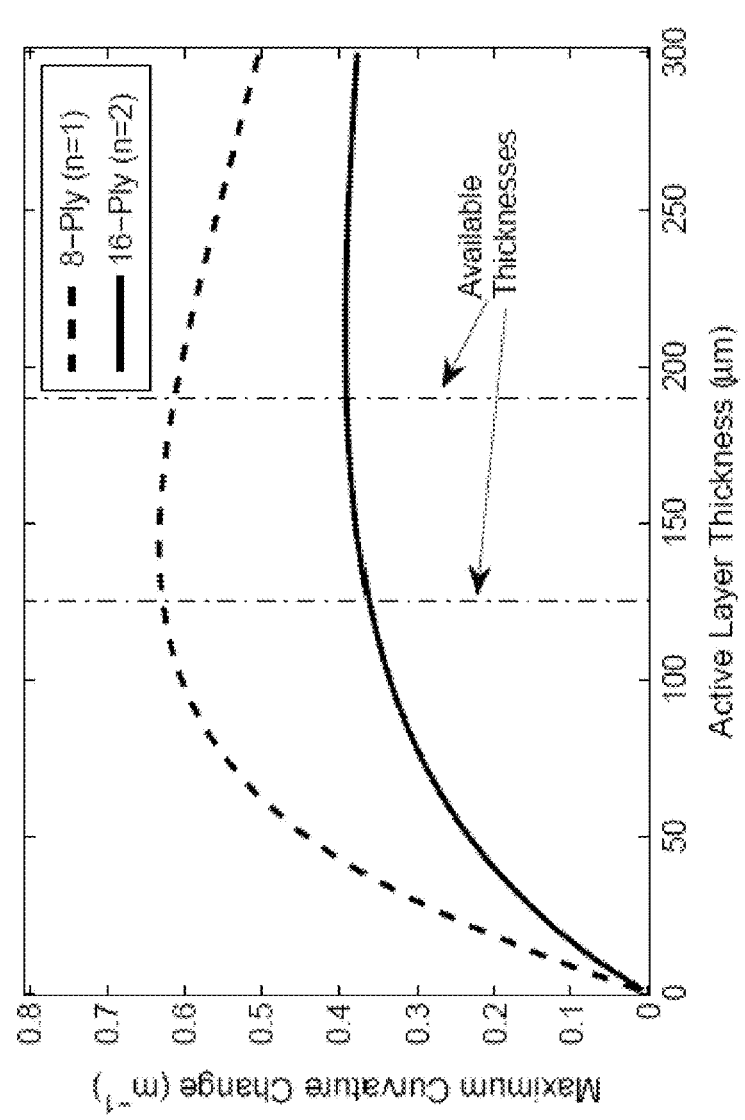
FIG. 25. Maximum curvature change due to actuation as a function of active layer thickness.

Using the formulation above, the maximum curvature change of an 8-ply and 16-ply laminate was calculated as function of the active layer thickness. Table 2 outlines the various layers within the two designs. The thickness of the nanolaminate and Kapton routing layer are set to 50 μm and 25 μm respectively as these are the current values used in a practical setting. FIG. 25 displays the results of this process. The first thing to note is that the maximum curvature change is significantly larger for the thinner 8-ply laminate. This is as expected as the flexural stiffness of the 16-ply CFRP substrate is much higher, thus providing more resistance to deformation. Next, it is evident that for both substrates and small active layer thicknesses there is approximately a linear increase in actuation capabilities with the active layer thickness. The rate of this increase starts to diminish rapidly for active layer thicknesses over approximately 40 μm. For the 8-ply substrate, an optimal active layer thickness of 150 μm is determined to maximize the actuation capabilities of the mirror. For the 16-ply substrate this point is shifted further to the right, having an optimal value of 240 μm. However it can be seen that very minimal gains are realized after a certain point (~150 μm).

As the PZT material is the most dense component in the CSM, there is a trade between obtaining slightly higher actuation capabilities while significantly increasing the overall mass of the mirror. Taking into account practical constraints on the available thicknesses, active layer thicknesses of 125 μm and 190 μm are chosen for the 8-ply and 16-ply designs, respectively.

4. Simulation of Correction Capabilities

In order to make predictions on the correction capabilities of various designs, the CSM was modeled using Abaqus CAE/Standard 6.12. FIG. 26 displays the modeled actuation pattern as well as the influence functions associated with the unique electrode positions. It is apparent that the CSM design has significant actuation capabilities as each influence function has a full-scale peak-to-valley deformation range of 45-100 μm.

Figure 27:
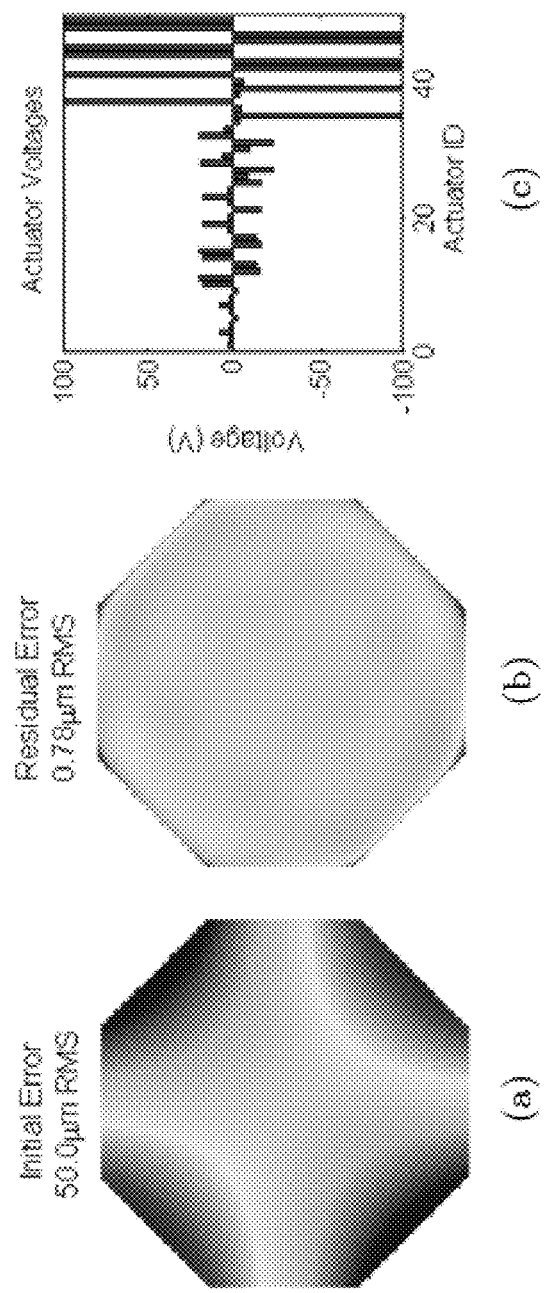
FIG. 27. Simulation results for a 16-ply CSM model showing: (a) the 50 μm RMS of initial astigmatic error, (b) the residual error of 0.78 μm RMS after correction (considered over 95% of the pupil), and (c) the corresponding actuator voltages required for correction.

Using the calculated influence functions a variety of performance simulations can be conducted. A constrained least-squares algorithm taking into account voltage limitations of the piezoelectric material is used in order to determine the necessary voltage map required for correction (see earlier section on Optimized actuators for more details on this process). FIG. 27 displays the result of one such case where the active elements are used to correct a 16-ply mirror with 50 μm of initial astigmatism-based error. It can be seen that with this magnitude of initial error 0.78 μm of residual error is present after correction (considering 95% of the overall aperture).

It can also be seen that 12 of the 49 actuators are saturated at their maximum voltage values, while others are operating at much lower values. The saturated actuators are those located around the perimeter of the mirror as these have the greatest influence when performing astigmatism correction. This is also where the majority of residual error is present.

Figure 28:
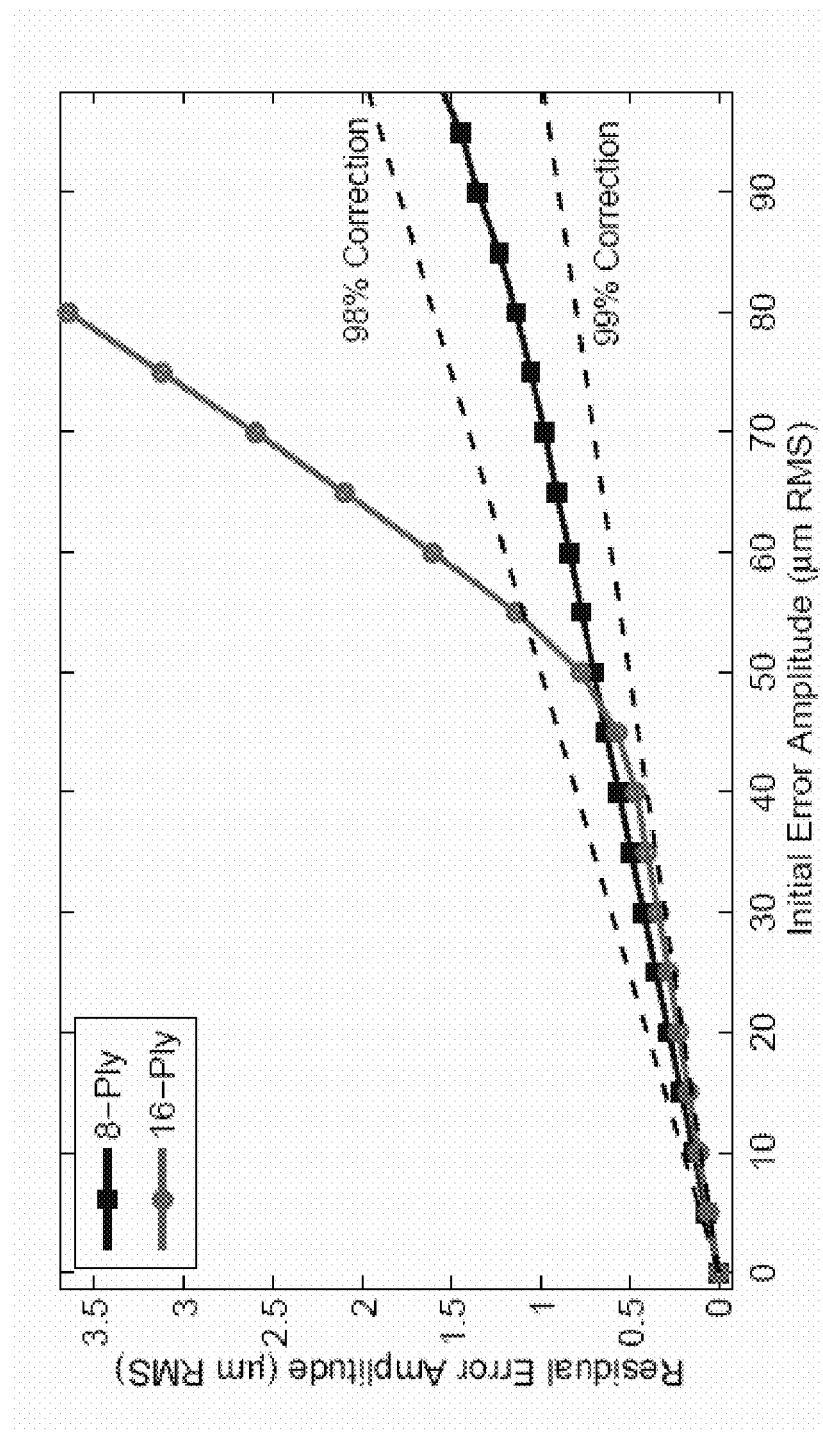
FIG. 28. Comparison of the correction capabilities for a CSM constructed from 8 and 16 plies.

FIG. 28 is a more comprehensive study detailing the performance of an 8-ply and 16-ply CSM by observing the magnitude of residual error after correction as a function of initial astigmatic error. Several observations can be made from this figure. The first is that for small initial errors (<45 μm RMS), both the 8-ply and 16-ply designs have correction factors of approximately 99%, demonstrating significant correctability.

It can also be seen that the 16-ply mirror slightly outperforms the 8-ply design over this range of initial errors. This is due to the fact that the influence functions of the stiffer 16-ply mirror have a slightly larger global component to them in comparison to the 8-ply design. This essentially acts as an inherent low-pass spatial filter, thus reducing the magnitude of residual error. The next observation is related to the effect of actuator saturation. For the 16-ply mirror, as the magnitude of initial error is increased beyond 45 μm, the magnitude of residual error starts to increase drastically. This is due to the fact that several of the actuators have reached their voltage limit and can no longer support any further corrections. Since the 8-ply mirror is more compliant, and thus the influence functions have a higher full-scale deformation value, this effect is delayed and the mirror can correct for larger initial errors without saturation.

5. Prototype Fabrication

Figure 29:
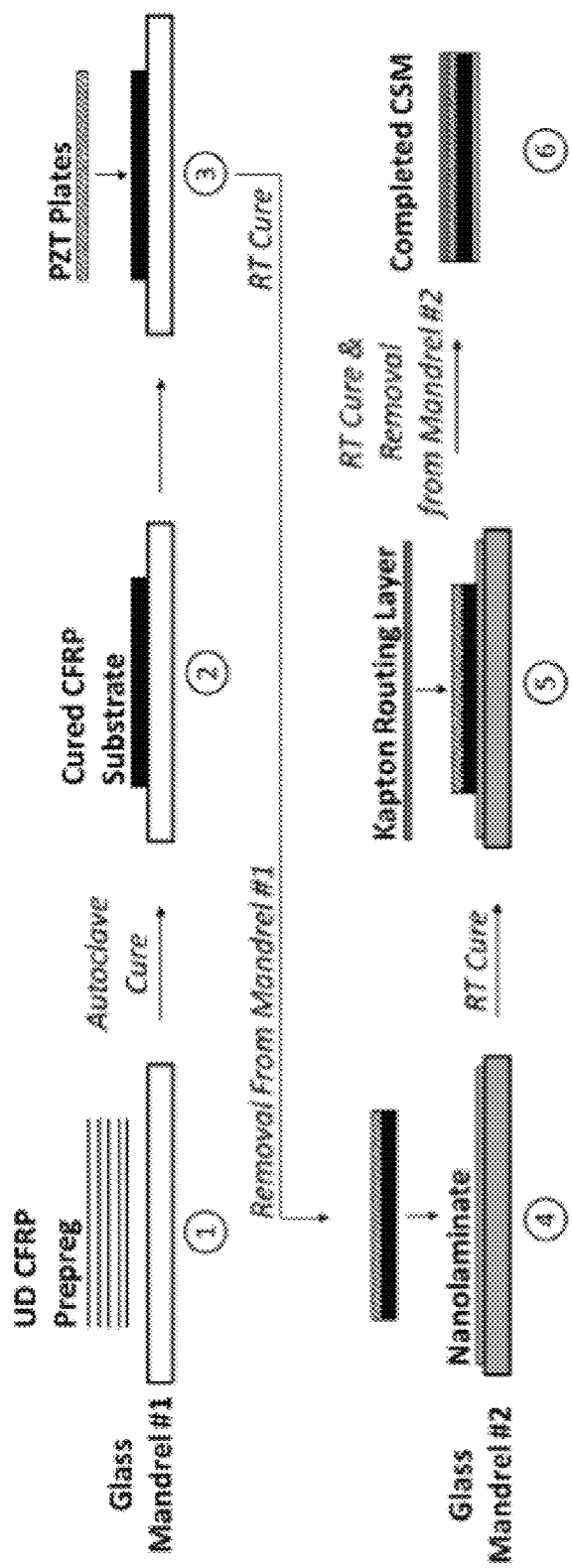
FIG. 29. Fabrication schematic for the CSM prototypes.
Figure 30:
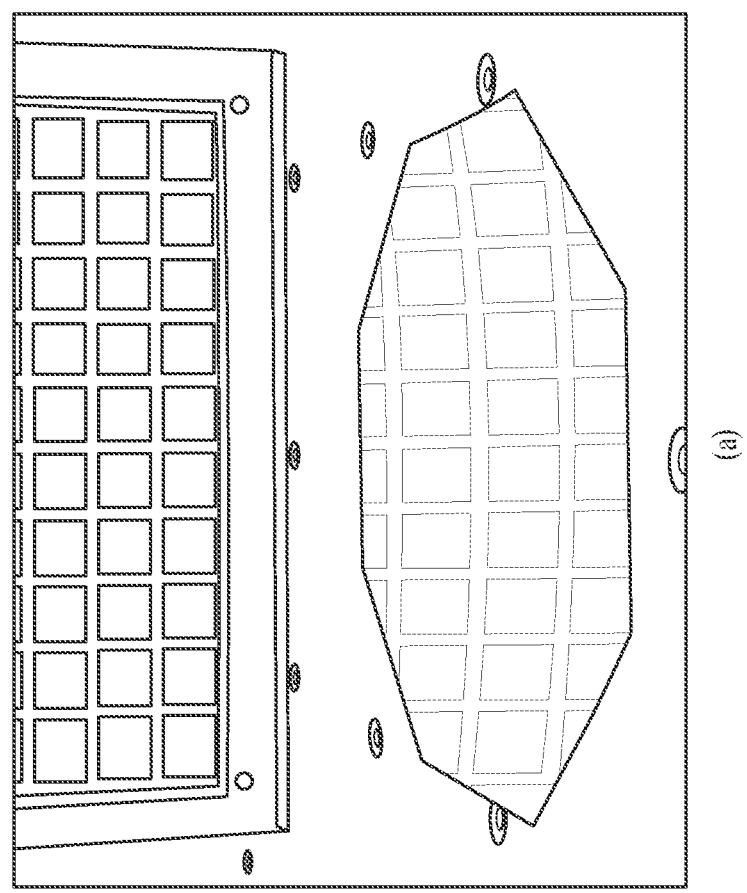
FIG. 30. A completed CSM prototype displaying (a) the reflective front surface obtained through the nanolaminate integration and (b) the electrode pattern and Kapton routing layer.
Figure 30:
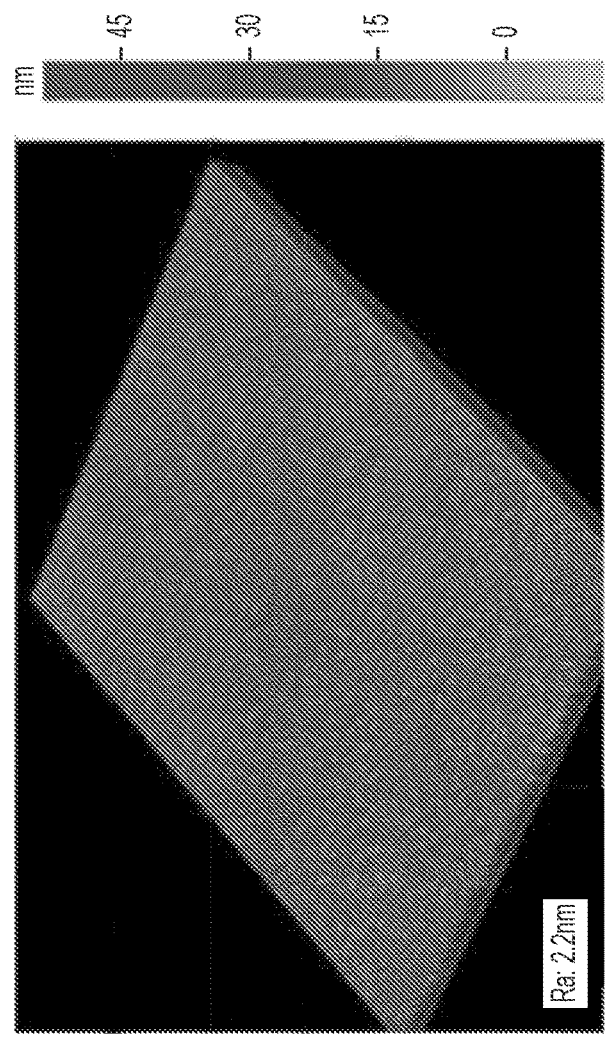

FIG. 29 is a schematic of the current fabrication process for the CSM prototypes. First, a lay-up of unidirectional carbon fiber prepreg is placed on top of a polished glass mandrel (Step 1). The laminate is vacuum bagged and autoclave cured at elevated temperature and pressure to provide consolidation of the plies. During this process the CFRP laminate replicates the surface of the underlying mandrel providing the overall figure of the mirror. Care must be taken during the lamination and curing process as slight deviations from a symmetric lay-up will cause significant figure errors. Next, the PZT plates are bonded to the backside of the CFRP substrate with the mandrel underneath to provide support (Step 2). A common ground plane and patterned electrodes are printed onto either side of the plate before the bonding process takes place. A low viscosity, room-temperature cure epoxy is used for this bonding process in order to ensure even epoxy flow out and to avoid thermal distortions. Once cured, the assembly is removed from the underlying mandrel and bonded to a nanolaminate facesheet (Step 3). This nanolaminate has been deposited on a mandrel with the same figure as that used for the CFRP replication process, producing a matching part. Care must be taken in order to ensure a uniform thickness distribution of epoxy between the CFRP substrate and the nanolaminate during this bonding process. The Kapton electrode routing layer is then incorporated onto the backside of the mirror using conductive epoxy (Step 5) and lastly, the completed CSM is then parted from the secondary mandrel and trimmed to size (Step 6).

6. Metrology and Testing

Figure 31:
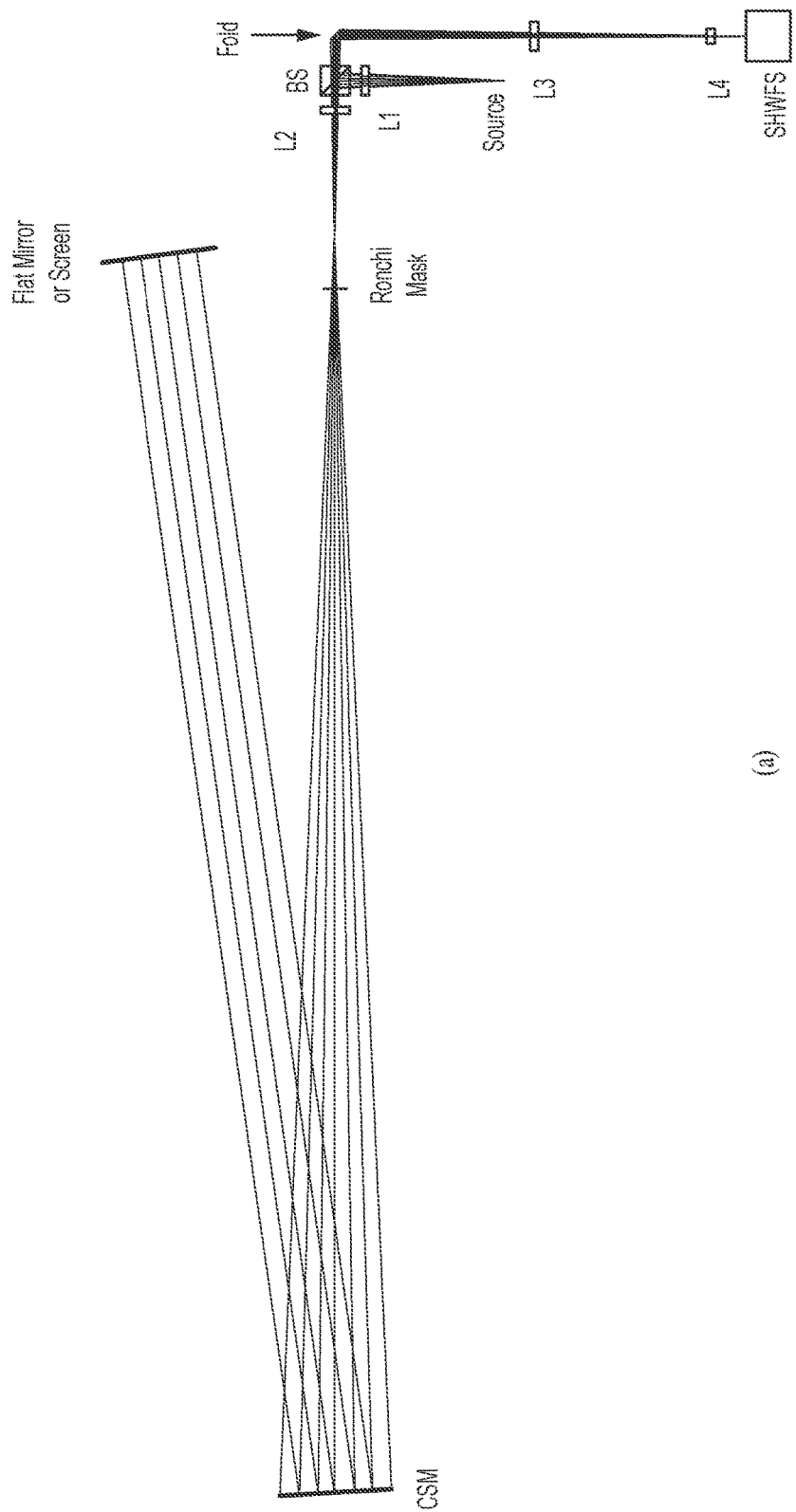
FIG. 31 (a) Schematic of custom metrology setup incorporating the Projected Hartmann test for coarse measurements as well as the classic Shack-Hartmann test to be used for fine corrections. (b) Lab implementation accommodating a 175 mm dia. CSM prototype FIG. 32. (a) Projected Hartmann measurement of a CSM prototype showing spot deviations from a regular grid. The dominating astigmatic error can be seen in the pattern of the spot displacements. (b) Sample influence functions from an initial CSM prototype measured using the Projected Hartmann setup.
Figure 31:
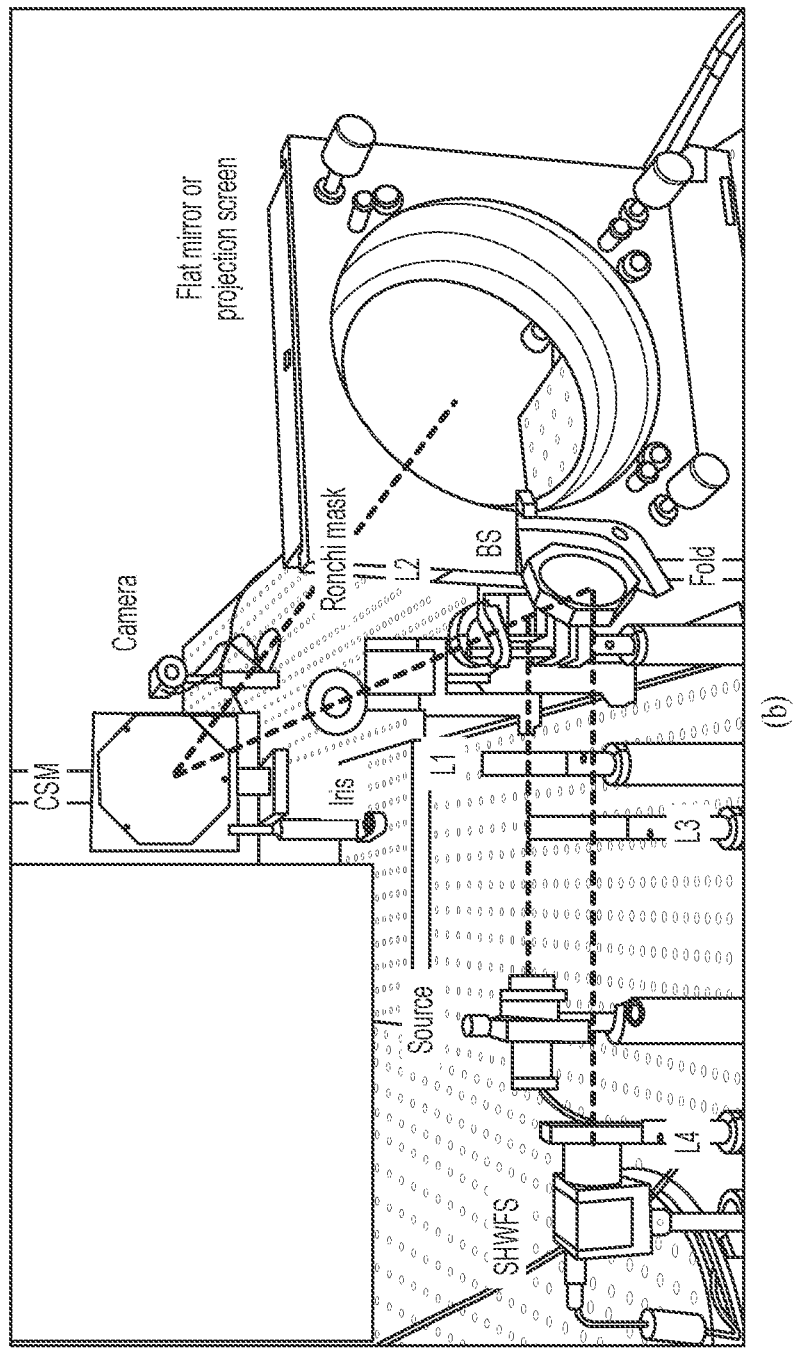

It has been shown that the CSMs can potentially exhibit large actuation capabilities and can correct its figure down to small residual errors. However, the relatively large shape errors present after manufacturing make it difficult to perform measurements of the initial surface using standard techniques. Therefore, a custom two-stage metrology system with a high-dynamic range was developed. FIG. 31 is a schematic of the metrology system as well as a picture of the actual lab implementation. The first stage of the system is a variant on a Projected Hartmann test23 where the CSM is illuminated by a regular grid pattern produced by a Ronchi mask. This pattern is reflected off of the CSM and onto a flat screen, where it is imaged using an external camera. The reflected pattern of the sub apertures on this screen is then compared to a regular grid in order to determine the local slope errors associated with the CSM. As this method does not require the CSM to form an image, large magnitudes of slope errors can be accommodated. FIG. 32(a) displays a grid-displacement measurement of a highly-aberrated mirror using the Projected Hartmann setup. The dominating astigmatic error is evident in the pattern of the spot displacements relative to the nominal grid.

The influence functions of the CSM can also be measured with this system. FIG. 32(b) is a plot of the influence functions for a preliminary CSM prototype. Using this information, a coarse correction of the mirror can be performed in order to reduce the magnitude of the initial figure error.

Once this has been performed and the figure error has been reduced sufficiently, the second stage of the metrology system can be implemented while keeping the voltage map required to perform the initial correction held constant. At this point, the Ronchi mask is removed from the optical path. In addition to this, the projection screen is removed revealing a at reference mirror in its place. This mirror relays the incoming light back of the CSM and into a Shack-Hartmann Wavefront Sensor where a more classical measurement procedure can be performed. The influence functions are then remeasured with this setup where they are now defined as deviations from the initial voltage map. This now allows for fine corrections to be performed.

7. Advantages and Improvements of the Shell Mirrors According to One or More Embodiments A novel method of constructing ultra-lightweight active shell mirrors has been presented. These mirrors are laminates of active and passive materials providing the intended mirror figure, reflective front-surface, actuation capabilities, and electrode wiring. In one or more embodiments, they are extremely thin, ranging from 500-850 μm in total thickness with an areal density of 1.5-2.7 kg/m$^2$—drastically thinner and lighter than current mirror technology.

A method to size the active layer thickness in order to maximize the actuation capabilities of two CSM designs was presented. With the desire to also minimize the overall mass of the structure and taking into account practical limitations, values of 125 μm and 190 μm were chosen as optimal active layer thicknesses for the 8-ply and 16-ply designs. The corrective capability of these two designs with 49 actuator channels was also modeled. It was shown that the 8-ply design had significantly more actuation stroke than the 16-ply design, however both displayed correction factors approaching 99% before actuator saturation. Therefore, the CSMs can potentially accommodate relatively large shape errors originating from initial manufacturing errors or thermal deformations. Fabrication methods have been developed in order to construct CSM prototypes. They display good surface quality (2 nm Ra surface roughness) and large actuation capabilities (150 μm PV influence functions). A custom, two-stage metrology system has also been developed in order to perform both coarse and fine shape corrections of the mirror.

Current efforts are focused on the construction of a fully-integrated 16-ply CSM with a post-correction figure error of <1.0 μm RMS. Several other efforts are underway in order to reduce the magnitude of the initial shape error, further reduce the overall thickness of the designs and increase the correction capabilities.

III. Process Steps

Error Mode Correction

Figure 33:
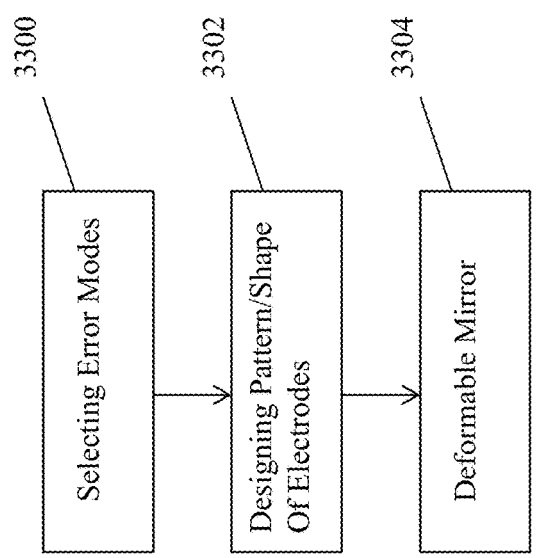
FIG. 33 illustrates method of correcting error modes of a deformable mirror and/or a process for generating optimized actuator patterns.

FIG. 33 illustrates a method of correcting error modes of a deformable mirror.

Block 3300 represents selecting or targeting one or more target error modes of a deformable mirror (e.g., depending on the application or error modes that the application or instrument is sensitive to). The target error modes can be expressed as a sum of Zernike modes each having an amplitude, and the target error modes can be selected based on the amplitude of the Zernike mode and/or by selecting the more dominant error modes. The method can correct for dominant abberation modes, for example.

Block 3302 represents designing a pattern and/or shape of one or more electrodes, wherein the pattern and/or shape of the electrodes are designed to optimally correct the target error modes when the electrodes are disposed on the deformable mirror via an active material, and the active material deforms the deformable mirror in response to one or more biases applied to the electrodes. The pattern and shape of the electrodes can be designed by simulating the effect of varying the shape and pattern on correcting the target error modes and selecting the best shape and best pattern to correct the one or more target error modes.

The simulating can include parameterizing the shape of the electrodes (e.g., r, θ). The shape can comprise an ellipse, the method can comprise changing the ellipticity, ratio of the semiaxes, introducing an irregularity in the shape, varying the perimeter of the shape.

The step can further comprise selecting a desired correctability and/or desired stroke for the deformable mirror, and designing the pattern and shape and that achieves the desired correctability and/or desired stroke, wherein the correctability and/or stroke are calculated by expressing the target error modes with Zernike polynomials.

The pattern of electrodes can comprise one or more pairs of intersecting electrodes that can be nested across the surface of the deformable mirror.

Block 3304 represents the end result, a deformable mirror, comprising one or more electrodes disposed on the deformable mirror via an active material, wherein a pattern and/or shape of the electrodes are designed to optimally correct target error modes when the active material deforms the deformable mirror in response to one or more biases applied to the electrodes.

The deformable mirror can comprise an actuation structure attached to a reflective layer, the actuation structure including a common electrode; patterned electrodes arranged across a surface of the reflective layer to increase correctability and/or stroke of the reflective layer, for a chosen number of the patterned electrodes and for a specific wavefront error of the reflective layer; and one or more active layers (e.g., PZT, piezoelectric or electrorestrictive) between the common electrode and the patterned electrodes, the active layers changing shape in response to one or more electric fields applied between the patterned electrodes and the common electrode, thereby changing a shape of the reflective layer to increase the correctability and/or the stroke; wherein the correctability is defined as a ratio between a root mean square amplitude of the wavefront error before and after correction by the actuation structure, and the stroke is defined as the maximum amplitude of the wavefront error (e.g., described by a Zernike polynomial) that can be corrected without saturating the actuation structure.

The patterned electrodes can comprise one or more pairs of intersecting electrodes rotated with respect to one another.

The patterned electrodes can intersect such that an arbitrarily fine actuation pattern is generated.

The pairs of intersecting electrodes can be nested across the surface of the reflective layer.

For example, the correctability can be higher than 30 for the first 20 Zernike polynomials describing the wavefront error for the reflective layer having a pupil diameter of at least 90 mm.

For example, the patterned electrodes can be arranged to correct third order astigmatism, e.g., wherein the third order astigmatism is corrected with the correctability of at least 10 and the stroke of at least 3 micrometers.

The actuator structure can be a surface parallel actuator for the reflective layer.

Deformable Structure Fabrication

Figure 34:
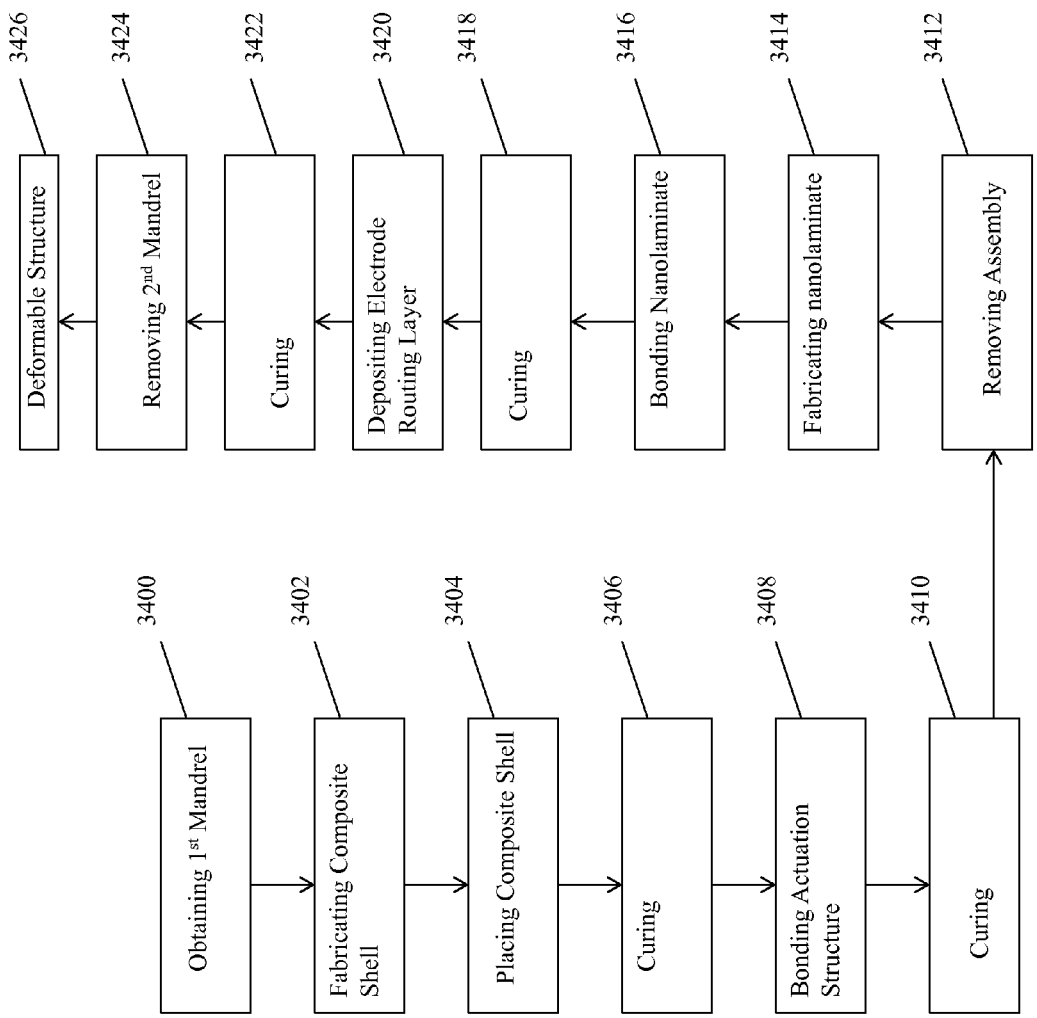
FIG. 34 illustrates a method for fabricating a deformable structure.

FIG. 34 illustrates a method of fabricating a deformable structure.

Block 3400 represents obtaining a first mandrel (e.g., aluminum, aluminum block), wherein the first mandrel has a first surface that is designed to shape the deformable structure according to a design.

The mandrel can comprise a surface, wherein a composite shell placed and cured on the surface of the mandrel conforms to a shape of the surface. The mandrel can be a deformable mandrel and the surface of the mandrel can be deformed to refine a shape of the surface prior to placing the composite shell on the surface. The deformation of the surface of the mandrel can correct the deformity in the composite shell caused by the curing and removing of the composite shell from the mandrel. The mandrel can be deformed using a set of screws, e.g., as illustrated in FIG. 35.

Figure 35:
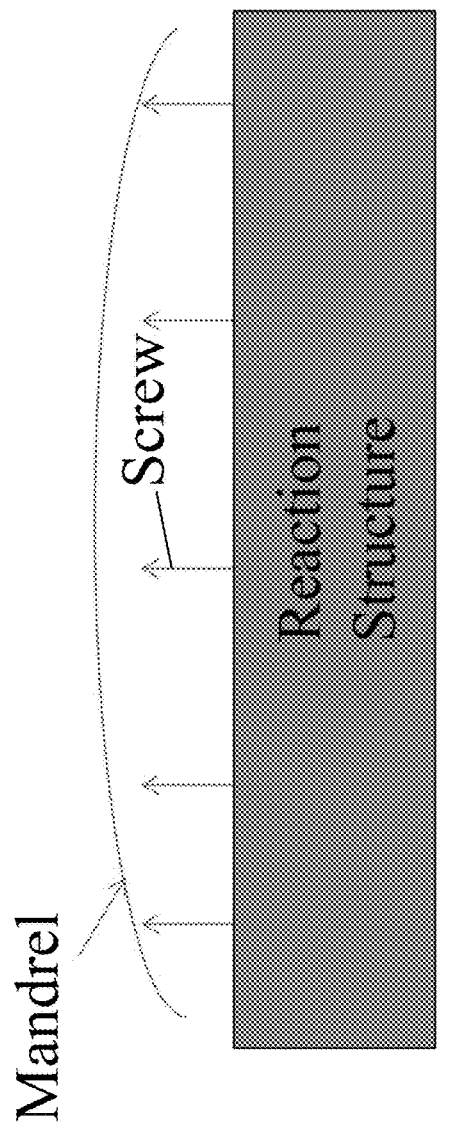
FIG. 35 illustrates a deformable mandrel.

FIG. 35 illustrates the mandrel comprises a polished, deformable Al shell precisely machined to match the obverse of the desired mirror figure, supported by mechanical means upon a reaction structure. Screw adjusters between the shell and the reaction structure allow fine adjustment of the mandrel figure. Procedure is to make a shell without biasing the figure; measure the cured shell; adjust the screws to bias the shell to compensate the measured changes that occur during the cure; make a new shell. This has reduced figure error by 2×.

Thus, Block 3400 and FIG. 35 illustrates a composite shell forming mandrel for shaping a deformable structure, the mandrel comprising a surface, wherein a composite shell placed and cured on the surface of the mandrel conforms to a shape of the surface, and a deformity in the composite shell caused by curing and removing of the composite shell from the mandrel can be corrected using an actuator structure attached to the composite shell.

Block 3402 represents fabricating or obtaining a composite shell, the composite shell including a plurality of plies each including carbon fibers embedded in a resin. In one embodiment, The CFRP prepreg is from North Thin Ply Technology and the manufacturing technique is known as tow-spreading: http://www.thinplytechnology.com/spread.php [59].

Block 3404 represents placing a composite shell on the first surface of a first mandrel. The composite conforms to the first surface of the first mandrel;

Block 3406 represents curing the resin.

Block 3408 represents bonding an actuator structure to a first surface of the composite shell with a resin to form an assembly.

Block 3410 represents curing the resin bonding the actuator structure to the composite shell.

Block 3412 represents removing the assembly from the first mandrel. The deformable mandrel enables correction for shrinkage or other distortions formed upon removal of the composite shell. For example, after removal of the shell, the composite shell can be inspected for distortions and the fabrication process (including curing and deformation of the mandrel) can be modified to reduce or correct for the distortions.

Block 3414 represents fabricating a nanolaminate or nanostructured nanofoil. The materials of the nanolaminate can be selected to minimize thermal expansion coefficient (e.g., to 1 part per million or less, or 6 parts per million or less. The nanolaminate can comprise metal layers, e.g., alternating layers of Zirconium and Copper, e.g., deposited by magnetron sputtering. However, a wide range of materials can be used (e.g., Invar). The nanolaminate can be uniform throughout with a uniformity change of 1% or less. The elastic modulus of the nanolaminate can be uniform within 1 micrometer to within +/−2.5%. The nanolaminate can comprise metal nanolayers each having a thickness of 2-200 nanometers (nm), forming a total thickness of the nanolaminate between 15 and 50 micrometers, for example.

Further information on nanolaminate fabrication processes can be found in [55]. An example of nanolaminate fabrication is described on pages 3-4 of U.S. Provisional Patent Application Ser. No. 61/990,267, filed on May 8, 2014, by David C. Redding, Mitchell Troy, Scott A. Basinger, and Sergio Pellegrino, entitled "CARBON SHELL MIRRORS FOR SPACE TELESCOPES", which application is incorporated by reference herein.

The nanolaminate/nanostructured foil can comprise individual nanolayers to achieve low stress distortion.

Dramatically improved control of defects in thick foils can be attained using nanolaminates. The uniformity and the defect control can be important in one or more embodiments of the invention.

The nanolaminate can be formed on second surface of a second mandrel such that a surface of the nanolaminate bonded to the second surface of the composite shell matches the second surface of the composite shell.

Block 3416 represents bonding a second surface of the composite shell, with a resin, to the nanolaminate.

Block 3418 represents curing the resin bonding the composite shell to the nanolaminate.

Block 3420 represents depositing an electrode routing layer to the actuator structure with a resin.

Block 3422 represents curing the resin bonding the electrode routing layer to the actuator structure. The electrode routing layer is typically not strength bearing.

Block 3424 represents removing the second mandrel.

The actuator structure (e.g., PZT) can correct deformities in the nanolaminate and the composite shell caused by the removing of the composite shell and the nanolaminate from their respective mandrels. A deformity in the composite shell caused by curing and removing of the composite shell from the mandrel can be corrected using the actuator structure attached to the composite shell.

Block 3426 represents the end result, a deformable structure (that can be shaped precisely) comprising the composite shell including a plurality of plies each including carbon fibers embedded in a resin; a nanolaminate comprising individual nanolayers attached to a first side of the composite shell, wherein the nanolaminate reduces print-through of the carbon fibers from the composite shell; an actuation structure attached to a second side of the composite shell, the actuation structure including a common electrode; patterned electrodes; a material between the common electrode and the patterned electrodes, the material changing shape in response to one or more electric fields applied between the patterned electrodes and the common electrode, thereby changing a shape of the composite shell and a shape of the nanolaminate; and a flexible electrode routing layer attached to the actuation structure and electrically connected to the patterned electrodes. The flexible electrode routing layer can include conductive electrode traces electrically connected to the patterned electrodes through vias in the electrode routing layer, the conductive electrode traces extending away from an active surface area of the structure for connection to a source of electrical biasing, The flexible electrode routing layer can deform with the composite shell when the electric fields, generated by the source, are applied.

The resins can comprise cyanate ester, for example. The curing can comprise applying heat and/or pressure, under conditions such that at low viscosity the resin fills surface irregularities before it turns solid. The curing conditions can be modified or varied such that distortion or unwanted figure changes in the composite shell and/or nanolaminate upon removal from the mandrels can be corrected.

The mandrels can comprise high optical quality surfaces that maintain shape under gravity. The mandrel surface shape is typically a negative of the desired shape for the nanolaminate or composite shell. For example, a convex mandrel can provide a concave shaped focusing surface of the nanolaminate. Thus, the mirror structure (nanolaminate surface, composite shell surface) can be a replicate of the mandrel.

The method (including selection of curing conditions and deformation of the mandrel) can obtain the mirror structure shape (e.g., surface of nanolaminate and surface of composite shell) with a distortion that is not worse than can be corrected by the actuators (actuator structure, e.g., comprising electrode patterns). In one or more embodiments the actuators may not be able to correct for distortions (e.g. ripples) that are too small (e.g., more than 2 times smaller than actuator spacing). Thus, in one or more embodiments, the method (curing conditions, deformation of the mandrel, thickness of adhesive or resin) are selected to correct for the (e.g. ripples) that are too small (e.g., more than 2 times smaller than actuator spacing) to be corrected by the actuator. In one or more embodiments, the actuator structure can correct for ripples that are at least 2× bigger than the actuator spacing.

The structure can be a mirror structure, wherein the active surface area is a surface of the nanolaminate and a mirror. In one or more embodiments, the nanolaminate can provide uniform properties over a reflective surface area of at least 1-1.4 meters square, at least 1 m×1 m, or at least 1.4 m by 1.4 m, or for longer wavelengths, over a reflective surface area of at least 3-4 meters square, at least 3 m×3 m, or at least 4 m×4 m, e.g. using 1 meter (m) piece segmentation.

The design can include obtaining a deposition surface of the nanolaminate having a surface microroughness of 10 nanometers or 15 nm or less.

The structure can be an antenna.

A number and thicknesses of the nanolayers can be such that the nanolaminate has 20 MegaPascals or less of internal stress.

The structure can comprise an adhesive layer attaching a surface of composite shell to the nanolaminate, the adhesive having a thickness that fills irregularities in the surface of the composite shell, wherein the thickness and an internal stress of the nanolaminate foil are such that the nanolaminate reflecting surface has a surface microroughness of 3 nm or less.

The actuation structure and the electrode routing layer can comprise one or more materials and a distribution of electrodes such that the actuation structure can correct shape errors of the deformable structure.

For example, after the structure is bent for packing in a smaller volume, the structure can spring back into shape for deployment, using the actuation structure to correct for errors in the shape caused by the bending.

The actuation structure and/or electrode routing layer can comprise electrical elements, switching circuits, strain gauges, heating elements (e.g., printed with carbon inks instead of resistive inks), that can be organized to keep the mirror structure correctly shaped in changing environments.

Further description of one or more embodiments of the invention can be found in [54-56].

REFERENCES

The following references are incorporated by reference herein.
1. F. Roddier, Adaptive Optics in Astronomy (Cambridge University, 1999).
2. C. Grosset-Grange, J.-N. Banner, C. Chappuis, and H. Cortey, "Design principle and first results obtained on the LMJ deformable mirror prototype," Proc. SPIE 6584 (2007). 859.
3. D. Débarre, E. J. Botcherby, T. Watanabe, S. Srinivas, M. J. Booth, and T. Wilson, "Image-based adaptive optics for two-photon microscopy," Opt. Lett. 34, 2495 (2009).
4. R. J. Zawadzki, S. M. Jones, S. Pilli, D. Y. Kim, S. S. Olivier, and J. S. Werner, "Retinal imaging with a combined adaptive optics/optical coherence tomography and adaptive optics/scanning laser optical-microscopy system," Proc. SPIE 7550 (2010).
5. R. H. Freeman and J. E. Pearson, "Deformable mirrors for all seasons and reasons," Appl. Opt. 21, 580 868-588 (1982).
6. P.-Y. Madec, "Overview of deformable mirror technologies for adaptive optics and astronomy," Proc. SPIE 8447 (2012).
7. M. A. Ealey and J. F. Washeba, "Continuous facesheet low voltage deformable mirrors," Opt. Eng. 29, 1191 872-1198 (1990).
8. G. Rodrigues, S. Roose, Y. Stockman, S. Gebhardt, A. Schoenecker, P. Villon, and A. Preumont, "Modular bimorph mirrors for adaptive optics," Opt. Eng. 48, 034001 (2009).
9. K. Patterson and S. Pellegrino, "Shape correction of thin mirrors," 52nd AIAA Structures, Structural Dynamics and Materials Conference (2011).
10. K. Patterson, N. Yamamoto, and S. Pellegrino, "Thin deformable mirrors for a reconfigurable space telescope," 53rd AIAA Structures, Structural Dynamics, and Materials Conference (2012).
11. K. Patterson and S. Pellegrino, "Ultralightweight deformable mirrors," Appl. Opt. 52, 5327 883-5341 (2013).
12. G. Hickey, T. Barbee, M. Ealey, and D. Redding, "Actuated hybrid mirrors for space telescopes," Proc. SPIE 7731, (2010).
13. M. Laslandes, E. Hugot, M. Ferrari, C. Hourtoule, C. Singer, C. Devilliers, C. Lopez, and F. Chazallet, "Mirror actively deformed and regulated for applications in space: design and performance," Opt. Eng. 52, 091803 (2013).

14. R. N. Wilson, F. Franza, and L. Noethe, "Active optics. I. A system for optimizing the optical quality and reducing the costs of large telescopes," J. Mod. Opt. 34, 485 892-509 (1987).
15. M. Postman, T. Brown, K. Sembach, M. Giavalisco, W. Traub, K. Stapelfeldt, D. Calzetti, W. Oegerle, M. Rich, P. Stahl, J. Tumlinson, M. Mountain, R. Soummer, and T. Hyde, "Advanced Technology Large-Aperture Space Telescope: science drivers and technology developments," Opt. Eng. 51, 011007 (2012).
16. J. Steeves, M. Laslandes, S. Pellegrino, D. Redding, S. K. Bradford, J. K. Wallace, and T. Barbee, "Design, fabrication and testing of active carbon shell mirrors for space telescope applications," Proc. SPIE 9151, 915105 (2014). 901
17. J.-C. Sinquin, J.-M. Lurcon, and C. Guillemard, "Deformable mirror technologies for astronomy at CILAS," Proc. SPIE 7015, (2008).
18. G. Mendes da Costa Rodrigues, "Adaptive optics with segmented deformable bimorph mirrors," Ph.D. thesis (Universite Libre de Bruxelles, 2010).
19. L. E. Cohan and D. W. Miller, "Integrated modeling for design of light-weight, active mirrors," Opt. Eng. 50, 063003 (2011).
20. R. J. Noll, "Zernike polynomials and atmospheric turbulence," J. Opt. Soc. Am. 66, 207 910-211 (1976).
21. X. Feng, Y. Huang, H. Jiang, D. Ngo, and A. Rosakis, "The effect of thin film/substrate radii on the Stoney formula for thin film/substrate subjected to nonuniform axisymmetric misfit strain and temperature," J. Mech. Mater. Struct. 1, 1041-1053 (2006).
22. Simulia, Abaqus/Standard, version 6.12.
23. S. Freund and L. Suresh, Thin Film Materials. Stress, Defect Formation and Surface Evolution (Cambridge University, 2003).
24. N. Hansen, "The CMA evolution strategy: a comparing review," in Towards a New Evolutionary Computation. Advances on Estimation of Distribution Algorithms, J. Lozano, P. Larranaga, I. Inza, and E. Bengoetxea, eds. (Springer, 2006), pp. 75-102.
25. R. Tyson and B. Frazier, Field Guide to Adaptive Optics, SPIE Field Guides (SPIE, 2004).
26. V. Mahajan, Optical Imaging and Aberrations I: Ray Geometrical Optics (SPIE, 1998).
27. D. Redding, S. Basinger, A. Lowman, A. Kissil, P. Bely, R. Burg, R. Lyon, G. Mosier, M. Femiano, M. Wilson, G. Schunk, L. Craig, D. Jacobson, J. Rakoczy, and J. Hadaway, "Wavefront sensing and control for a Next-GenerationSpaceTelescope," Proc.SPIE3356,758 929-772 (1998).
28. E. Hecht, Optics, 2nd ed. (Addison-Wesley, 1987).
29. T. Coleman and Y. Li, "A reflective Newton method for minimizing a quadratic function subject to bounds on some of the variables," SIAM J. Optim. 6, 1040 933-1058 (1996).
30. Thorlabs, Software for WFS Series Wavefront Sensors, V4.2.
31. H. P. Stahl, \Design Study of 8 Meter Monolithic Mirror UV/Optical Space Telescope." Society of Photo-Optical Instrumentation Engineers (SPIE) Conference Series 7010 (2008).
32. J. P. Gardner, J. C. Mather, M. Clampin, et. al. \The James Webb Space Telescope." Space Science Reviews 123.4: 485-606 (2006).
33. Hochhalter, J. D. \Replicated Mirrors Using Carbon Fiber Reinforced Polymers. Master's Thesis, Univ. of New Mexico (2005).
34. Chen, P. C., et. al. \Advances in Very Lightweight Composite Mirror Technology." Optical Engineering 39(9) 2320-2329 (2000).
35. Hickey, G., Barbee, T., Ealey, M., Redding, M. \Actuated Hybrid Mirrors for space telescopes." Society of Photo-Optical Instrumentation Engineers (SPIE) Conference Series 7731 (2010).
36. Northrup Grumman, AOAXinetics.http://www.northropgrumman.com/BusinessVentures/AOAXinetics (2014).
37. Sinquin, J., Lurcon J., Guillemard, C. \Deformable mirror technologies for astronomy at CILAS. Society of Photo-Optical Instrumentation Engineers (SPIE) Conference Series 7015 (2008).
38. Patterson, K., Pellegrino, S., \Ultralightweight deformable mirrors, Applied Optics 52. pp. 53275341 (2013).
39. Patterson, K., Pellegrino, S. \Shape correction of thin mirrors in a reconfigurable modular space telescope." Society of Photo-Optical Instrumentation Engineers (SPIE) Conference Series 7731-72 (2010). 12
40. Underwood, C., Pellegrino, S. \Autonomous assembly of a recon gurable space telescope (AAReST) for astronomy and earth observation." 8th IAA Symposium on Small Satellites for Earth Observation, Apr. 4-8, 2011 Berlin, 2011.
41. Keck Institute for Space Studies—Large Space Structures. http://kiss.caltech.edu/study/largestructure/technology.html (2011).
42. Postman, M., et al. \The Advanced Technology Large Aperture Space Telescope (ATLAST): Science drivers and technology developments." Optical Engineering 51(1) 011007 (2012).
43. Planet Labs Inc. http://www.planet.com/ (2014).
44. Skybox Imaging Inc. http://www.skyboximaging.com/ (2014).
45. Barbee, T. W. \Nanolaminate thin-shell mirror structures." Society of Photo-Optical Instrumentation Engineers (SPIE) Conference Series 5166 (2003).
46. Barbee, T. W. \Nano-structure Multilayer Materials", State of the Laboratory, Lawrence Livermore National Laboratory UCRL-5200-91-718 (1991).
47. Piezo Systems Inc. http://piezo.com/ (2014).
48. Fuji_film Inc. Dimatix Materials Printer DMP-2831. http://www.fujifilmusa.com/products/industrialinkjet printheads/deposition-products/dmp-2800/ (2014).
49. Laslandes, M., Steeves, J., Pellegrino, S., Patterson, K. \Optimization of electrode configuration in surface-parallel actuated deformable mirrors." Society of Photo-Optical Instrumentation Engineers (SPIE) Conference Series 9148-151 (2014).
50. Jones, R. M., \Mechanics of Composite Materials," 2nd ed. (1998).
51. SIMULIA. Abaqus Standard/CAE Version 6.12.
52. Steeves, J., Pellegrino, S. \Ultra-thin highly deformable composite mirrors." 54th AIAA/ASME/ASCE/AHS/ASC Structures, Structural Dynamics and Materials Conference 1523 (2012).
53. Malacara-Doblado, D., Ghozeil, I., \Hartmann, Hartmann-Shack, and other screen tests. Optical Shop Testing, 3rd ed. Wiley Series in Pure and Applied Optics, pp. 361397 (2007).
54. Powerpoint slides by John Steeves, Marie Laslandes, Sergio Pellegrino, David Redding, S. Bradford, J. Wallace, and Troy Barbee, entitled "Design, Fabrication and Testing of Active Carbon Shell Mirrors (CSMs) for Space Telescope Applications," SPIE Astronomical Telescopes and Instrumentation Jun. 23, 2014.

55. Proceedings article by John Steeves, Marie Laslandes, Sergio Pellegrino, David Redding, Samuel Case Bradford, James Kent Wallace, Troy Barbee, entitled "Design, Fabrication and Testing of Active Carbon Shell Mirrors for Space Telescope Applications" *Proc. SPIE* 9151, Advances in Optical and Mechanical Technologies for Telescopes and Instrumentation, 915105 (Jul. 28, 2014); doi:10.1117/12.2056560.
56. Optimized actuators for ultrathin deformable primary mirrors, by Marie Laslandes, Keith Patterson, and Sergio Pellegrino, Vol. 54, No. 20//Applied Optics. No. 20// Applied Optics Research Article.
57. U.S. Pat. No. 6,278,764 by Troy Barbee, Stephen Lane, and Donald Hoffman.
58. Actuated Hybrid Mirrors for Space Telescopes.
59. http://www.thinplytechnology.com/spread.php

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A deformable mirror, comprising:
a set of actuation structures attached to a mirror, the actuation structures each comprising:
a first length in a first direction and a second length in a second direction, wherein:
the first length is longer than the second length,
the first directions of the actuation structures are rotated with respect to each other,
the actuation structures intersect in an intersection region and each comprise the intersection region between a first region and a second region;
an active material; and
an electrode on each of the regions of the actuation structures and connected to the active material, the electrodes correcting target error modes when the active material changes shape and deforms the mirror in response to biases applied to the electrodes.

2. The deformable mirror of claim 1, further comprising:
a common electrode;
the electrodes arranged across the mirror to increase correctability of the mirror, stroke of the mirror, or the stroke and the correctability of the mirror, for a chosen number of the regions and for a specific wavefront error of the mirror; and
the active material changing shape in response to electric fields applied between the electrodes and the common electrode, thereby changing a shape of the mirror to increase the correctability, the stroke, or the stroke and the correctability; wherein:
the correctability is defined as a ratio between a root mean square amplitude of the wavefront error before and after correction by the actuation structures, and
the stroke is defined as the maximum amplitude of the wavefront error that can be corrected without saturating the actuation structures.

3. The deformable mirror of claim 2, further comprising:
a pattern and a shape of the regions that achieves the desired correctability, the desired stroke, or the desired stroke and the desired correctability, wherein the desired correctability, desired stroke, or the desired stroke and desired correctability are calculated by expressing the target error modes with Zernike polynomials.

4. The deformable mirror of claim 1, wherein:
a pattern and a shape of the regions are designed to correct the target error modes expressed as a sum of Zernike modes each having an amplitude, and
the target error modes are selected based on the amplitude of the Zernike mode and by selecting the more dominant error modes.

5. The deformable of claim 1, further comprising a circuit connected to the electrodes, the circuit applying:
equal and opposite voltages to the electrodes on the first regions of each of the actuator structures, and
equal and opposite voltages to the electrodes on the second regions of each of the actuator structures.

6. The deformable mirror of claim 1, further comprising a plurality of the set of the actuation structures attached to the deformable mirror, wherein the actuation structures in different sets have different lengths and the smaller sets are nested within the larger sets.

7. A method of fabricating a deformable mirror, comprising:
attaching a set of actuation structures to a mirror, the actuation structures each comprising:
a first length in a first direction and a second length in a second direction, wherein:
the first length is longer than the second length,
the first direction of the actuation structures are rotated with respect to each other,
the actuation structures intersect in an intersection region and each comprise the intersection region between a first region and a second region;
an active material; and
an electrode on each of the regions of the actuation structures and connected to the active material, the electrodes correcting target error modes when the active material changes shape and deforms the mirror in response to biases applied to the electrodes.

8. The method of claim 7, further comprising:
providing a common electrode; and
arranging the electrodes across the mirror to increase a correctability of the mirror, a stroke of the mirror, or the stroke and the correctability for a chosen number of the electrodes and for a specific wavefront error of the mirror; and wherein:
the active material changes in shape in response to electric fields applied between the electrodes and the common electrode, thereby changing a shape of the mirror to increase the correctability, the stroke, or the correctability and the stroke, and
the correctability is defined as a ratio between a root mean square amplitude of the wavefront error before and after correction by the actuation structures, and
the stroke is defined as the maximum amplitude of the wavefront error that can be corrected without saturating the actuation structure.

9. The method of claim 8, further comprising:
selecting the desired correctability, the desired stroke, or the desired stroke and the desired correctability for the mirror, and
designing a pattern and a shape of the regions that achieves the desired correctability, the desired stroke, or the desired stroke and the desired correctability, wherein the desired correctability, desired stroke, or the desired stroke and desired correctability are calculated by expressing the target error modes with Zernike polynomials.

10. The method of claim 7, wherein:
the target error modes are expressed as a sum of Zernike modes each having an amplitude,
the target error modes are selected based on the amplitude of the Zernike mode and by selecting the more dominant error modes.

11. The method of claim 7, wherein a pattern and a shape of the regions are designed by simulating the effect of varying a shape and a pattern of the electrodes on correcting the target error modes.

12. The method of claim 11, wherein the simulating includes parameterizing the shape of the electrodes.

13. The method of claim 7, further comprising providing a circuit applying:
equal and opposite voltages to the electrodes on the first regions of each of the actuator structures, and
equal and opposite voltages to the electrodes on the second regions of each of the actuator structures.

14. The method of claim 7, further comprising attaching a plurality of the set of the actuation structures on the deformable mirror, wherein the actuation structures in different sets have different lengths and the smaller sets are nested within the larger sets.

* * * * *